United States Patent
Higashi et al.

(10) Patent No.: US 8,240,539 B2
(45) Date of Patent: Aug. 14, 2012

(54) JOINING APPARATUS WITH UV CLEANING

(75) Inventors: Kazushi Higashi, Neyagawa (JP); Tatsuo Sasaoka, Osaka (JP); Shinji Ishitani, Akashi (JP)

(73) Assignee: Panasonic Corporation, Osaka (JP)

( * ) Notice: Subject to any disclaimer, the term of this patent is extended or adjusted under 35 U.S.C. 154(b) by 2061 days.

(21) Appl. No.: 11/136,433

(22) Filed: May 25, 2005

(65) Prior Publication Data
US 2006/0037997 A1    Feb. 23, 2006

(30) Foreign Application Priority Data

May 28, 2004 (JP) ................................. 2004-159133
May 28, 2004 (JP) ................................. 2004-159134

(51) Int. Cl.
*B23K 1/06* (2006.01)
*B23K 1/00* (2006.01)
*B23K 37/00* (2006.01)
*B23K 37/04* (2006.01)

(52) U.S. Cl. .......... 228/1.1; 228/33; 228/44.7; 228/49.5
(58) Field of Classification Search .................. 228/1.1, 228/44.7, 49.5, 51–55, 110.1, 111, 175–180.22, 228/203, 205
See application file for complete search history.

(56) References Cited

U.S. PATENT DOCUMENTS

| | | | | |
|---|---|---|---|---|
| 4,971,639 A * | 11/1990 | Quinn et al. | ...................... | 156/64 |
| 5,151,149 A * | 9/1992 | Swartz | ........................ | 156/379.8 |
| 5,510,158 A * | 4/1996 | Hiramoto et al. | ............. | 427/582 |
| 5,831,238 A * | 11/1998 | Takuya et al. | ............ | 219/121.59 |
| 6,099,679 A * | 8/2000 | Karem et al. | .............. | 156/273.1 |
| 6,158,648 A * | 12/2000 | Mori et al. | ...................... | 228/206 |
| 6,467,670 B2 * | 10/2002 | Higashi et al. | .................. | 228/1.1 |
| 6,507,031 B1 * | 1/2003 | Jinbo et al. | ................. | 250/455.11 |
| 6,555,790 B1 * | 4/2003 | Ono et al. | ....................... | 219/390 |
| 6,996,889 B2 * | 2/2006 | Higashi et al. | ............... | 29/564.1 |
| 7,294,155 B2 * | 11/2007 | Yudasaka | ...................... | 29/25.01 |
| 7,326,641 B2 * | 2/2008 | Uchida | .......................... | 438/618 |
| 7,394,163 B2 * | 7/2008 | Baba et al. | ..................... | 257/783 |
| 2001/0009176 A1 * | 7/2001 | Mori et al. | ..................... | 156/325 |
| 2002/0149298 A1 * | 10/2002 | Furukawa et al. | ............ | 310/340 |
| 2002/0192939 A1 * | 12/2002 | Sugihara | ....................... | 438/629 |
| 2003/0150108 A1 * | 8/2003 | Higashi et al. | .................. | 29/840 |
| 2004/0108059 A1 * | 6/2004 | Johnston et al. | ........... | 156/345.5 |
| 2006/0085965 A1 | 4/2006 | Suga et al. | | |
| 2006/0115323 A1 * | 6/2006 | Coppeta et al. | ............... | 403/270 |
| 2006/0180173 A1 * | 8/2006 | Johnston et al. | .................. | 134/1 |

(Continued)

FOREIGN PATENT DOCUMENTS

JP            59201438 A  *  11/1984
(Continued)

*Primary Examiner* — Jessica L Ward
*Assistant Examiner* — Carlos Gamino
(74) *Attorney, Agent, or Firm* — Wenderoth, Lind & Ponack, L.L.P.

(57) ABSTRACT

The joining apparatus includes a suction nozzle for holding an electronic component, a board stage for holding a circuit board in opposition to the electronic component, and an excimer ultraviolet lamp placed at an irradiation position between the positioned electronic component and circuit board. In such a joining apparatus, ultraviolet irradiation to Au bumps of the electronic component and ultraviolet irradiation to board electrodes of the circuit board are performed concurrently by the excimer ultraviolet lamp to execute a cleaning process of the two metallic portions. Thereafter, ultrasonic vibrations are imparted to the two metallic portions while those metallic portions are kept in contact with each other, by which metal joining between the two metallic portions is fulfilled.

1 Claim, 32 Drawing Sheets

U.S. PATENT DOCUMENTS

2007/0131347 A1 * 6/2007 Boes et al. .................. 156/272.2
2007/0193682 A1 * 8/2007 Sasaoka et al. ............... 156/281

FOREIGN PATENT DOCUMENTS

| | | |
|---|---|---|
| JP | 63-183787 | 7/1988 |
| JP | 4-167441 | 6/1992 |
| JP | 7-45643 | 2/1995 |
| JP | 11-214446 | 8/1999 |
| JP | 2000-138255 | 5/2000 |
| JP | 2001-60602 | 3/2001 |
| JP | 2002-222836 | 8/2002 |
| JP | 2002-353276 | 12/2002 |
| JP | 2002-368039 | 12/2002 |
| JP | 2003-7775 | 1/2003 |
| JP | 2003-297880 | 10/2003 |
| JP | 2004-119430 | 4/2004 |

* cited by examiner

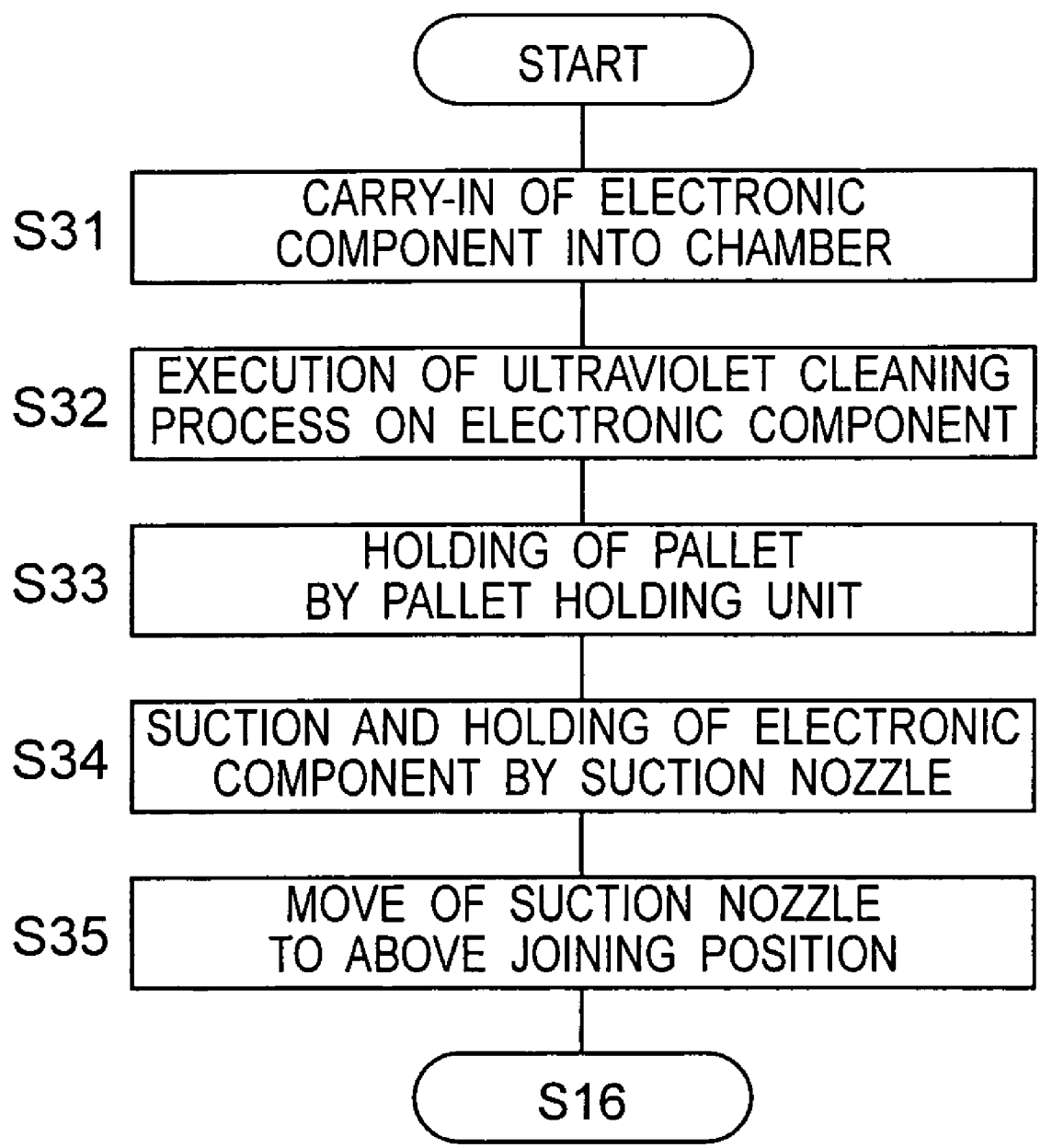

JOINING APPARATUS WITH UV CLEANING

TECHNICAL FIELD

The present invention relates to a joining apparatus and a joining method for joining objects to each other.

BACKGROUND OF THE INVENTION

Conventionally, various joining methods have been used in apparatuses for joining objects to each other. As one of the methods for joining objects having metallic portions to each other at a comparatively low temperature, there is a known method in which the metallic portions are subjected to a cleaning process such as removal of adsorbent substances, activation of surfaces or the like by applying plasma to the metallic portions before the metallic portions are joined to each other.

For example, Japanese unexamined patent publication No. 2001-60602 A proposes a technique that, in an apparatus for mounting electronic components onto circuit boards such as printed boards, an electrode of the circuit board is cleaned by applying plasma thereto, and thereafter joined to an electrode of the electronic component. Also, Japanese unexamined patent publication No. 2002-368039 A discloses a technique that gold stud bumps formed on aluminum electrodes of two IC chips are subjected to a cleaning process with plasma, and after removal of contaminations of the bump surfaces, their bumps are pressurized and joined to each other in a heated state.

SUMMARY OF THE INVENTION

In such a prior art device for performing joining between electronic component and circuit board by using plasma, plasma generated with application of a radio-frequency voltage in a processing space which is set to a reduced-pressure state is applied to an electronic component or a circuit board for implementation of the cleaning process of electrodes. As a result of this, the structure related to the cleaning process of electrodes indispensably becomes one which is an expensive, complex structure, including a chamber which defines a processing space for use of plasma processing, a mechanism which generates the plasma, and the like. This poses a problem that the device structure becomes difficult to simplify.

Also, when electronic components to be joined (mounted) to a circuit board are those unsuitable for exposure to high energy of plasma processing or the like, there is a problem in that the electronic components may be damaged by a cleaning process with plasma or the like.

Accordingly, an object of the present invention is to provide, for solving the above-described issues, a joining apparatus and a joining method by which, in joining of objects to each other, the structure for performing the cleaning process of the objects is simplified so as to allow metal joining to be simply fulfilled, and by which even with objects unsuitable for exposure to high energy of plasma processing or the like, the cleaning process of their surfaces can reliably be performed to achieve the metal joining.

In order to achieve the above object, the present invention has the following constitutions.

According to a first aspect of the present invention, there is provided a joining apparatus comprising:

an ultraviolet irradiation unit for irradiating a first metallic portion of a first object with ultraviolet ray so as to remove joining inhibitors from a surface of the first metallic portion; and a metal joining unit for performing metal joining between the first metallic portion of the first object, from which the joining inhibitors have been removed by the ultraviolet irradiation unit, and a second metallic portion of a second object by imparting ultrasonic vibrations or heat to the first metallic portion or the second metallic portion while the first metallic portion and the second metallic portion are kept in contact with each other, wherein the first object and the second object are joined to each other by performing the metal joining between the first metallic portion of the first object and the second metallic portion of the second object.

According to a second aspect of the present invention, there is provided the joining apparatus as defined in the first aspect, further comprising:

a first holding unit for holding the first object; and a second holding unit for holding the second object so as to face the first metallic portion of the first object, wherein the ultraviolet irradiation unit irradiates the first metallic portion of the first object which is held by the first holding unit and the second metallic portion of the second object which is held by the second holding unit with ultraviolet ray so as to remove the joining inhibitors from respective surfaces of the first metallic portion and the second metallic portion, and the metal joining unit performs the metal joining between the first metallic portion and the second metallic portion, while bringing the first metallic portion and the second metallic portion into contact with each other, from each of which the joining inhibitors have been removed by the ultraviolet irradiation unit, by making the first holding unit and the second holding unit closer to each other.

According to a third aspect of the present invention, there is provided the joining apparatus as defined in the second aspect, wherein the ultraviolet irradiation unit includes an excimer ultraviolet lamp for emitting ultraviolet ray having wavelengths of 160 to 180 nm as an ultraviolet-ray generating source.

According to a fourth aspect of the present invention, there is provided the joining apparatus as defined in the third aspect, wherein the ultraviolet irradiation unit includes a lamp moving unit for moving the excimer ultraviolet lamp between an ultraviolet irradiation position, which is located between the first holding unit and the second holding unit, and a withdrawal position which is withdrawn from between the first holding unit and the second holding unit, and the metal joining by the metal joining unit is performed in a state that the excimer ultraviolet lamp is positioned at the withdrawal position by the lamp moving unit.

According to a fifth aspect of the present invention, there is provided the joining apparatus as defined in the second aspect, wherein ultraviolet irradiation to the first metallic portion and the second metallic portion by the ultraviolet irradiation unit is carried out in air atmosphere.

According to a sixth aspect of the present invention, there is provided the joining apparatus as defined in the second aspect, wherein ultraviolet irradiation to the first metallic portion and the second metallic portion by the ultraviolet irradiation unit is carried out in low oxygen atmosphere having an oxygen concentration of 10% or lower.

According to a seventh aspect of the present invention, there is provided the joining apparatus as defined in the second aspect, further comprising:

a chamber in which the first holding unit, the second holding unit, the ultraviolet irradiation unit and the metal joining unit are disposed inside and which is enabled to hermetically close an internal space of the chamber; and a pressure reducing unit for reducing pressure of the internal space of the chamber, wherein ultraviolet irradiation to the first metallic portion and the second metallic portion by the ultraviolet irradiation unit is carried out in reduced-pressure environment.

According to an eighth aspect of the present invention, there is provided the joining apparatus as defined in the second aspect, wherein the ultraviolet irradiation unit has a function of heating the first metallic portion and the second metallic portion by ultraviolet irradiation.

According to a ninth aspect of the present invention, there is provided the joining apparatus as defined in the second aspect, wherein the first object and the second object are container members for forming a space in which an electronic component is housed inside by the metal joining.

According to a tenth aspect of the present invention, there is provided the joining apparatus as defined in the second aspect, wherein the first object is an electronic component having an electrode portion as the first metallic portion; and the second object is a circuit board having a board electrode as the second metallic portion.

According to an eleventh aspect of the present invention, there is provided the joining apparatus as defined in the first aspect, further comprising an energy wave irradiation unit for irradiating the second metallic portion of the second object with energy waves so as to remove joining inhibitors from a surface of the second metallic portion, wherein the metal joining unit performs the metal joining while keeping in contact with the first metallic portion, from which the joining inhibitors have been removed by the ultraviolet irradiation unit, and the second metallic portion, from which the joining inhibitors have been removed by the energy wave irradiation unit.

According to a twelfth aspect of the present invention, there is provided the joining apparatus as defined in the eleventh aspect, wherein ultraviolet irradiation to the first metallic portion by the ultraviolet irradiation unit is carried out in air atmosphere.

According to a thirteenth aspect of the present invention, there is provided the joining apparatus as defined in the eleventh aspect, wherein ultraviolet irradiation to the first metallic portion by the ultraviolet irradiation unit is carried out in low oxygen atmosphere having an oxygen concentration of 10% or lower.

According to a fourteenth aspect of the present invention, there is provided the joining apparatus as defined in the eleventh aspect, further comprising:

a chamber in which the ultraviolet irradiation unit and the metal joining unit are disposed inside and which is enabled to hermetically close internal space of the chamber; and a pressure reducing unit for reducing pressure of the internal space of the chamber, wherein ultraviolet irradiation to the first metallic portion by the ultraviolet irradiation unit is carried out in reduced-pressure environment.

According to a fifteenth aspect of the present invention, there is provided the joining apparatus as defined in the eleventh aspect, wherein the ultraviolet irradiation unit includes an excimer ultraviolet lamp for emitting ultraviolet ray having wavelengths of 160 to 180 nm as an ultraviolet-ray generating source.

According to a sixteenth aspect of the present invention, there is provided the joining apparatus as defined in the fifteenth aspect, further comprising:

a component feed unit for conveying the first objects, which are arrayed in its conveyance direction, along the conveyance direction so that the individual first objects are fed to the metal joining unit, wherein in the ultraviolet irradiation unit, the excimer ultraviolet lamp is placed along the conveyance direction, and the first objects are conveyed to a feed position for the metal joining unit by the component feed unit while a surface of the first metallic portion of each first object is irradiated with the ultraviolet ray by the excimer ultraviolet lamp.

According to a seventeenth aspect of the present invention, there is provided the joining apparatus as defined in the sixteenth aspect, wherein the component feed unit includes:

a reel section for winding thereon a taped component feed member in which a plurality of the first objects are arrayed and housed; and a taped component conveyance unit for feeding out the taped component feed member from the reel section along the excimer ultraviolet lamp and conveying the taped component feed member to the feed position for the metal joining unit.

According to an eighteenth aspect of the present invention, there is provided the joining apparatus as claimed in the sixteenth aspect, wherein the component feed unit includes a lead frame conveyance unit for conveying a plurality of lead frames, in which a plurality of the first objects are arrayed and housed, to the feed position for the metal joining unit along the excimer ultraviolet lamp.

According to a nineteenth aspect of the present invention, there is provided the joining apparatus as defined in the sixteenth aspect, wherein the component feed unit includes a tray conveyance unit for conveying the component feed tray, in which a plurality of the first objects are arrayed and housed, along the excimer ultraviolet lamp to the feed position for the metal joining unit.

According to a twentieth aspect of the present invention, there is provided the joining apparatus as defined in the eleventh aspect, wherein the energy wave irradiation unit emits plasma as the energy waves so as to remove the joining inhibitors from the surface of the second metallic portion of the second object.

According to a 21st aspect of the present invention, there is provided the joining apparatus as defined in the eleventh aspect, wherein the first object is a semiconductor light-emitting device having an electrode portion as the first metallic portion; and the second object is a circuit board having a board electrode as the second metallic portion.

According to a 22nd aspect of the present invention, there is provided a joining method for joining a first metallic portion of a first object and a second metallic portion of a second object to each other, comprising:

removing joining inhibitors from a surface of the second metallic portion by irradiating the second metallic portion of the second object with energy waves, while removing joining inhibitors from a surface of the first metallic portion by irradiating the first metallic portion of the first object with ultraviolet ray; and thereafter, performing metal joining between the first metallic portion of the first object and the second metallic portion of the second object, from each of which the joining inhibitors have been removed, by imparting ultrasonic vibrations or heat to the first metallic portion or the second metallic portion while the first metallic portion and the second metallic portion are kept in contact with each other.

According to a 23rd aspect of the present invention, there is provided a joining method for joining a first metallic portion of a first object and a second metallic portion of a second object to each other, comprising:

holding the first object while holding the second object so that the second metallic portion of the second object faces the first metallic portion of the first object;

removing joining inhibitors from respective surfaces of the first metallic portion and the second metallic portion by irradiating the first metallic portion and the second metallic portion with ultraviolet ray; and thereafter, performing metal joining between the first metallic portion and the second metallic portion by imparting ultrasonic vibrations or heat to the first metallic portion or the second metallic portion, while the first metallic portion and the second metallic portion are kept in contact with each other by making the first object and the second object closer to each other.

According to the present invention, the structure related to the cleaning process of objects can be simplified so that the metal joining can simply be fulfilled. Further, before execution of metal joining, ultraviolet ray is applied to the surfaces of metallic portions in the respective objects to remove joining inhibitors, with the result that clean surfaces are exposed, and thereafter, the two metallic portions are brought into contact with each other to achieve the metal joining. Thus, the resultant joining strength can be improved. Besides, by using ultraviolet ray within the wavelength range of 160 nm to 180 nm as the ultraviolet ray to be used for cleaning process, it becomes possible to effectively achieve the removal of joining inhibitors.

Further, even with objects unsuitable for exposure to high energy of plasma processing or the like, metal joining can be achieved by subjecting the objects to ultraviolet cleaning process to remove joining inhibitors deposited on their surfaces, with the result that the clean surfaces are exposed, and then the clean surfaces are joined together, by which the metal joining can be achieved. Besides, by performing ultraviolet cleaning process in a low oxygen atmosphere or reduced-pressure atmosphere, the quality of cleaning process on the objects can be improved.

Further, in the case where the ultraviolet cleaning process is executed in the conveyance process of the objects to the feed position, the joining operation can be achieved efficiently and moreover the device construction can be simplified.

BRIEF DESCRIPTION OF THE DRAWINGS

These and other aspects and features of the present invention will become clear from the following description taken in conjunction with the preferred embodiments thereof with reference to the accompanying drawings, in which:

FIG. 35 is a flowchart showing part of procedures of joining operation in the joining apparatus of the ninth embodiment.

DETAILED DESCRIPTION OF THE PREFERRED EMBODIMENTS

Figure 1:
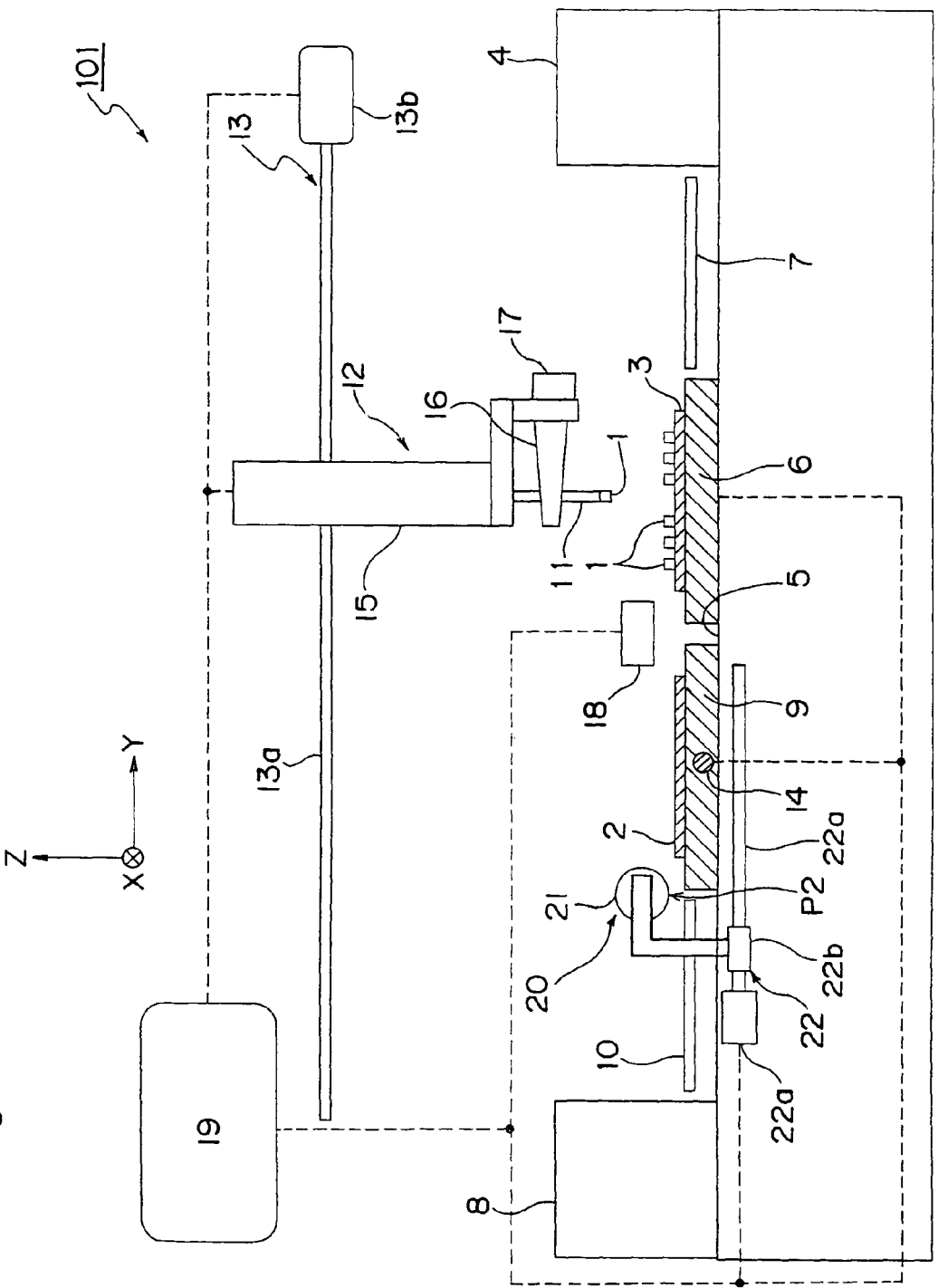
FIG. 1 is a schematic structural view showing the structure of a joining apparatus according to a first embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First Embodiment

FIG. 1 is a schematic structural view of a joining apparatus 101 which is an example of the joining apparatus according to a first embodiment of the invention. The joining apparatus 101 is an apparatus for joining an electronic component 1, which is an example of a first object, to a specified position of a circuit board 2, which is an example of a second object, so that the electronic component 1 is mounted onto the circuit board 2.

As shown in FIG. 1, the joining apparatus 101 includes a component magazine 4 for housing therein a plurality of component trays 3 on each of which a plurality of electronic components 1 are feedably set, and a tray conveyance unit 7 for conveying a component tray 3, which has selectively been taken out from the component magazine 4, so as to be set on a component feed stage 6 placed on an apparatus frame 5. The joining apparatus 101 also includes a board magazine 8 for housing therein a plurality of circuit boards 2 to which each electronic component 1 is joined and mounted, a board stage 9 which is an example of a second holding member for releasably holding the circuit board 2, and a board conveyance unit 10 for conveying the circuit boards 2 housed in the board magazine 8 so that each of the circuit boards 2 can be placed on the board stage 9.

Further, as shown in FIG. 1, the joining apparatus 101 has a joining head 12 which includes a suction nozzle 11 (an example of a first holding member) for releasably sucking and holding the electronic component 1 and which performs a joining operation of the electronic component 1 to the circuit board 2, a head moving unit 13 for moving the joining head 12 forward and backward in a Y-axis direction in the figure, which is a direction extending roughly along the surface of the circuit board 2, and a board moving unit 14 for moving the board stage 9 forward and backward in an X-axis direction, which is a direction roughly along the surface and perpendicular to the Y-axis direction. It is noted that the head moving unit 13 and the board moving unit 14 are made up by using a ball screw shaft mechanism or the like. For example, the head moving unit 13 includes a head moving guide 13a which is screwed with an unshown nut portion fixed to the joining head 12 and which guides so as to move the joining head 12 in the Y-axis direction, and a motor 13b which rotationally drives the head moving guide 13a about its axis to thereby drive the move of the nut portion. The suction nozzle 11, having at its central portion a suction path for use of vacuum suction, performs vacuum suction from a suction port formed at its tip end so that suction holding of the electronic component 1 can be fulfilled, and stopping the suction allows the suction holding to be released.

The joining head 12 includes an up/down unit 15 for moving the suction nozzle 11 along up and down a Z-axis direction in the figure, and an ultrasonic vibrator 17 which is an oscillation unit for imparting ultrasonic vibrations to the suction nozzle 11 via a horn 16.

Further, as shown in FIG. 1, the joining apparatus 101 includes a recognition camera 18 for recognizing a position (joining position), where the electronic component 1 is to be joined, in the circuit board 2 held by the board stage 9. The recognition camera 18 can be moved to above the circuit board 2 by an unshown moving unit so as to be capable of recognizing the joining position by capturing an image of the joining position. When the capture of the image is not done, the recognition camera 18 is moved to a position withdrawn from above the circuit board 2 by the moving unit.

Figure 2:
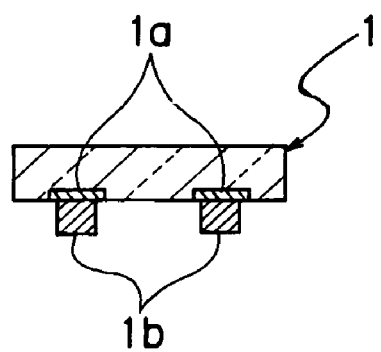
FIG. 2 is a schematic sectional view showing the structure of an electronic component to be treated by the joining apparatus of FIG. 1.
Figure 3:
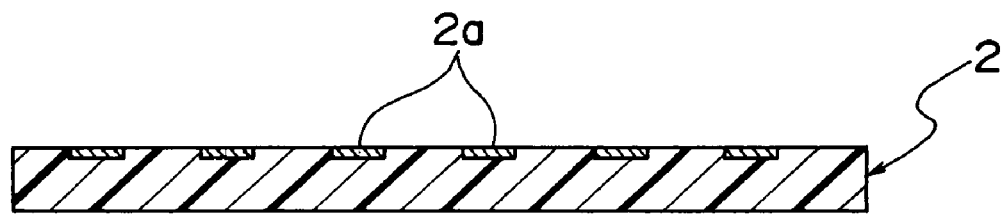
FIG. 3 is a schematic sectional view showing the structure of a circuit board to be treated by the joining apparatus of FIG. 1.

Now the structures of the electronic component 1 and the circuit board 2 to be treated by the joining apparatus 101 are explained with reference to the schematic sectional views of FIG. 2 and FIG. 3. As shown in FIG. 2, a plurality of electrode patterns 1a are formed on the lower surface of the electronic component 1 as viewed in the figure, each of the electrode patterns 1a having a gold (Au) bump 1b as an electrode portion which is an example of the metallic portion. It is noted that the Au bumps 1b can be formed as ball bumps or plated bumps. Although this first embodiment is described on such a case as the Au bumps 1b are formed, yet its formation material is not limited to gold alone, but copper (Cu), aluminum (Al), tin (Sn) or other metals may be used. Also, as shown in FIG. 3, on one surface of the circuit board 2 to which individual electronic components 1 are to be joined, a plurality of board electrodes 2a which are an example of the metallic portion are formed of, for example, gold (Au) so as to be correspondent with the placement of the electrode patterns 1a of the individual electronic components 1. It is noted that the formation material of the board electrodes 2a of the circuit board 2 is not limited to gold, but may be formed of various metal materials like the electronic components 1. Also, the electronic components 1 as used here are electronic components having a property of being relatively vulnerable to heat, exemplified by LED chips, semiconductor bare chip components, SAW (Surface Acoustic Wave) filters or other like electronic components, where, for example, relatively small-sized electronic components having 2 mm long by 2 mm wide dimensions are used.

Also, as shown in FIG. 1, the joining apparatus 101 includes an ultraviolet irradiation unit 20 for applying ultraviolet rays to the Au bumps 1b of the electronic component 1 and the board electrodes 2a of the circuit board 2 to remove joining inhibitors deposited on the surfaces of the Au bumps 1b and the board electrodes 2a. The ultraviolet irradiation unit 20 includes an excimer ultraviolet lamp 21 as an ultraviolet-ray generating source for applying ultraviolet rays having wavelengths within a range of 160-180 nm, e.g. a wavelength of 172 nm, as the aforementioned ultraviolet ray, and a lamp moving unit 22 for moving the excimer ultraviolet lamp 21 forward and backward in the Y-axis direction in the figure between an ultraviolet irradiation position P1 for the circuit board 2 and the electronic component 1 and a withdrawal position P2, where the ultraviolet irradiation position P1 is above the circuit board 2 and located between the joining position of the circuit board 2 and the electronic component 1 held by the suction nozzle 11 aligned with the joining position, and where the withdrawal position P2 is a position to which the excimer ultraviolet lamp 21 is withdrawn from above the circuit board 2. It is noted that the lamp moving unit 22 can be made up, for example, by using a ball screw shaft mechanism composed of a ball screw shaft portion 22a, a nut portion 22b and a motor 22c.

The excimer ultraviolet lamp 21 is formed, for example, into an about 20 mm-diameter cylindrical shape positioned so as to extend in the X-axis direction, having a function for emitting ultraviolet rays having the aforementioned wavelengths radially from its whole cylindrical peripheral surface.

As shown in FIG. 1, the joining apparatus 101 further has a control unit 19 for performing operation control of individual structural members integrally in association with one another. The control unit 19, in which data have previously been inputted, such as data of the electronic components 1 to be sucked and held by the suction nozzle 11, data of individual joining positions in the circuit board 2, and data of ultraviolet irradiation time for the electronic components 1 and the circuit boards 2 or the time required for subsequent joining process, is enabled to perform the integral control for the joining process based on those data.

Next, a concrete procedure of the joining process for performing the joining of the electronic component 1 to a specified joining position in the circuit board 2 by using the joining apparatus 101 having the above-described structure is explained below with reference to the flowchart shown in FIG. 4 and the schematic explanatory views of the joining apparatus 101 shown in FIGS. 5 to 9. It is noted that operations described below are carried out in association with one another under the integral control by the control unit 19 included in the joining apparatus 101.

Figure 4:
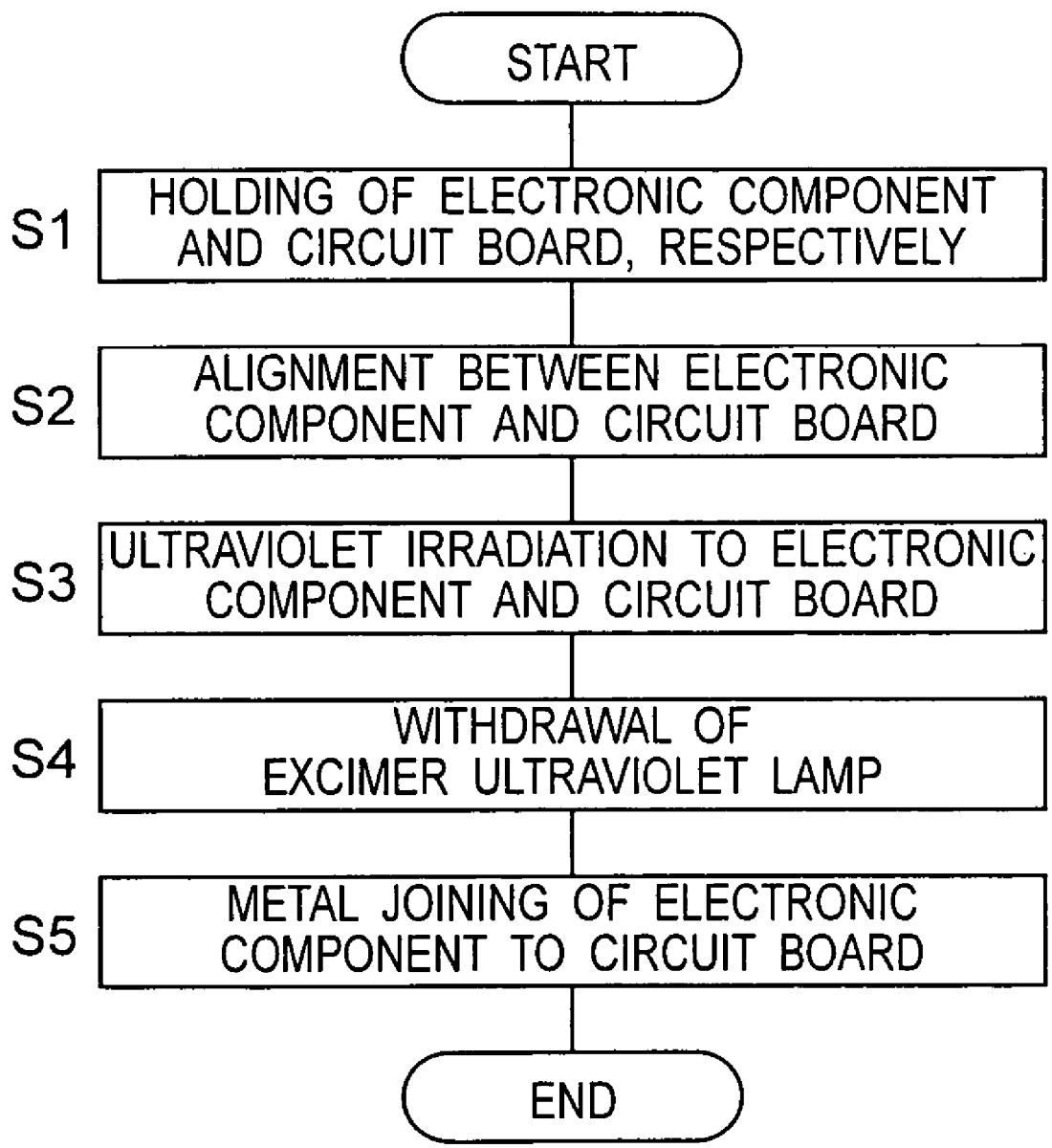
FIG. 4 is a flowchart showing the procedure of the joining method of the first embodiment.

First, at step S1 of the flowchart of FIG. 4, in the joining apparatus 101, a specified component tray 3 is extracted from the component magazine 4, and conveyed by the tray conveyance unit 7 so as to be placed above the component feed stage 6. Along with this, a circuit board 2 is extracted from the board magazine 8, and conveyed by the board conveyance unit 10 so as to be placed above the board stage 9, where the circuit board 2 is held by the board stage 9. Thereafter, the joining head 12 is moved along the Y-axis direction by the head moving unit 13, where alignment of one electronic component 1 on the component tray 3 placed on the component feed stage 6 with the suction nozzle 11 is performed. After the alignment, the suction nozzle 11 is moved down by the up/down unit 15 to suck and hold the one electronic component 1, and then moved up so that the electronic component 1 is taken out of the component tray 3. This state is the one shown in FIG. 1. In the component tray 3, each electronic component 1 is housed and positioned as its surface on one side on which the Au bump 1b is formed is directed downward as viewed in the figure (i.e., face-down set). Therefore, a surface of the electronic component 1 on which the Au bumps 1b are not formed (the upper surface in the figure) is sucked and held by the suction nozzle 11.

Figure 5:
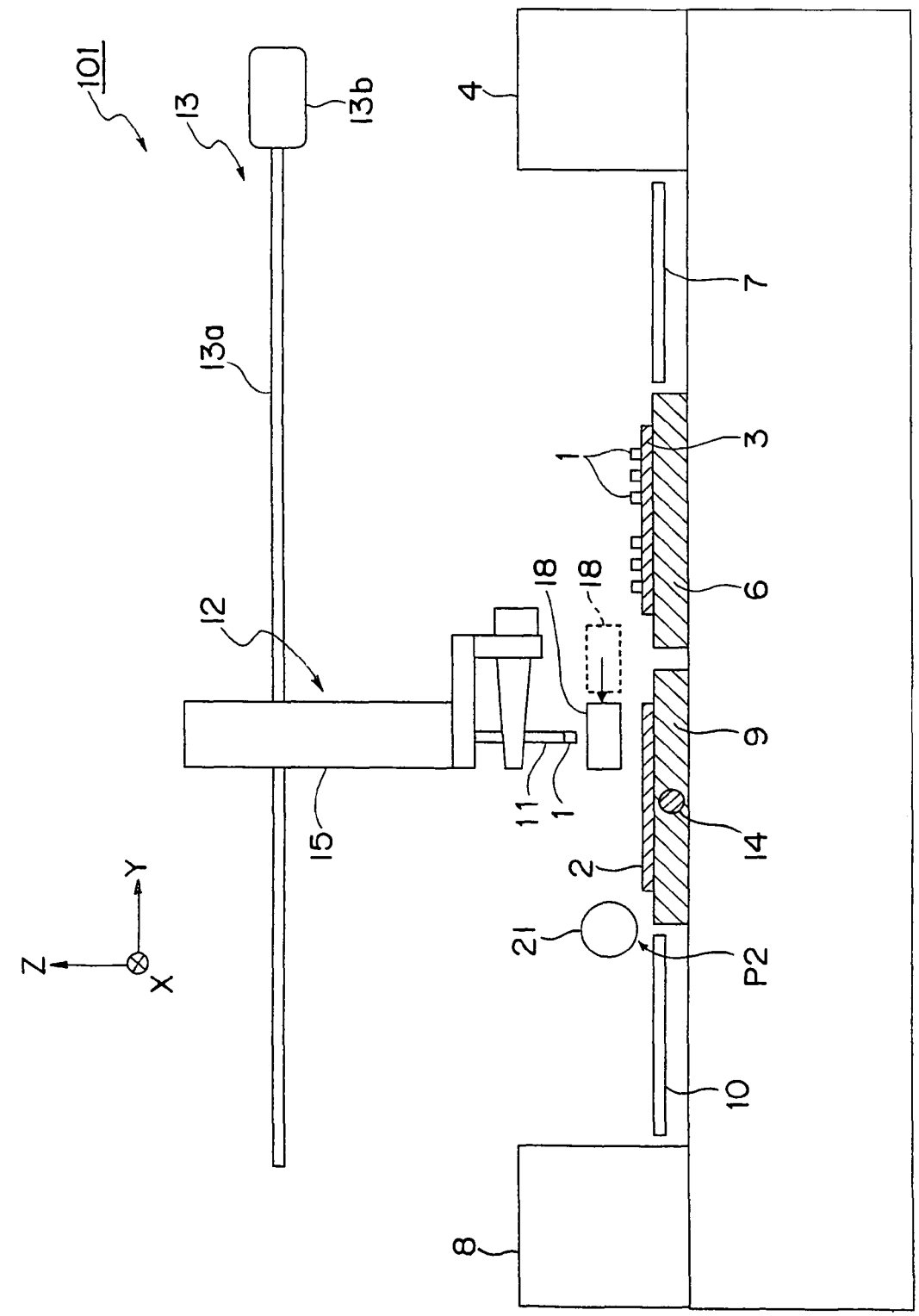
FIG. 5 is a schematic explanatory view showing a state in which positioning of an electronic component and a circuit board is being performed in the joining apparatus of FIG. 1.

Next, at step S2, alignment of the electronic component 1 sucked and held by the suction nozzle 11 with the joining position in the circuit board 2 held by the board stage 9 is performed. More specifically, as shown in FIG. 5, the recognition camera 18 is moved to above the joining position of the circuit board 2 by an unshown moving unit, and an image of the joining position is captured and acquired. Subsequently, a recognition process of the image is performed to make position recognition of the joining position in the circuit board 2. Further subsequently, based on a result of the recognition, the joining head 12 is moved in the Y-axis direction in the figure by the head moving unit 13, while the board stage 9 is moved in the X-axis direction in the figure by the board moving unit 14, by which alignment of the electronic component 1 sucked and held by the suction nozzle 11 with the joining position of the circuit board 2 is achieved.

Figure 6:
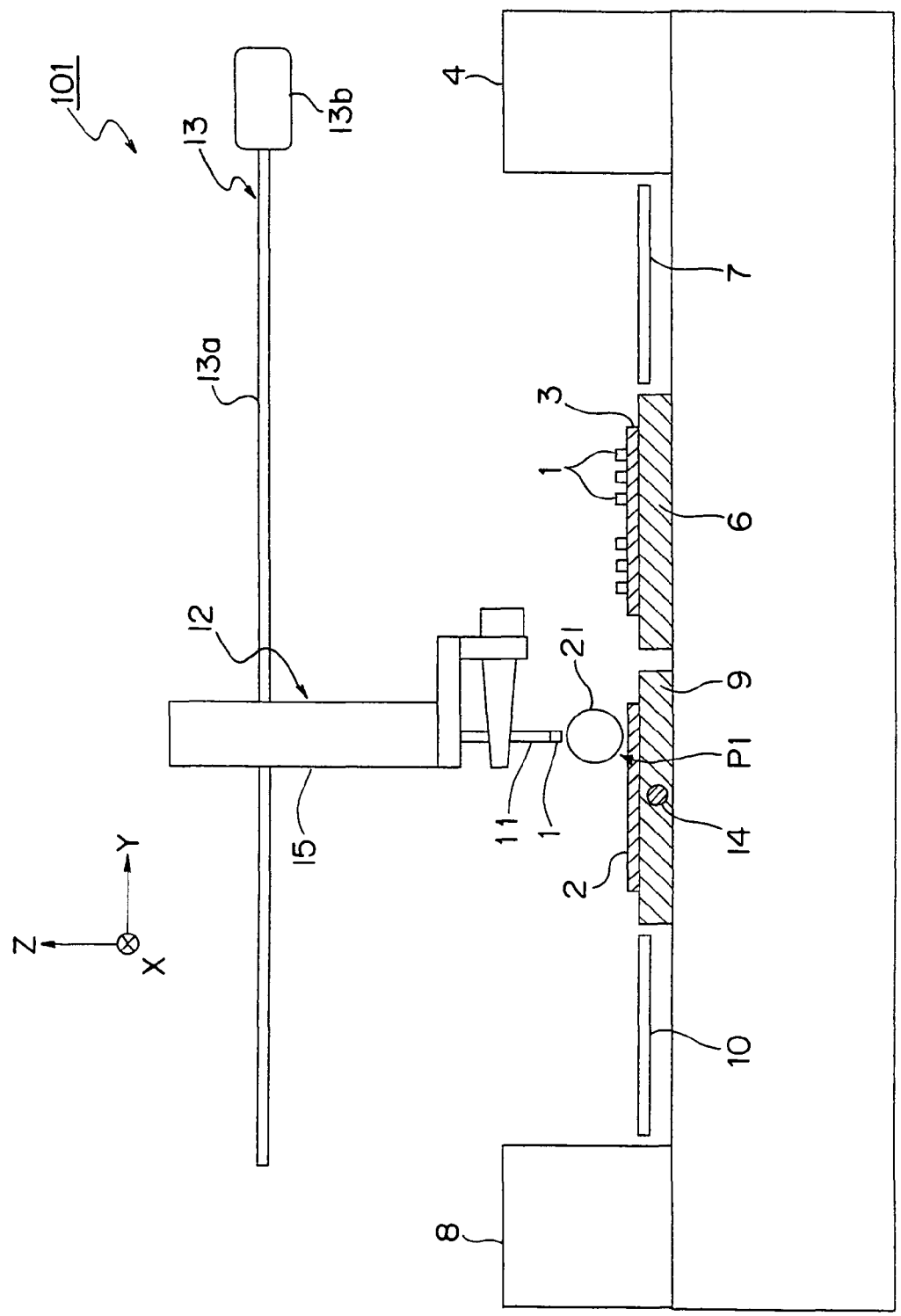
FIG. 6 is a schematic explanatory view showing a state in which ultraviolet cleaning process on metallic portions of an electronic component and a circuit board, respectively, is being performed in the joining apparatus of FIG. 1.

After completion of the alignment, the recognition camera 18 is withdrawn from above the circuit board 2 by an unshown moving unit, while the excimer ultraviolet lamp 21 is moved from the withdrawal position P2 to the ultraviolet irradiation position P1 by the lamp moving unit 22 in the ultraviolet irradiation unit 20. As a result of the move, as shown in FIG. 6, the excimer ultraviolet lamp 21 is positioned between the aligned electronic component 1 and the joining position of the circuit board 2. Thereafter, at step S3, ultraviolet rays of the specified wavelength are emitted from the excimer ultraviolet lamp 21, by which ultraviolet irradiation to the surfaces of the individual Au bumps 1b of the electronic component 1 as well as to the surfaces of the individual board electrodes 2a of the joining position in the circuit board 2 is carried out concurrently in an air atmosphere.

As a result of the execution of such ultraviolet irradiation, undesired substances such as organic substances deposited on the surfaces of the individual Au bumps 1b of the electronic component 1 and the surfaces of the individual board electrodes 2a of the circuit board 2 (hereinafter, referred to as metallic portion surfaces, on occasion) are removed by the energy of the ultraviolet rays, and moreover reforming such as excitation of the two metallic portion surfaces and removal of adsorbent substances in vicinities of surface electrodes, i.e. removal of joining inhibitors, is performed, thus the two metallic portions being subjected to the so-called ultraviolet cleaning process. The adsorbent substances of the surfaces of the two metallic portions are, for example, such joining inhibitors (substances that inhibit metal joining) as carbon (C) adsorbed to thicknesses of about 7 to 10 nm from the surfaces. The interatomic binding is disconnected by the energy of ultraviolet rays, or the adsorbent substances are oxidized into carbon monoxide, carbon dioxide or the like by oxygen radicals generated by the energy of ultraviolet rays, thus the adsorbent substances being gasified and removed.

Also, the Au bumps 1b of the electronic component 1 and the board electrodes 2a of the circuit board 2 are heated by irradiation of thermic ray radiated from the excimer ultraviolet lamp 21. As a result of this, the Au bumps 1b and the board electrodes 2a can be heated to some extent without providing any special heater, so that their later-described joining can be carried out more preferably. In addition, from the standpoint of suppressing attenuation of ultraviolet rays for quality improvement of the cleaning process, the distance between the excimer ultraviolet lamp 21 and the two metallic portion surfaces in the ultraviolet cleaning process is preferably not more than 1 mm. With a distance of about 50 mm, ultraviolet energy applied to the metallic portion surfaces would be nearly completely attenuated.

Figure 7:
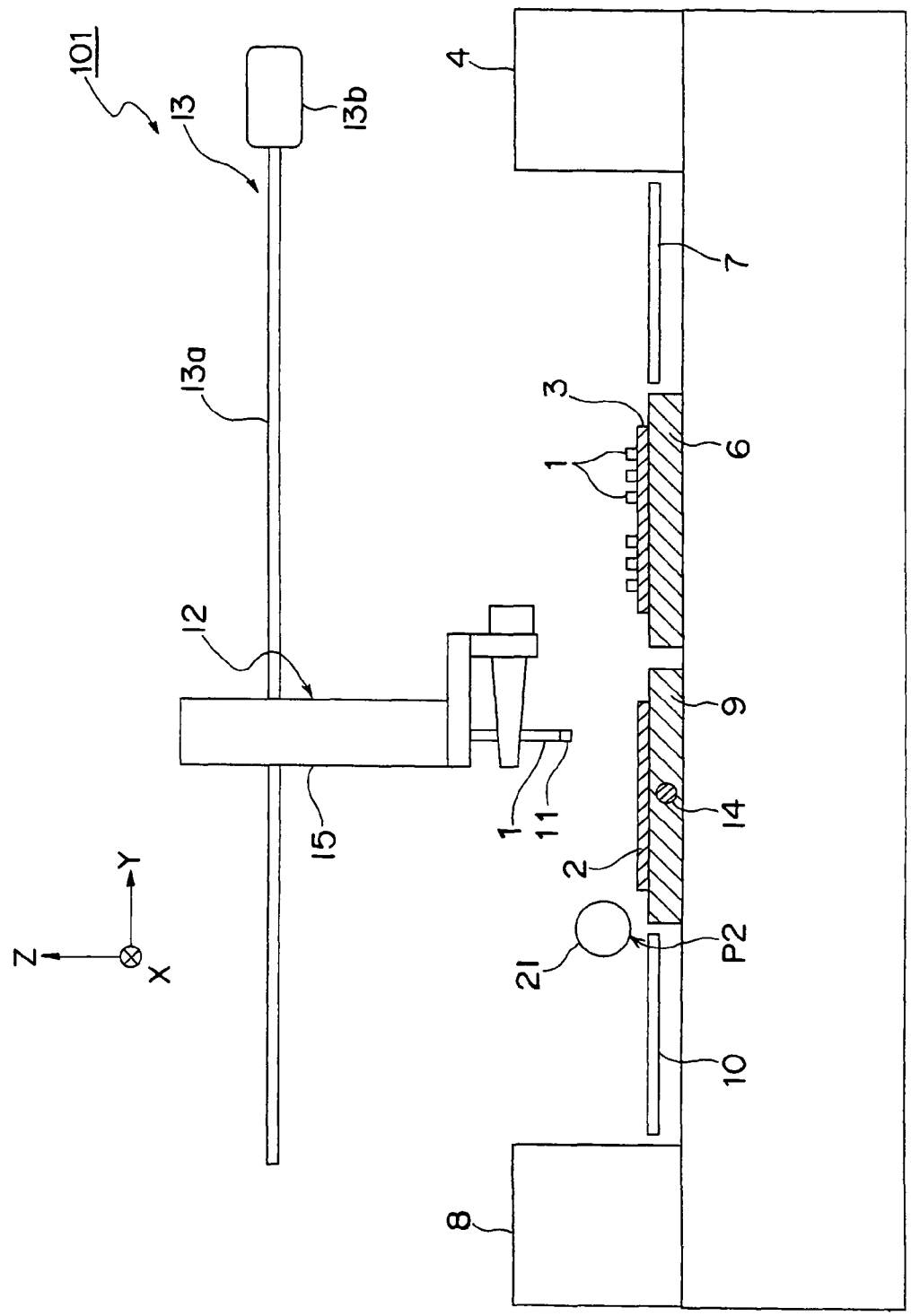
FIG. 7 is a schematic explanatory view showing a state in which an excimer ultraviolet lamp is positioned in a withdrawal position in the joining apparatus of FIG. 1.

Thereafter, over ultraviolet irradiation to the Au bumps 1*b* of the electronic component 1 and the board electrodes 2*a* of the circuit board 2 for a specified time elapse from the excimer ultraviolet lamp 21, the ultraviolet cleaning process is completed. More specifically, as shown in FIG. 7, the excimer ultraviolet lamp 21 located at the ultraviolet irradiation position P1 is moved in the Y-axis direction in the figure by the lamp moving unit 22 so as to be moved to the withdrawal position P2 (step S4). As a result, the excimer ultraviolet lamp 21 is withdrawn from above the circuit board 2.

Figure 8:
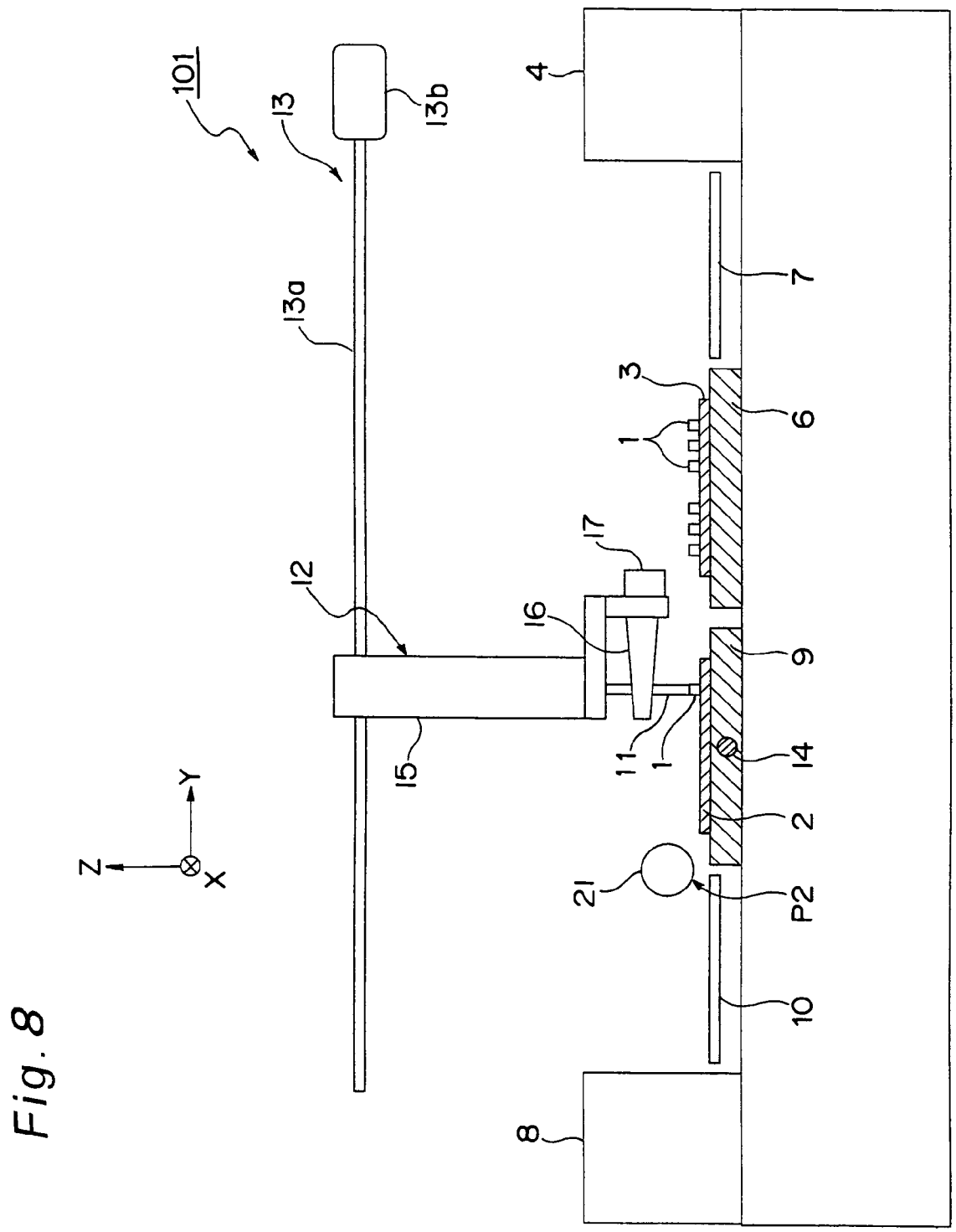
FIG. 8 is a schematic explanatory view showing a state in which the electronic component is being joined to the circuit board in the joining apparatus of FIG. 1.

Subsequently, as shown in FIG. 8, in the joining head 12, the suction nozzle 11 is moved down by the up/down unit 15 so that the Au bumps 1*b* of the electronic component 1 held by the suction nozzle 11 and the board electrodes 2*a* of the circuit board 2 in the joining position are brought into contact with each other, respectively, and further the Au bumps 1*b* are pressed against the board electrodes 2*a*. Next, by the ultrasonic vibrator 17, ultrasonic vibrations are imparted via the horn 16 and the suction nozzle 11 to the electronic component 1 sucked and held by the suction nozzle 11. As a result of this, the Au bumps 1*b* and the board electrodes 2*a* are joined as a metal junction, respectively (step S5).

In this joining apparatus 101, since the ultraviolet cleaning process is performed on the surfaces of the individual Au bumps 1*b* and the board electrodes 2*a* immediately before the execution of the metal joining, the joining is achieved between the clean surfaces exposed by removal of joining inhibitors from the two metallic portion surfaces. Accordingly, a strong binding occurs between the two metallic portion surfaces due to interatomic force between metal atoms, so that the electronic component 1 is strongly joined to the circuit board 2.

Figure 9:
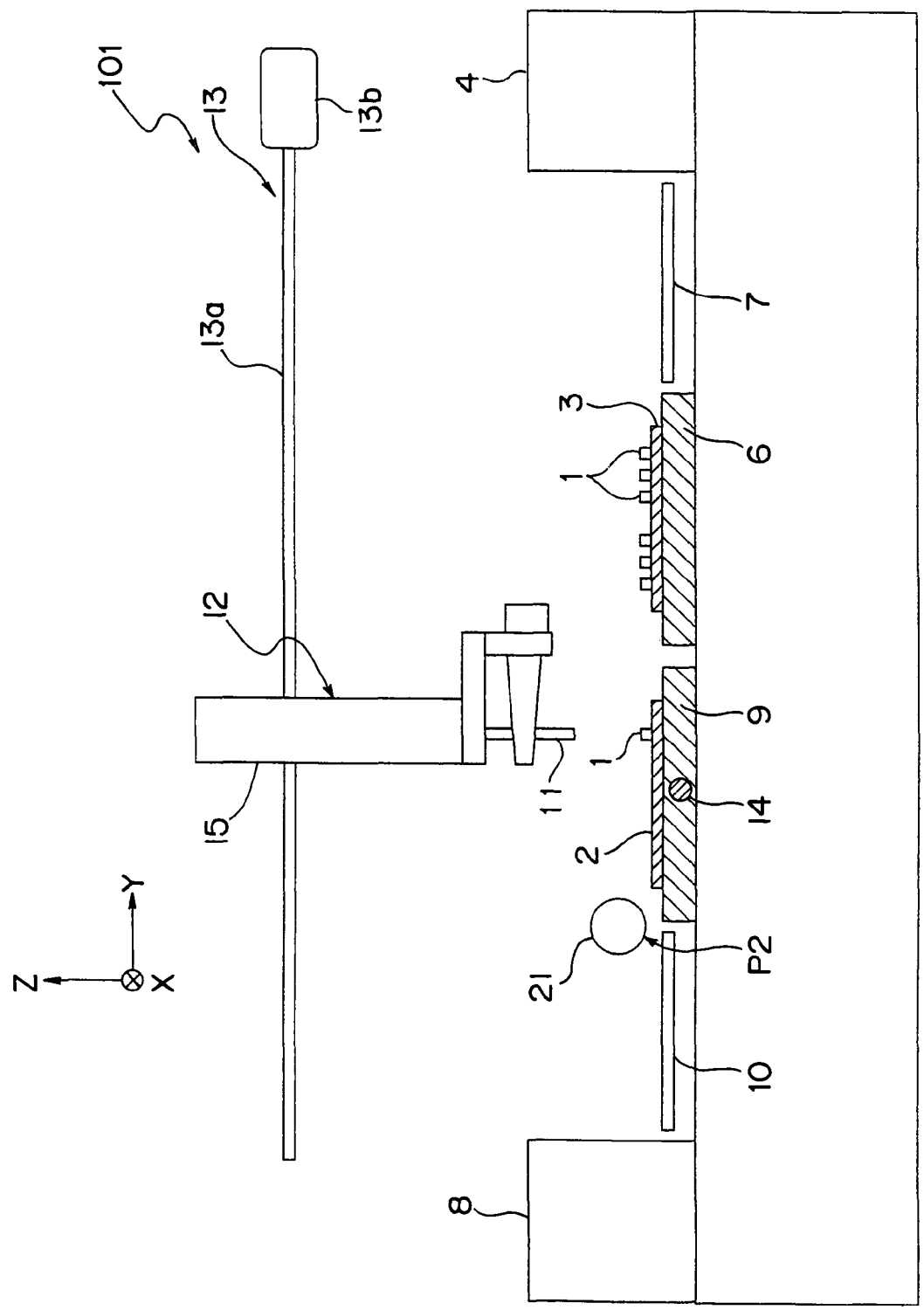
FIG. 9 is a schematic explanatory view showing a state in which the joining operation of the electronic component to the circuit board has been completed in the joining apparatus of FIG. 1.

Upon completion of the joining of the electronic component 1 to the circuit board 2, as shown in FIG. 9, the suction and holding of the electronic component 1 by the suction nozzle 11 is released, and the suction nozzle 11 is moved up by the up/down unit 15, the electronic component 1 being separated from the electronic component 1 joined to the circuit board 2. In addition, in a case where another electronic component 1 is joined to the circuit board 2, the individual operations of the foregoing steps S1 to S5 are performed in succession, by which the electronic component 1 is joined to another joining position in the circuit board 2. Thereafter, upon completion of the joining of the electronic components 1 to the circuit board 2, the holding of the circuit board 2 by the board stage 9 is released, and the circuit board 2 with the electronic components 1 joined thereto is carried out from on the board stage 9 by an unshown conveyance unit or the like. It is noted that, in this first embodiment, the ultrasonic vibrator 17, the horn 16 and the up/down unit 15 constitute a metal joining unit which performs the metal joining of the two metallic portions.

Figure 10:
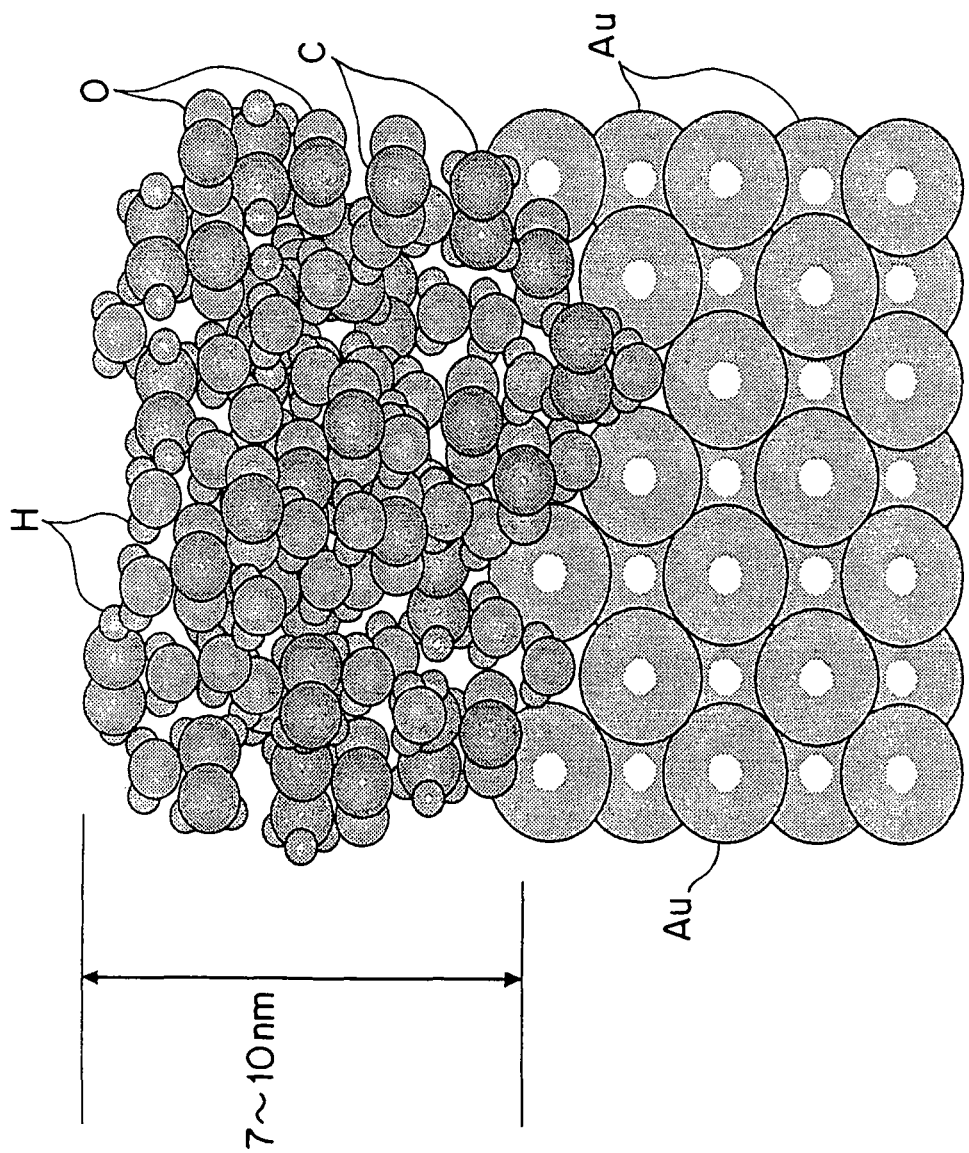
FIG. 10 is a schematic enlarged view at the atomic level showing a surface state of a metallic portion before executing the ultraviolet cleaning process.
Figure 11:
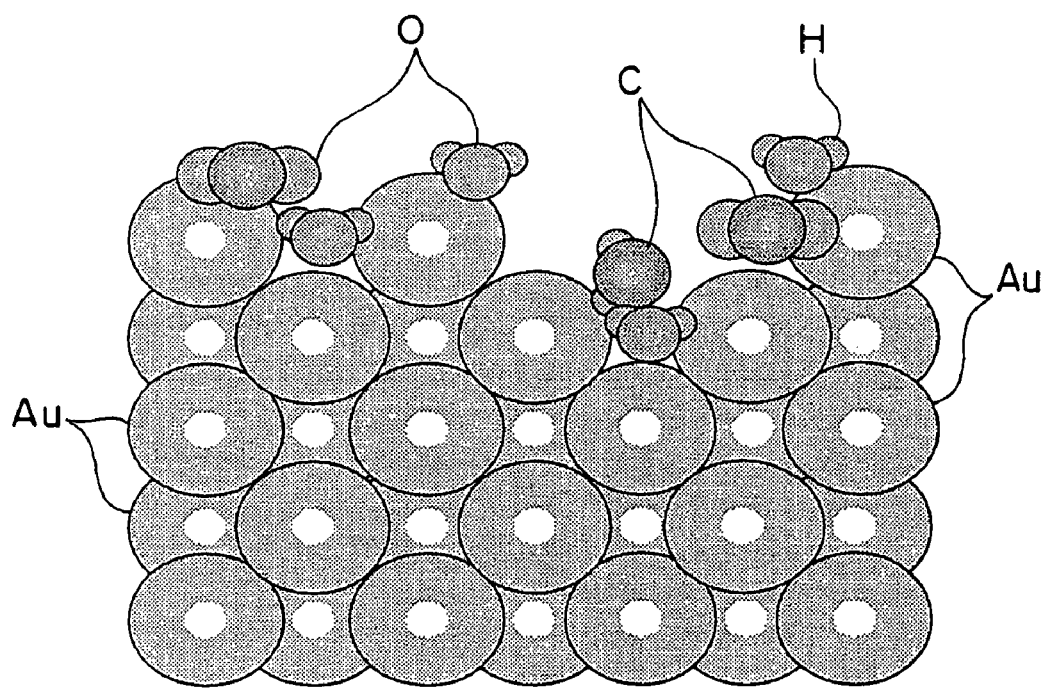
FIG. 11 is a schematic enlarged view at the atomic level showing a state in which the surface of the metallic portion of FIG. 10 has been subjected to ultraviolet cleaning process.

Now the ultraviolet cleaning process by the irradiation of ultraviolet rays from the excimer ultraviolet lamp 21 is described in more detail. For this description, as enlarged schematic views of the state of metallic portion surfaces (Au surfaces) of the Au bumps 1*b* and the board electrodes 2*a* in atomic level, FIG. 10 shows a state before the executing of the ultraviolet cleaning process and FIG. 11 shows a state after executing of the ultraviolet cleaning process. In FIGS. 10 and 11, Au atoms (atomic radius=0.144 nm) are designated as "Au", hydrogen atoms (atomic radius=0.037 nm) are designated as "H", carbon atoms (atomic radius=0.077 nm) are designated as and oxygen atoms (atomic radius=0.061 nm) are designated as "O".

As shown in FIG. 10, on the Au surface, there exist contaminations of joining inhibitors due to the interatomic force in a natural state. More specifically, in vicinities of the Au surface, such atoms as hydrogen atoms, carbon atoms and oxygen atoms are being adsorbed or separated off as joining inhibitors. Within a range of 7-10 nm from the Au surface, which is a range the interatomic force (intermolecular force) can reach, adsorption and separation come to a state of equilibrium, so that those atoms (or molecules) are bound to one another, being adsorbed as joining inhibitors. To the Au surface of such a state, ultraviolet rays, e.g. having a wavelength of 172 nm and an energy of 721 kJ/mol, are applied as the ultraviolet cleaning process, by which the interatomic binding can be broken down, allowing the joining inhibitors to be removed from the Au surface. A state in which the joining inhibitors have been removed in this way is the state shown in FIG. 11. Through the execution of the ultraviolet cleaning process, as shown in FIG. 11, most of the hydrogen atoms, carbon atoms and oxygen atoms, which had existed within the range of 7-10 nm, have been removed on the Au surface, so that Au atoms are made partly exposed, or more nearly exposed, from the Au surface, that is, a clean surface is exposed. In the state that the clean surface is exposed with joining inhibitors removed from the Au surface as shown above, it is easier to achieve stronger metal joining between Au atoms themselves. Therefore, bringing the clean surfaces into contact with each other makes it possible to realize stronger metal joining.

Figure 12:
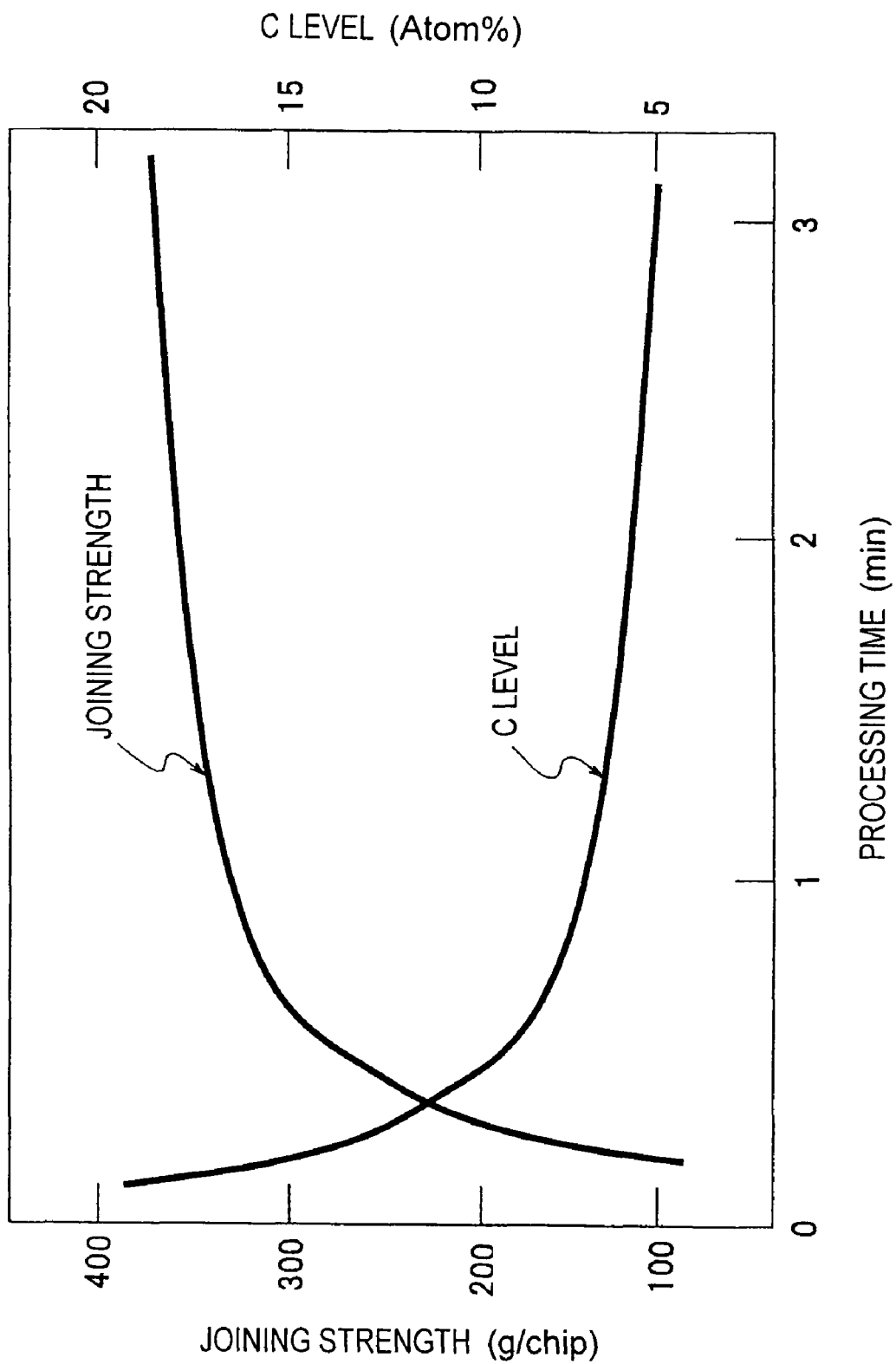
FIG. 12 is a chart in a graph form showing a relationship between processing time and joining strength as well as carbon content in the ultraviolet cleaning process.

In this connection, as data showing effects of the ultraviolet cleaning process, FIG. 12 shows a graph showing relationships among ultraviolet cleaning process time (ultraviolet irradiation time, horizontal axis), joining strength in the metal joining (left-hand vertical axis), and carbon (C) quantity deposited on the metallic portion surfaces (right-hand vertical axis). As shown in FIG. 12, it can be understood that the joining strength in the metal joining is greatly improved by an about 10-sec. ultraviolet cleaning process, and moreover that the concentration of carbons deposited on the metallic portion surfaces can be greatly reduced.

Also, after the execution of such an ultraviolet cleaning process, if the cleaned metallic portion surfaces are left as they are, re-adsorption of joining inhibitors progresses with time elapse, for example, an elapse of 5 to 10 minutes would cause the metallic portion surfaces to turn back to the state before the cleaning. Accordingly, the metal joining is executed preferably in about three minutes, more preferably in two minutes, after the execution of the ultraviolet cleaning process. From such a point of view, in the process adopted for the joining apparatus 101 of this first embodiment, after execution of the alignment between the electronic component 1 sucked and held by the suction nozzle 11 and the joining position in the circuit board 2, the ultraviolet cleaning process by the excimer ultraviolet lamp 21 is performed in the aligned state, allowing the metal joining to be executed immediately after the execution of the ultraviolet cleaning process.

In the description of the above-described joining method of the joining apparatus 101 of this first embodiment, the up/down unit 15 is included in the joining head 12, and the suction nozzle 11 is moved up or down by the up/down unit 15 so that the suction nozzle 11 is moved relatively closer to or farther from the board stage 9. However, the first embodiment is not limited to only such a structure. Instead of such a case, for example, the board stage 9 may be moved up or down.

Further, although it has been described that the ultrasonic vibrator 17 is included in the joining head 12, yet this is not limitative and, for example, it is also adoptable that an ultrasonic vibrator is included in the board stage 9 so that ultrasonic vibrations are imparted to the board electrodes 2a of the circuit board 2 via the board stage 9.

Also, although it has been described that the ultraviolet irradiation unit 20 includes the lamp moving unit 22 that moves the excimer ultraviolet lamp 21 between the irradiation position P1 and the withdrawal position P2, yet instead of such a structure, it is also possible to adopt a structure that the joining head 12 and the board stage 9 are integrally moved in the Y-axis direction in the figure so that the excimer ultraviolet lamp 21 is withdrawn from above the board stage 9.

As described above, in the joining apparatus 101, since the cleaning process is performed by applying ultraviolet rays simultaneously to the Au bumps 1b of the electronic component 1 and the board electrodes 2a of the circuit board 2 by the excimer ultraviolet lamp 21, the structure for fulfilling the cleaning process of the electronic component 1 and the circuit board 2 can be simplified, and the metal joining of the two metallic portions can be achieved with simplicity and high joining strength. Further, since the ultraviolet cleaning process for the two metallic portions is carried out in an air atmosphere, the structural component of the chamber or the like for performing the cleaning process can be omitted so that the structure of the joining apparatus 101 can be further simplified, as compared with the conventional structure for performing the cleaning process.

Further, since the excimer ultraviolet lamp 21 is used as the ultraviolet-ray generating source in the joining apparatus 101, ultraviolet rays having wavelengths much shorter than those of the lamp 21 (i.e., ultraviolet rays of higher energy) can be emitted. Thus, generation of ozone ($O_3$) that causes the removal efficiency of adsorbents (joining inhibitors) to lower can be suppressed, and moreover oxygen radicals can efficiently be generated, so that the ultraviolet cleaning process for the two metallic portion surfaces can efficiently be fulfilled. Further, since the two metallic portions can be heated by the excimer ultraviolet lamp 21, there can be obtained an effect that the metal joining can be accelerated by the heating.

Furthermore, in the joining apparatus 101, even if the electronic component 1 is of a type unsuitable for irradiation of high energy such as plasma cleaning process (i.e., a type that may be damaged by the irradiation of energy more intense than in the ultraviolet cleaning process), the electronic component 1 can be subjected to the cleaning process without being damaged.

Modification Example

The joining apparatus 101 of this first embodiment has been described on a case where the electronic component 1 is joined to the joining position of the circuit board 2 by metal joining after execution of the ultraviolet cleaning process. However, objects of such joining are not limited to the electronic components 1 or the circuit boards 2. Instead of such a case, a case where a first container member as an example of the first object and a second container member as a second object are used is described below as a modification example of this first embodiment. It is noted that the joining method according to this modification example can be carried out in the above-described joining apparatus 101, and so the description of the structure of the joining apparatus is omitted.

Figure 13:
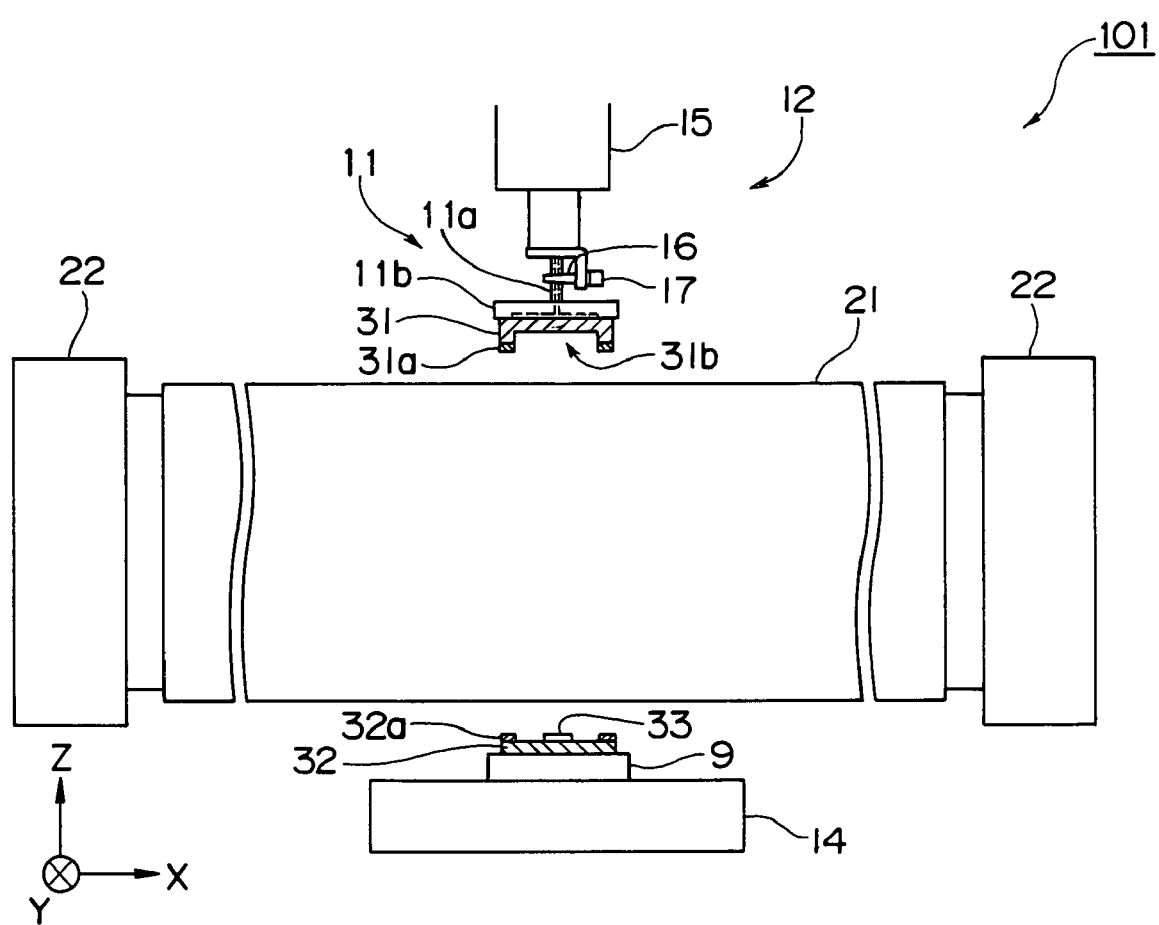
FIG. 13 is a schematic structural view showing a partial structure of a joining apparatus according to a modification example of the first embodiment, showing a state in which each container member is being subjected to ultraviolet cleaning process.

First, in the joining apparatus 101, FIG. 13 shows a schematic explanatory view showing a state in which ultraviolet rays emitted from the excimer ultraviolet lamp 21 are being applied to the first container member 31 and the second container member 32. In FIG. 13, the joining head 12 and the board moving unit 14 are depicted so as to be largely scaled down, compared with the other structure for convenience' sake. Also, the distance between the first container member 31 and the second container member (hereinafter, referred to generically as 'two container members' with an occasional), and the distance between the two container members and the excimer ultraviolet lamp 21, are depicted larger, compared with the excimer ultraviolet lamp 21.

As shown in FIG. 13, the first container member 31 to be sucked and held by the suction nozzle 11 is a generally rectangular-shaped member having an opening 31b on the (−Z)-axis side, and a first metallic portion 31a formed of gold (Au) is provided on the surface extending around the opening 31b and facing toward the (−Z)-axis side. Also, the second container member 32 to be held by the board stage 9 is a flat-plate shaped member which is joined to the first container member 31 to close the opening 31b. On the principal plane of the second container member 32 on the (+Z)-axis side, a second metallic portion 32a formed of gold is provided at a position corresponding to the first metallic portion 31a of the first container member 31 (i.e., a position near a peripheral edge portion of the second container member 32), and an electronic component 33 is mounted near a central portion. It is noted that the first metallic portion 31a and the second metallic portion 32a are not necessarily limited to gold, and may be formed of such a metal as copper (Cu), aluminum (Al) or tin (Sn). Also, the two container members 31, 32 each have a rectangular configuration in the horizontal direction with both length and width being about 2 mm. On the (+X)-axis side and (−X)-axis side of the excimer ultraviolet lamp 21 is provided the lamp moving unit 22 for moving the excimer ultraviolet lamp 21 in the Y-axis direction in FIG. 13.

In the joining apparatus 101 shown above, for the joining of the first container member 31 and the second container member 32 to each other, first, the first container member 31 is extracted from the component tray 3 and sucked and held by the suction nozzle 11 in a state that the excimer ultraviolet lamp 21 has previously been withdrawn from between the suction nozzle 11 and the board stage 9, i.e., a state that the excimer ultraviolet lamp 21 is located at the withdrawal position P2. Subsequent to, or in parallel to, the holding operation of the first container member 31, the second container member 32 is extracted from an unshown component tray and held by the board stage 9. Thereafter, the head moving unit 13 and the board moving unit 14 are subjected to relative positional alignment therebetween, by which positional alignment between the second metallic portion 32a and the first metallic portion 31a is performed. In FIG. 13, the suction nozzle 11 includes a shaft portion 11a, which is a rod-like portion, and a holding member 11b, which is a plate-like member connected to the shaft portion 11a and having at its lower face an opening for suction use, in order to fulfill secure suction and holding of the first container member 31.

Upon completion of the first container member 31 and the second container member 32, the excimer ultraviolet lamp 21 is moved in the Y-axis direction by the lamp moving unit 22 so as to be located at the irradiation position P1, which is a position between the first container member 31 and the second container member 32. Subsequently, ultraviolet rays having a wavelength of about 172 nm are emitted from the excimer ultraviolet lamp 21, by which ultraviolet irradiation to the first container member 31 (particularly, the first metallic portion 31a) placed in proximity to the excimer ultraviolet lamp 21 as well as to the second container member 32 (particularly, the second metallic portion 32a) is carried out concurrently in an air atmosphere.

By this ultraviolet irradiation, joining inhibitors adsorbed on the surfaces of the first metallic portion 31a and the second metallic portion 32a are removed with the result that clean surfaces are exposed (ultraviolet cleaning process).

Upon completion of the ultraviolet cleaning process on the first metallic portion 31a and the second metallic portion 32a, the excimer ultraviolet lamp 21 is moved in the Y-axis direction by the lamp moving unit 22 so as to be moved to the withdrawal position P2 from between the first container member 31 and the second container member 32. Subsequently, the suction nozzle 11 is moved down by the up/down unit 15 so as to become closer to the board stage 9, so that the first metallic portion 31a of the first container member 31 sucked and held by the suction nozzle 11 and the second metallic portion 32a of the second container member 32 held by the board stage 9 are brought into contact with each other, and further the first container member 31 is pressed against the second container member 32. Next, by the ultrasonic vibrator 17, ultrasonic vibrations are imparted via the horn 16 and the suction nozzle 11 to the first container member 31 and the first metallic portion 31a, by which the first metallic portion 31a and the second metallic portion 32a are metal joined to each other in the air atmosphere.

In the joining apparatus 101, since the ultraviolet cleaning process is performed on the first metallic portion 31a and the second metallic portion 32a, there occurs a strong binding due to interatomic force of metal atoms between the two metallic portions, so that the first container member 31 is strongly fitted to the second container member 32. Thus, an electronic component package internally having a space for housing therein the electronic component 33 is formed.

Upon completion of the joining of the first container member 31 and the second container member 32, the suction and holding of the first container member 31 by the suction nozzle 11 is released, and the suction nozzle 11 is moved up away from the first container member 31, the electronic component package being carried out from on the board stage 9 by an unshown conveyance unit.

Thus, even if the objects to be joined are those other than electronic components or circuit boards, for example, container members for forming electronic component packages as described above, the effect of the metal joining after the ultraviolet cleaning process can be obtained. In particular, even if the electronic component 33 mounted on the second container member 32 is of a type unsuitable for irradiation of high energy such as plasma cleaning process, it is practicable to perform the cleaning process for the second metallic portion 32a.

Second Embodiment

Figure 14:
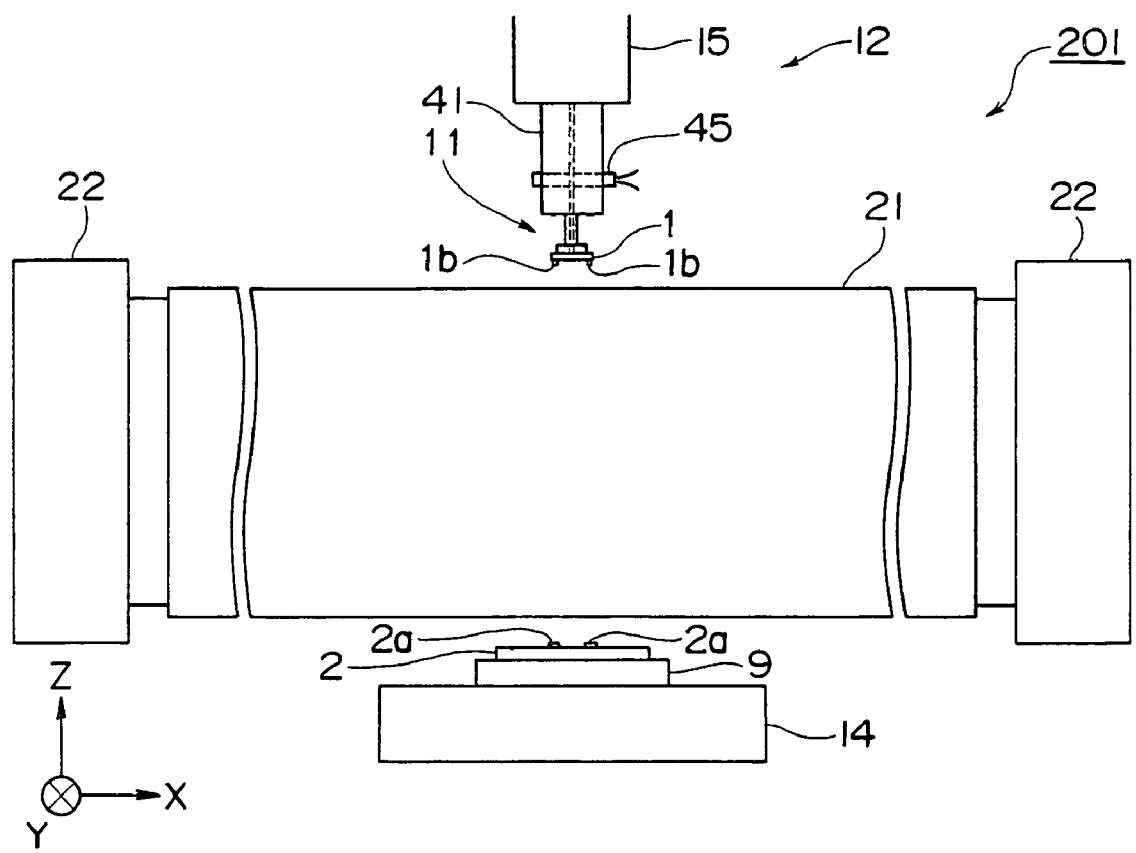
FIG. 14 is a schematic structural view showing a partial structure of a joining apparatus according to a second embodiment of the present invention.

Next, FIG. 14 shows a schematic structural view showing a partial structure of a joining apparatus 201 which is an example of a joining apparatus according to a second embodiment of the present invention. This joining apparatus 201 is a device for performing joining and electrical connecting (i.e., mounting) of an electronic component 1 to a circuit board 2 as in the first embodiment. As shown in FIG. 14, in the joining apparatus 201, a heater 45 for heating the suction nozzle 11 is provided on a shaft 41 instead of the ultrasonic vibrator 17 and the horn 16 included in the joining apparatus 101 of FIG. 1. The other constituent members are the same as in the joining apparatus 101 of FIG. 1, and designated by the same reference numerals in the following description. In FIG. 14, the joining head 12 and the board stage 9 are depicted so as to be largely scaled down, compared with the other constituent members, as in FIG. 1. Also, the distances of the electronic component 1 and the circuit board 2 to the excimer ultraviolet lamp 21 are depicted larger, compared with the excimer ultraviolet lamp 21.

A mounting operation of the electronic component 1 to the circuit board 2 by the joining apparatus 201 is almost similar to the joining operation (see FIG. 4) by the joining apparatus 101 of the first embodiment. Hereinbelow, the joining operation (mounting operation) by the joining apparatus 201 is explained with reference to flowchart of the joining procedure shown in FIG. 4.

In the joining apparatus 201, first, with the excimer ultraviolet lamp 21 withdrawn from the irradiation position P1 to the withdrawal position P2, the electronic component 1 is sucked and held by the suction nozzle 11, and the circuit board 2 is held by the board stage 9 (FIG. 4, step S1).

In the suction nozzle 11, the electronic component 1 having Au bumps 1b, which are metallic portions, is sucked and held with the Au bumps 1b facing downward. In the board stage 9, the circuit board 2 is held with the board electrodes 2a facing upward.

Also, in the joining head 12, the electronic component 1 held by the suction nozzle 11 has previously been and is continuously heated by the heater 45. By the head moving unit 13 and the board moving unit 14, alignment of the Au bumps of the electronic component 1 with the board electrodes 2a of the circuit board 2 is performed (step S2 of FIG. 4). Subsequently, the excimer ultraviolet lamp 21 is moved by the lamp moving unit 22 to between the electronic component 1 and the circuit board 2, where ultraviolet rays are emitted from the excimer ultraviolet lamp 21, by which ultraviolet irradiation to the Au bumps 1b and the board electrodes 2a is performed in an air atmosphere. Thus, the two electrode portions are subjected to the ultraviolet cleaning process (step S3). In addition, the circuit board 2 is also heated to some extent by thermic ray radiated from the excimer ultraviolet lamp 21.

Upon completion of the ultraviolet cleaning process for the two electrode portions, the excimer ultraviolet lamp 21 is withdrawn from between the electronic component 1 and the circuit board 2 (step S4), the suction nozzle 11 is moved down so as to approach the board stage 9, and the electronic component 1 is pressed against the circuit board 2 in the state that the Au bumps 1b of the electronic component 1, to which heat has previously been imparted by the heater 45, is kept in contact with the board electrodes 2a of the circuit board 2. As a result of this, the two electrode portions of the electronic component 1 and the circuit board 2 are metal joined together in an air atmosphere, where the mounting (metal joining) of the electronic component 1 to the circuit board 2 is completed (step S5).

For the joining apparatus 201, it is also allowed that the circuit board 2 is held by the suction nozzle 11, while the electronic component 1 is held by the board stage 9, and moreover that the board electrodes 2a of the circuit board 2 are previously heated by the heater 45.

As described above, in the joining apparatus 201, since the cleaning process is performed by applying ultraviolet rays simultaneously to the Au bumps 1b of the electronic component 1 and the board electrodes 2a of the circuit board 2 by the excimer ultraviolet lamp 21, the structure related to the cleaning process of the electronic component 1 and the circuit board 2 can be simplified, and the metal joining of the two metallic portions can be achieved with simplicity. Further, since the ultraviolet cleaning process for the two metallic portions is carried out in an air atmosphere, the structure of the joining apparatus 201 can be further simplified.

Further, in the joining apparatus 201, the board electrodes 2a of the circuit board 2 can be heated to some extent by the excimer ultraviolet lamp 21 without providing a heater for heating of the circuit board 2. As a result of this, more proper joining between the Au bumps 1b and the board electrodes 2a can be achieved. In addition, the heating of the Au bumps 1b of the electronic component 1 may be performed only by the irradiation of thermic ray from the excimer ultraviolet lamp 21. In this case, the structure of the joining apparatus 201 can be further simplified by omitting the heater 45.

Third Embodiment

Figure 15:
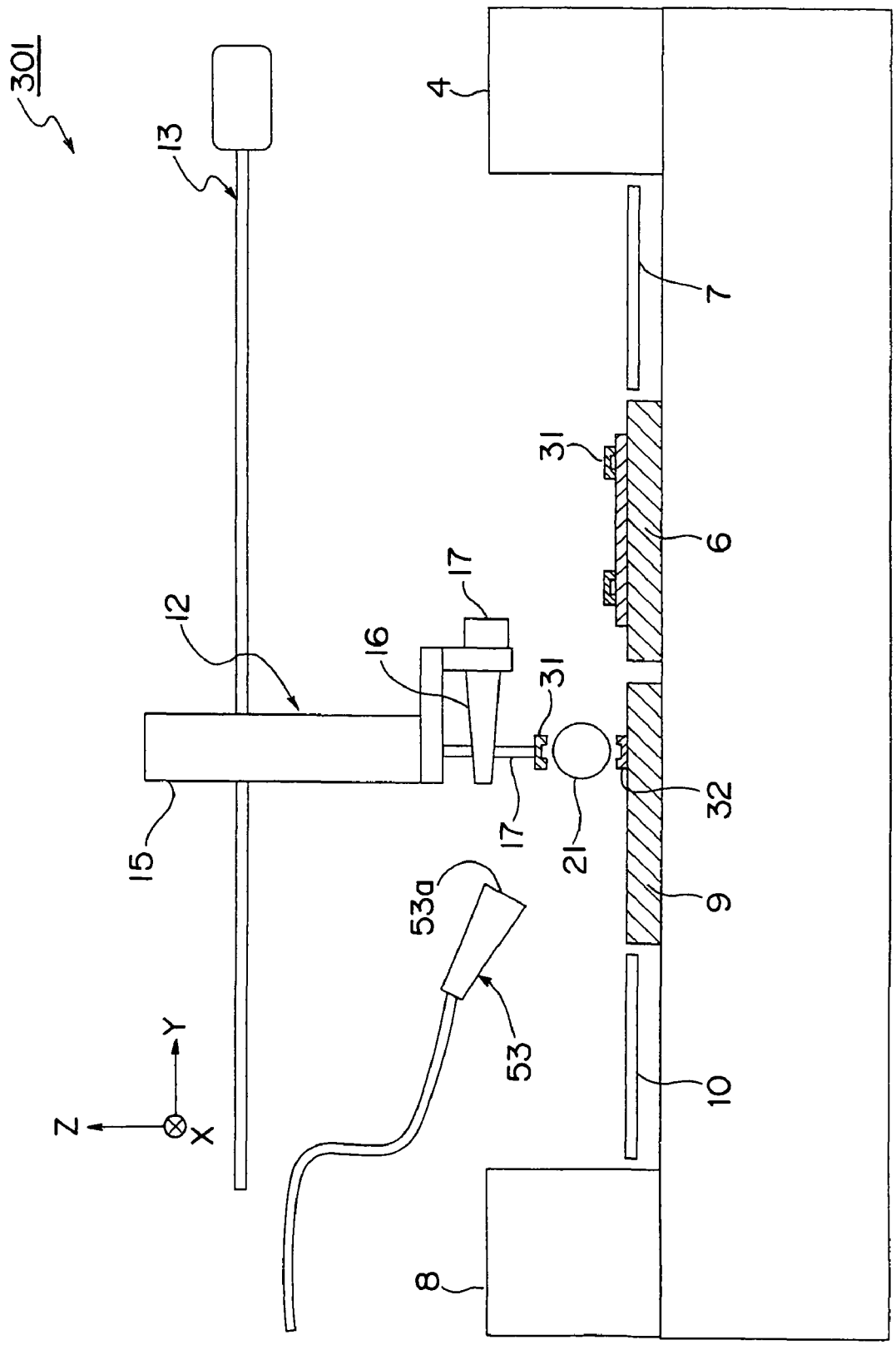
FIG. 15 is a schematic structural view showing the structure of a joining apparatus according to a third embodiment of the present invention.
Figure 16:
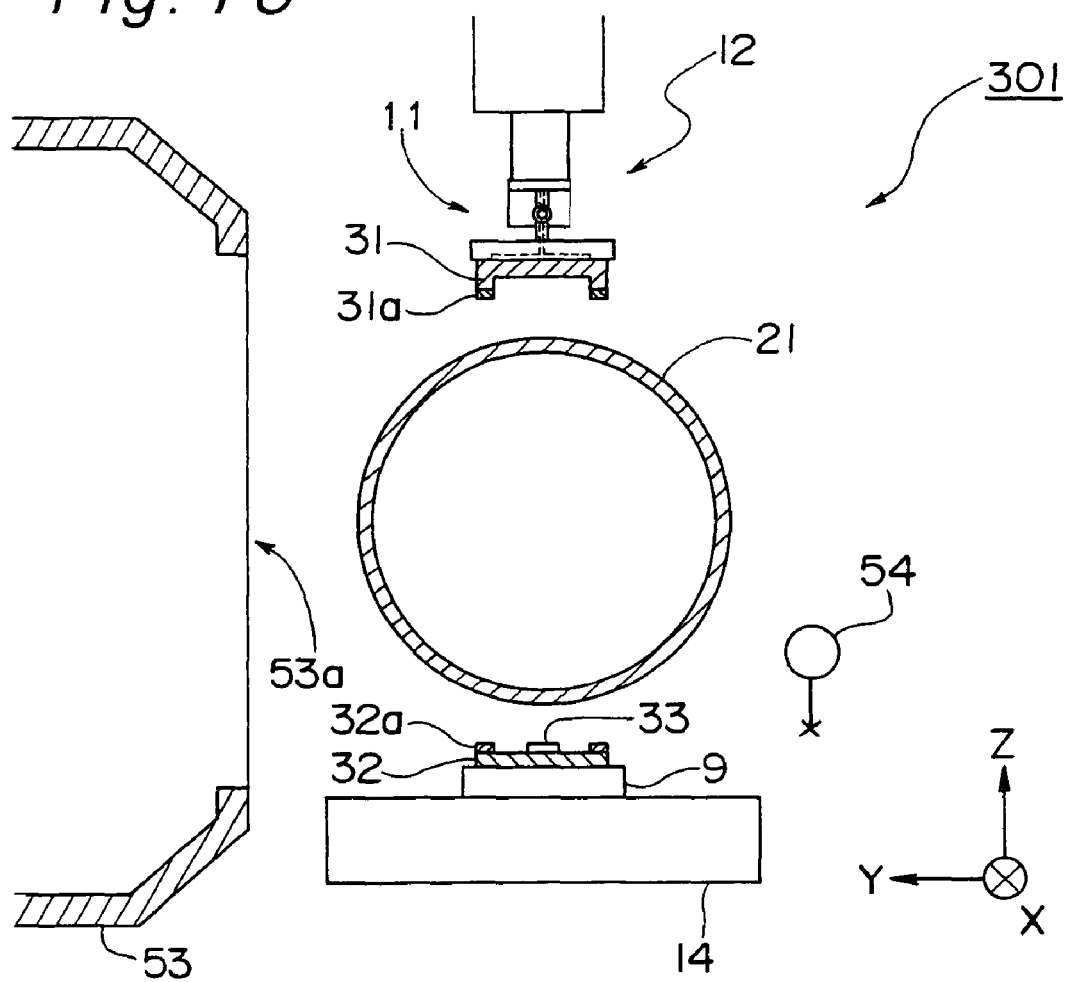
FIG. 16 is a partly enlarged schematic explanatory view of the joining apparatus of FIG. 15.

Next, FIG. 14 is a schematic structural view showing the structure of a joining apparatus 301 which is an example of a joining apparatus according to a second embodiment of the invention. FIG. 16 is a further schematic view of the structure of the joining apparatus 301 of FIG. 15 as viewed along the (+X)-axis direction from the (−X)-axis side.

The joining apparatus 301 is an apparatus for joining the first container member 31 and the second container member 32 to each other to form an electronic component package which allows the electronic component 33 to be internally housed, as in the joining apparatus 101 of the first second embodiment. As shown in FIGS. 15 and 16, in the joining apparatus 301, a gas supply unit 53 for supplying nitrogen (N₂) gas as an example of inert gas to the first container member 31 and the second container member 32 held by the suction nozzle 11 and the board stage is provided on the (+Y)-axis side of the excimer ultraviolet lamp 21. On the (−Y)-axis side of the gas supply unit 53 is formed a supply port 53a whose width in the Z-axis direction is larger than the diameter of the excimer ultraviolet lamp 21. The other constituent members are the same as in the joining apparatus 101 of FIG. 1, and designated by the same reference numerals in the following description.

The joining operation of the first container member 31 and the second container member 32 by the joining apparatus 301 is almost similar to that of the joining apparatus 101 of the first embodiment, but differs therefrom only in that, in the ultraviolet irradiation to the first container member 31 and the second container member 32 by the excimer ultraviolet lamp 21, nitrogen gas is supplied from the supply port 53a of the gas supply unit 53 to vicinities of the two container members to lower the oxygen concentration of the vicinities of the two container members.

Also, in the joining apparatus 301, ultraviolet irradiation to the first metallic portion 31a and the second metallic portion 32a by the excimer ultraviolet lamp 21, i.e. ultraviolet cleaning process, is concurrently performed in a state that vicinities of the first container member 31 and the second container member 32 located above and below the excimer ultraviolet lamp 21 have been set to a low oxygen atmosphere having oxygen concentrations of 10% or lower (more preferably 1% or lower, even more preferably 100 ppm or lower) by nitrogen gas supplied from the gas supply unit 53. Therefore, generation of ozone is suppressed in vicinities of the two container members, and oxygen radicals are efficiently generated, so that the quality of cleaning process of the two metallic portions by the ultraviolet irradiation can be further improved with a simple structure. As a result of this, the first container member 31 and the second container member 32 can be joined together by metal joining with strength and high quality. Also, as in the joining apparatus 101 of the first embodiment, the structure related to the cleaning process of the two container members can be simplified. In addition, for execution of the ultraviolet irradiation with the oxygen concentration securely held as described above, the joining apparatus 301 includes an oxygen concentration detection sensor 54 so that the ultraviolet cleaning process is carried out in the state that a specified oxygen concentration is ensured by the oxygen concentration sensor 54.

Furthermore, in the joining apparatus 301, vicinities of the two container members are set to a low oxygen atmosphere with nitrogen gas supplied thereto also for the joining of the first container member 31 and the second container member 32. As a result of this, re-adsorption of joining inhibitors to the first metallic portion 31a and the second metallic portion 32a after the ultraviolet cleaning process is suppressed, so that the two container members can be joined to each other more securely. It is noted that the gas to be supplied by the gas supply unit 53 is not limited to nitrogen gas, and argon or other inert gases may be used.

Fourth Embodiment

Figure 17:
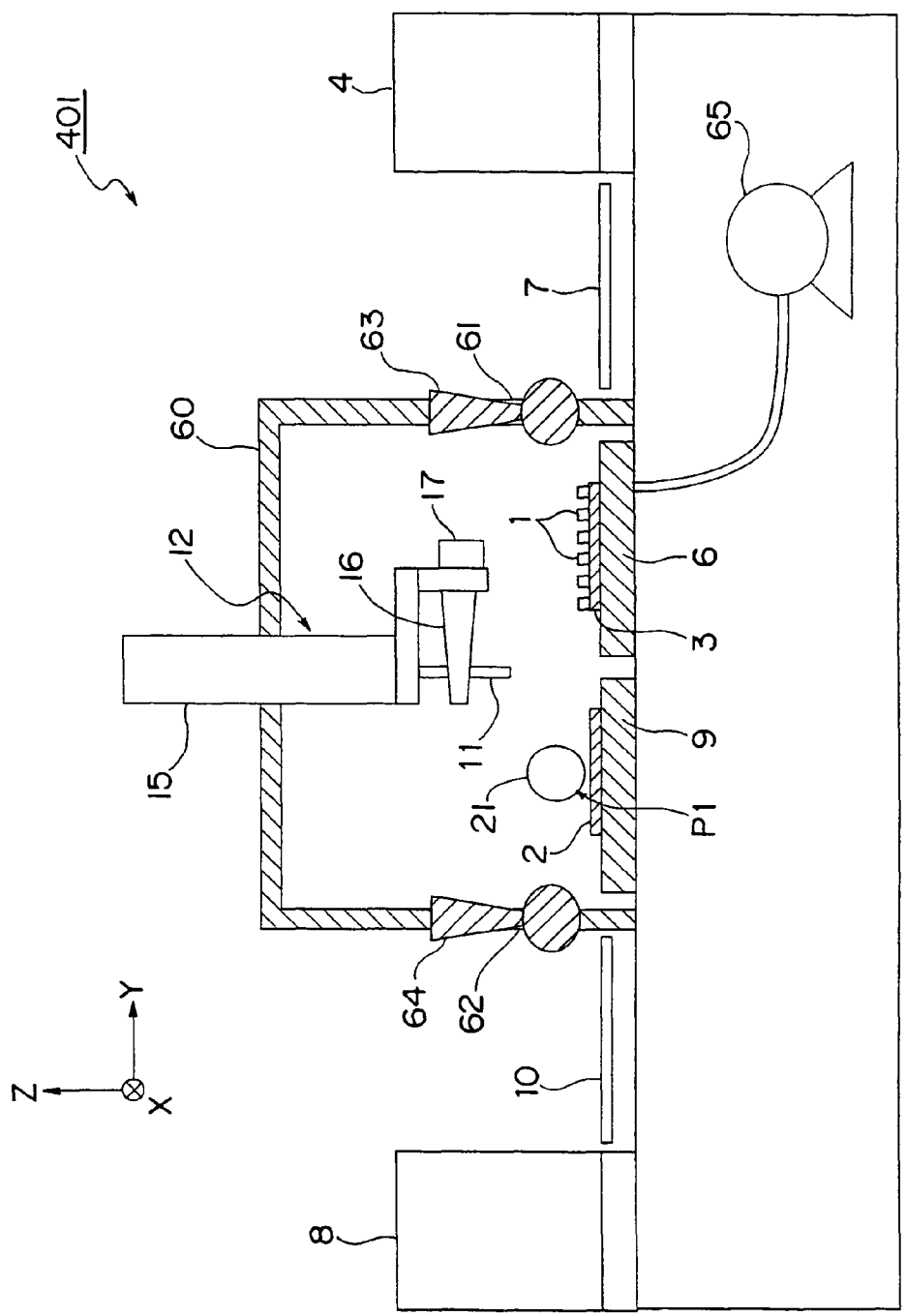
FIG. 17 is a schematic structural view showing the structure of a joining apparatus according to a fourth embodiment of the present invention, showing a state in which electronic components and a circuit board have been carried into the chamber.
Figure 18:
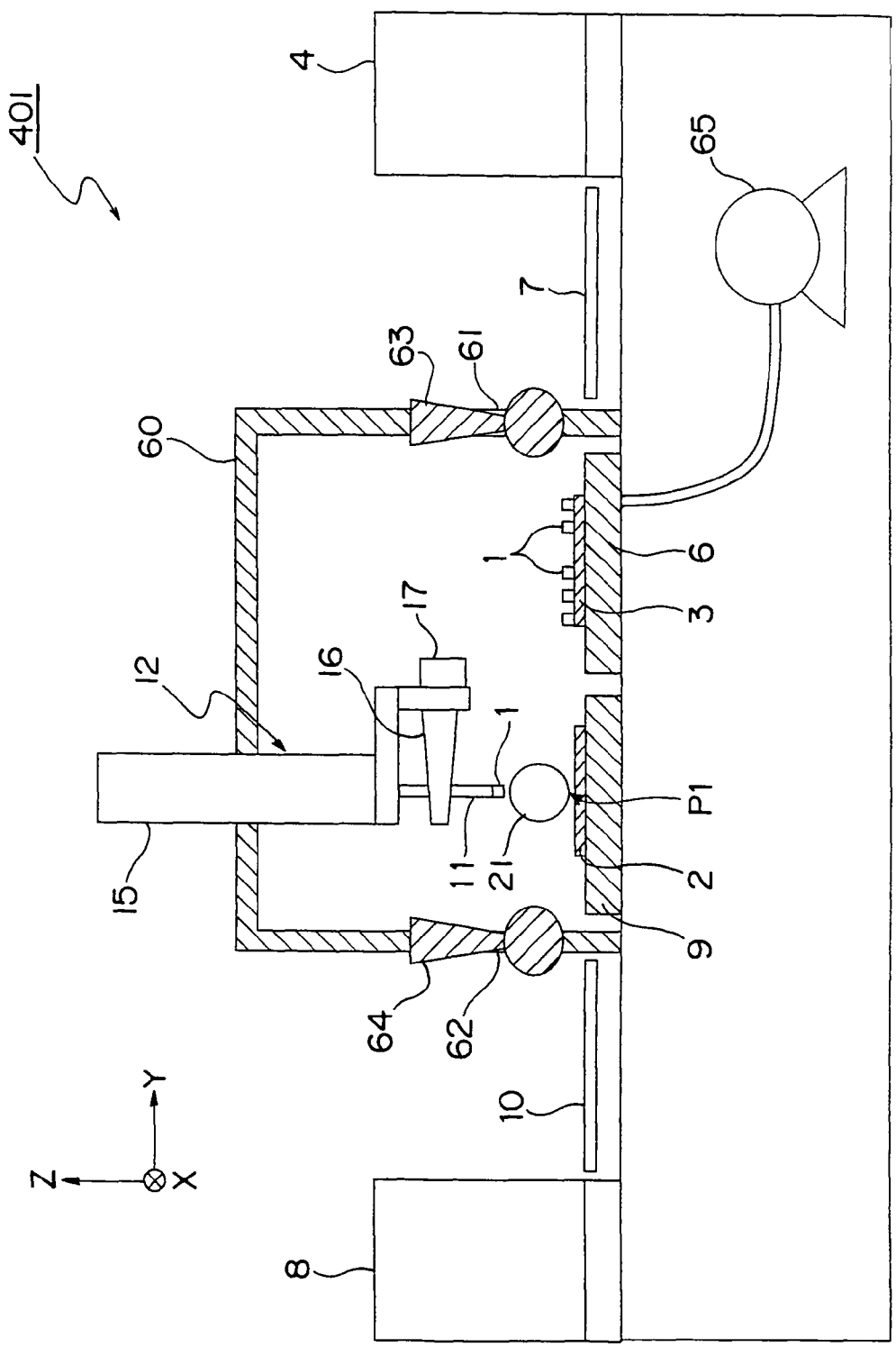
FIG. 18 is a schematic structural view showing a state in which ultraviolet cleaning process is being carried out in a reduced-pressure atmosphere in the joining apparatus of the fourth embodiment.
Figure 19:
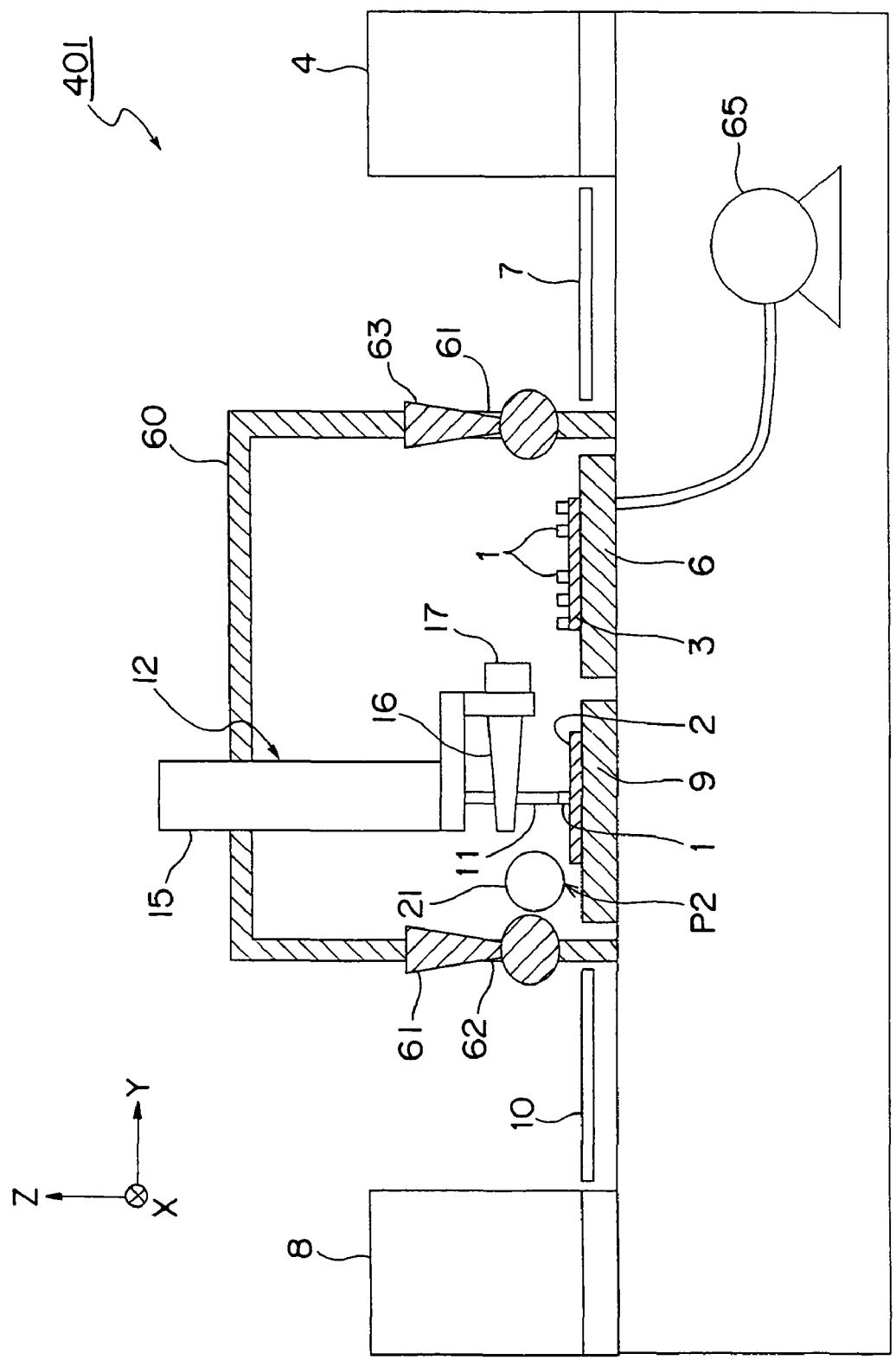
FIG. 19 is a schematic structural view showing a state in which an electronic component is being joined to a circuit board in the reduced-pressure atmosphere in the joining apparatus of the fourth embodiment.

Next, FIGS. 17 to 19 are schematic structural views showing the structure of a joining apparatus 401 according to a fourth embodiment of the invention. The joining apparatus 401 is an apparatus for joining the electronic component 1 to the circuit board 2, as in the joining apparatus 101 of the first embodiment. Although not described below, it is also possible for the joining apparatus 401, as in the modification example of the first embodiment, to execute a joining operation by which the first container member 31 and the second container member are joined together to form an electronic component package.

As shown in FIG. 17, the joining apparatus 401 has a chamber 60 for housing therein such constituent members as the suction nozzle 11, the board stage 9 and the excimer ultraviolet lamp 21, and the chamber 60 has openings 61, 62 for carrying the component tray 3 and the circuit board 2 into and out of the chamber 60. Also, the openings 61, 62 are openable and closable by gates 63, 64, respectively, and the space inside the chamber 60 can be hermetically closed by closing the individual gates 63, 64. Further, a vacuum pump 65 which is an example of the pressure reducing unit and which serves for reducing the pressure of the internal space of the chamber 60 is connected to the chamber 60, allowing the internal space of the chamber 60 to be set to a reduced-pressure environment. The other constituent members are the same as in the joining apparatus 101 of FIG. 1, and designated by the same reference numerals in the following description.

The joining operation of the electronic component 1 to the circuit board 2 by the joining apparatus 401 is almost similar to that of the joining apparatus 101 of the first embodiment, except that the ultraviolet cleaning process for the two metallic portions is performed under a reduced-pressure environment inside the chamber 60.

In the joining of the electronic component 1 to the circuit board 2 by the joining apparatus 401, first, the component tray 3 is carried through the opening 61 into the chamber 60 by the tray conveyance unit 7, while the circuit board 2 is carried through the opening 62 into the chamber 60 by the board conveyance unit 10. After the carriage, their respective gates 63, 64 are closed so that the internal space of the chamber 60 is closed, and evacuation by the vacuum pump 65 is started so that reduction of the internal pressure of the chamber 60 is started. This state is the one shown in FIG. 17.

Next, the electronic component 1 is sucked and extracted from the component tray 3 by the suction nozzle 11, and the circuit board 2 is held by the board stage 9. Thereafter, alignment between the electronic component 1 and the joining position of the circuit board 2 is performed by the unshown head moving unit 13 and board moving unit 14. Along with this, the internal space of the chamber 60 is maintained at a specified reduced-pressure environment.

Thereafter, inside the chamber 60, which has been set to a reduced-pressure environment, as in the first embodiment, the excimer ultraviolet lamp 21 is moved to between the suction nozzle 11 and the board stage 9, where ultraviolet rays are applied to the Au bumps 1b of the electronic component 1 and the board electrodes 2a of the circuit board 2 in the reduced-pressure environment. Thus, the ultraviolet cleaning process for the two metallic portions is achieved. This state is the one shown in FIG. 18.

Upon completion of the ultraviolet cleaning process, the excimer ultraviolet lamp 21 is moved to the withdrawal position P2, and thereafter the suction nozzle 11 is moved down and the Au bumps 1b of the electronic component 1 are pressed against the board electrodes 2a of the circuit board 2. Further, ultrasonic vibrations are imparted to the two metallic portions, by which the two metallic portions are metal joined to each other under the reduced-pressure environment, making the electronic component 1 joined to the circuit board 2. This state is the one shown in FIG. 19.

Upon completion of this metal joining, the suction nozzle 11 is moved up away from the board stage 9, while the processing space of the chamber 60 is supplied with air so as to be returned to the atmospheric pressure. Then, with the openings 61, 62 opened, the circuit board 2, to which the electronic component 1 is joined, is carried out by the unshown conveyance unit.

As described above, in the joining apparatus 401, since the ultraviolet cleaning process for the two metallic portions is performed simultaneously by the excimer ultraviolet lamp 21 under the reduced-pressure environment inside the chamber 60, generation of ozone in vicinities of the two metallic portions can be prevented, and moreover attenuation of the ultraviolet rays derived from the excimer ultraviolet lamp 21 due to their absorbance into the air (about 90% being absorbed during a 8 mm propagation in the air) can be prevented. As a result of this, the quality of the cleaning process for the two metallic portions due to the ultraviolet irradiation can be further improved. Also, since there is no need for providing any such expensive, complex structural member as a plasma processing chamber or a plasma generating mechanism, the structure for performing the cleaning process of the two metallic portions can be simplified and the two metallic portions can be joined to each other by metal joining with strength and high quality. Furthermore, since the joining of the two metallic portions is performed under a reduced-pressure environment, re-adsorption of joining inhibitors to the individual metallic portion surfaces after the ultraviolet cleaning process can be prevented.

Although embodiments of the present invention have been described above, the invention is not limited to those embodiments and various changes and modifications may be made.

For instance, when there is no need for heating the metallic portions (first metallic portion 31a and second metallic portion 32a, as well as Au bumps 1b and board electrodes 2a, etc.) of objects by the excimer ultraviolet lamp 21, a cooling unit for cooling the excimer ultraviolet lamp 21 may be provided. Also, ultraviolet irradiation to the metallic portions of objects is done preferably by the excimer ultraviolet lamp 21 that emits ultraviolet rays of short wavelengths from the point of view of efficiency improvement of the cleaning process. However, the ultraviolet irradiation may be done by other ultraviolet-ray generating sources such as other ultraviolet lamps and ultraviolet irradiation devices.

Also, in the joining apparatuses 301, 401 according to the third and fourth embodiments, the individual metallic portions may be heated by a heater to accelerate the metal joining, as in the second embodiment.

As described above, the joining apparatus according to the present invention is suitable particularly for manufacturing electronic component packages that house therein electronic components of types unsuitable for irradiation of high energy as well as for mounting LED chips or the like. However, the joining apparatus may also be applied to the formation of electronic component packages that house therein other various types of electronic components, e.g. semiconductor bare chip components or SAW (Surface Acoustic Wave) filters or the like, as well as to the mounting of these electronic components.

Furthermore, the joining apparatus may be utilized for metal joining between various objects in addition to the joining between the first container member 31 and the second container member 32 or the mounting of the electronic component 1 to the circuit board 2. In addition, the ultraviolet cleaning process for objects is done preferably in an air atmosphere from the viewpoint of device simplification when the level of the demand for the processing quality is relatively low. When high-quality ultraviolet cleaning process is demanded, the ultraviolet cleaning process is performed preferably in a low oxygen atmosphere or reduced-pressure environment.

Fifth Embodiment

Figure 20:
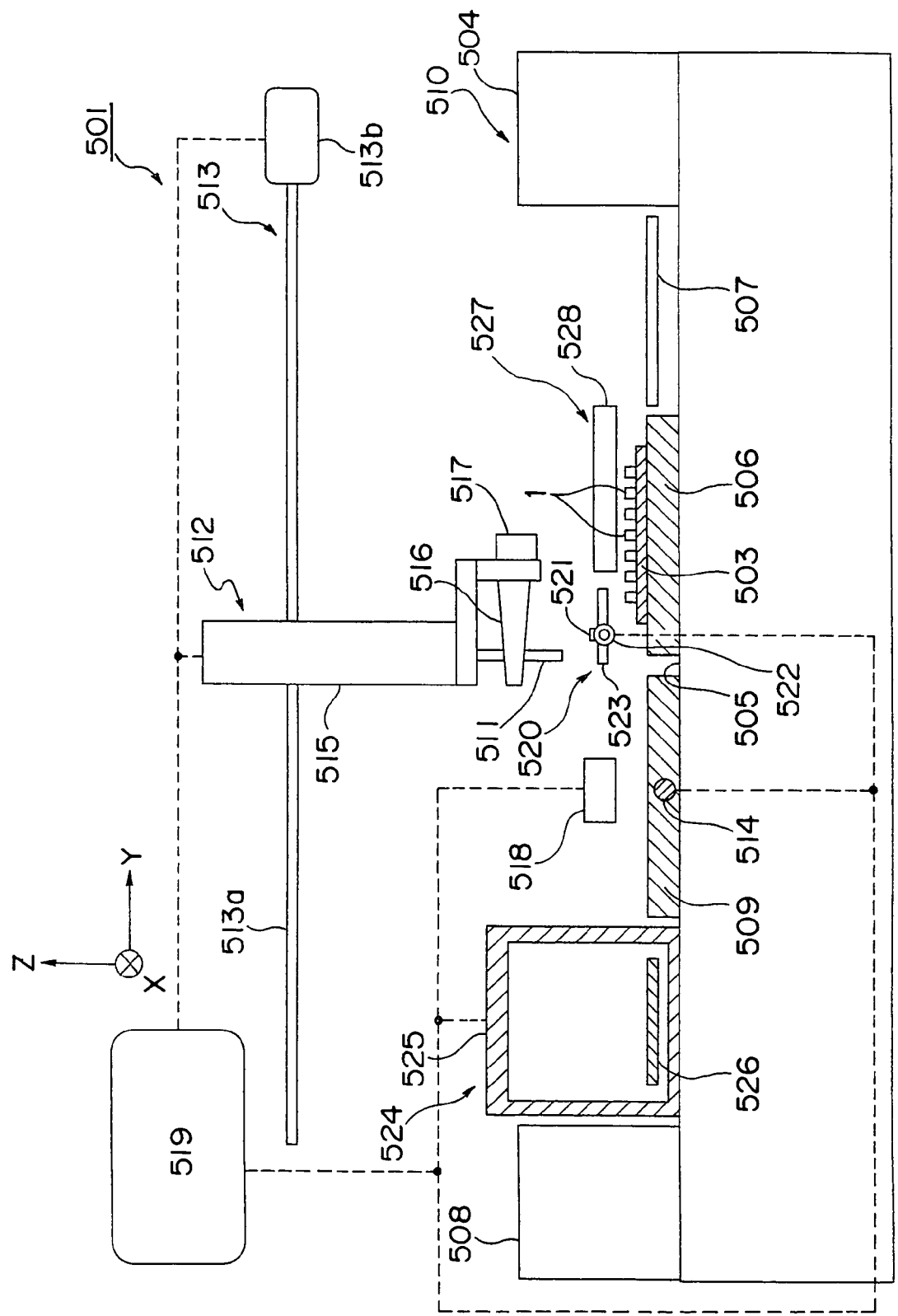
FIG. 20 is a schematic structural view showing the structure of a joining apparatus according to a fifth embodiment of the present invention.

FIG. 20 shows a schematic structural view of a joining apparatus 501 which is an example of a joining apparatus according to a fifth embodiment of the present invention. The joining apparatus 501 is an apparatus for joining an electronic component 1, which is an example of the first object, to a specified position in a circuit board 2, which is an example of the second object to fulfill the mounting of the electronic component 1 to the circuit board 2. It is noted that the joining apparatus 501 can also be said to be a component mounting device 501.

As shown in FIG. 20, the joining apparatus 501 includes a component magazine 504 for housing therein a plurality of component trays 503 on each of which a plurality of electronic components 1 are feedably set, and a tray conveyance unit 507 which is an example of a component conveyance unit for conveying a component tray 503, which has selectively been taken out from the component magazine 504, so as to be set on a component feed stage 506 placed on a apparatus frame 505. The joining apparatus 501 also includes a board magazine 508 for housing therein a plurality of circuit boards 2 to which each electronic component 1 is joined and mounted, a board stage 509 which releasably holds the circuit board 2 and which is subjected to joining operation of the electronic component 1 to the circuit board 2 in the holding state, and an unshown board conveyance unit for conveying the circuit boards 2 housed in the board magazine 508 so that each of the circuit boards 2 can be placed on the board stage 509. In addition, in the joining apparatus 501 of the fifth embodiment, the component magazine 504, the tray conveyance unit 507 and the component feed stage 506 constitute a component feed unit 510 for feeding the electronic components 1 for their joining.

Further, as shown in FIG. 20, the joining apparatus 501 has a joining head 12 which includes a suction nozzle 511 for releasably sucking and holding the electronic component 1 and which performs joining operation of the electronic component 1 to the circuit board 2, a head moving unit 513 for moving the joining head 512 forward and backward in a Y-axis direction in the figure, which is a direction extending roughly along the surface of the circuit board 2, and a board moving unit 514 for moving the board stage 509 forward and backward in an X-axis direction, which is a direction roughly along the surface and perpendicular to the Y-axis direction. It is noted that the head moving unit 513 and the board moving unit 514 are made up by using a ball screw shaft mechanism or the like. For example, the head moving unit 513 includes a head moving guide 513a which is screwed with an unshown nut portion fixed to the joining head 512 and which guides the move of the joining head 512 in the Y-axis direction, and a motor 513b which rotationally drives the head moving guide 513a about its axis to thereby drive the move of the nut portion. The suction nozzle 511, having at its central portion a suction path for use of vacuum suction, performs vacuum suction from a suction port formed at its tip end so that suction holding of the electronic component 1 can be fulfilled, and stopping the suction allows the suction holding to be released.

The joining head 512 includes an up/down unit 515 for moving up and down the suction nozzle 511 along a Z-axis direction in the figure, and an ultrasonic vibrator 517 which is an oscillation unit for imparting ultrasonic vibrations to the suction nozzle 511 via a horn 516.

Also, the joining apparatus 501 includes an inversion unit 520 which has a feed collet 521 for sucking and holding the electronic component 1 housed in the component tray 503 set on the component feed stage 506 from the (+Z)-axis side, a rotation unit 522 for rotating the feed collet 521 by 180 degrees to invert the sucked and held electronic component 1, and a collet up/down unit 523 for moving (elevating and lowering) the feed collet 521 in the Z-axis direction. This inversion unit 520 has functions for sucking and holding and extracting the electronic component 1 set and housed on the component tray 503, and inverting the electronic component 1 up down and delivering the electronic component 1 to the suction nozzle 511 of the joining head 512, as the electronic component 1 is in the inverted posture.

Further, as shown in FIG. 20, the joining apparatus 501 includes a recognition camera 518 for recognizing a position (joining position), where the electronic component 1 is to be joined, in the circuit board 2 held by the board stage 509. The recognition camera 518 can be moved to below the suction nozzle 511 by an unshown moving unit so as to be capable of recognizing the sucking-and-holding posture of the electronic component 1 by capturing an image of the electronic component 1 sucked and held by the suction nozzle 511. When the capture of the image is not done, the recognition camera 518 is moved to a position withdrawn from above the circuit board 2 by the moving unit.

It is noted that the joining apparatus 501 handles, for example, the electronic component 1 and the circuit board 2 having the structure shown in FIGS. 2 and 3.

Further, in the joining apparatus 501, as shown in FIG. 20, a plasma processing apparatus 524 (an example of an energy irradiation unit) for applying plasma, which is a kind of energy waves, to the individual board electrodes 2a of the circuit board 2 to perform cleaning process of the surfaces of the individual board electrodes 2a is provided on the apparatus frame 505 and between the board magazine 508 and the board stage 509. The plasma processing apparatus 524 includes a plasma processing chamber 525 which is closable and which has in its inside a plasma processing space for placement of the circuit board 2 to be targeted for plasma processing, and a board carry-in/out guide unit 526 which is placed within the plasma processing chamber 525 and which serves for carrying the circuit board 2 into the plasma processing chamber 525 and for carrying out the plasma-processed circuit board 2 to the board stage 509. The plasma processing apparatus 524, although not shown in FIG. 20, includes necessary equipment for plasma generation in the plasma processing space, and has an openable/closable opening portion for fulfilling the carriage of the circuit board 2 into and out of the plasma processing chamber 525.

In the plasma processing apparatus 524 as shown above, joining inhibitors adsorbed on the surfaces of the individual board electrodes 2a can be removed by applying plasma to the circuit board 2 which is set within the plasma processing space to let the physical energy of the plasma collide with the surfaces of the board electrodes 2a. Such removal of joining inhibitors by plasma exposure is referred to as plasma cleaning process. Also, such plasma processing is carried out in a state that the plasma processing chamber 525 is set to a reduced-pressure atmosphere. In addition, in the joining apparatus 501, the circuit board 2 is handled as its one face having the individual board electrodes 2a formed thereon is positioned as the upper face as viewed in the figure.

Also, as shown in FIG. 20, the joining apparatus 501 includes an ultraviolet irradiation unit 527 for applying ultraviolet ray to the Au bumps 1b of the individual electronic components 1 housed and placed on the component tray 503 to remove joining inhibitors adsorbed on the surfaces of the individual Au bumps 1b. The ultraviolet irradiation unit 527 includes an excimer ultraviolet lamp 528 as an ultraviolet-ray generating source for applying ultraviolet rays having wavelengths within a range of 160-180 nm, e.g. a wavelength of 172 nm, as the aforementioned ultraviolet rays. The excimer ultraviolet lamp 528 is so positioned as to extend in the conveyance direction of the component tray 503 (Y-axis direction) by the tray conveyance unit 507 in the component feed unit 510. In addition, the excimer ultraviolet lamp 528 has, for example, an elongated rod-like shape having an about 20 mm-diameter cylindrical cross section, and is positioned above the individual electronic components 1 with a spacing of about 1 mm from the top faces of the electronic components 1 housed and placed on the component tray 503 set on the tray conveyance unit 507 or the component feed stage 506.

With the ultraviolet irradiation unit 527 having the structure described above, in the component feed unit 510, ultraviolet rays emitted from the excimer ultraviolet lamp 528 are applied to the Au bumps 1b of the individual electronic components 1 conveyed by the component tray 503 so that joining inhibitors adsorbed on the surfaces of the individual Au bumps 1b are removed, thus allowing the process of making clean surfaces exposure from the surfaces, i.e. ultraviolet cleaning process, to be achieved. Accordingly, in the state of being placed on the component feed stage 506, the electronic components 1 set on the component tray 503 can be subjected to the ultraviolet cleaning process. For execution of such ultraviolet cleaning process, in the component tray 503, the electronic components 1 are housed and placed as their one-side surface on which the Au bumps 1b are formed (i.e., their face on one side which confronts the circuit board 2 and which is joined thereto; hereinafter, referred to as 'joining surface') is positioned at their upper face in the figure.

Also, as shown in FIG. 20, the joining apparatus 501 includes a control unit 519 for performing operation control of individual structural members integrally in association with one another. The control unit 519, in which data have previously been inputted, such as data of the electronic components 1 to be sucked and held by the suction nozzle 511, data of individual joining positions in the circuit board 2, and data of ultraviolet irradiation time for the electronic components 1 and the circuit boards 2 or the time required for subsequent joining process, is enabled to perform the integral control for the joining process based on those data.

Next, concrete procedures of the joining process for performing the joining of the electronic component 1 to a specified joining position in the circuit board 2 by using the joining apparatus 501 having the above-described structure is explained below with reference to the flowchart shown in FIG. 21 and the schematic explanatory views of the joining apparatus 501 shown in FIGS. 22 to 27. It is noted that operations described below are carried out in association with one another under the integral control by the control unit 519 included in the joining apparatus 501.

Figure 21:
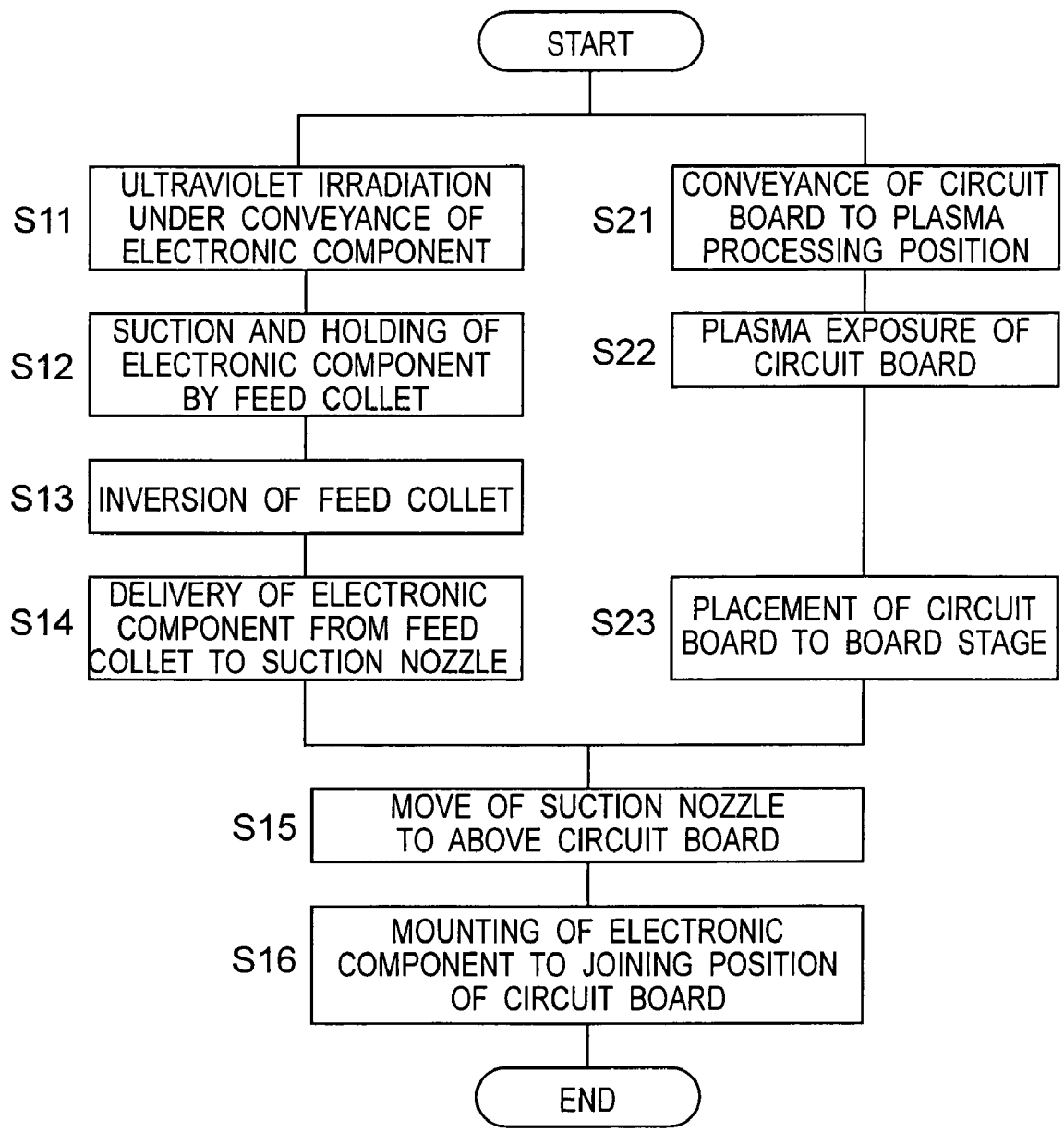
FIG. 21 is a flowchart showing procedures of a joining method according to the fifth embodiment.
Figure 22:
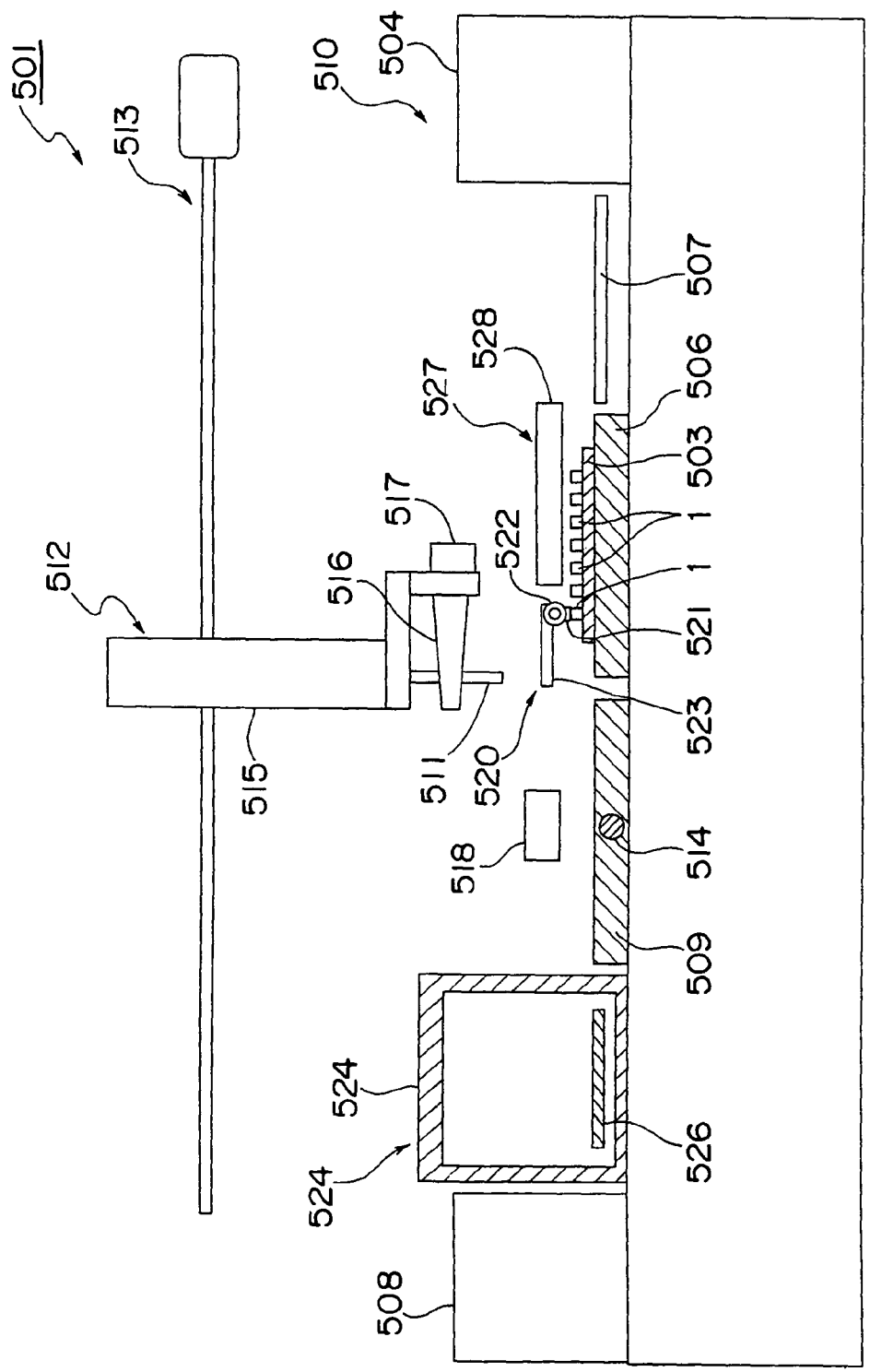
FIG. 22 is a schematic explanatory view showing a state in which an electronic component is being held and extracted by an inverting device in the joining apparatus of FIG. 20.
Figure 23:
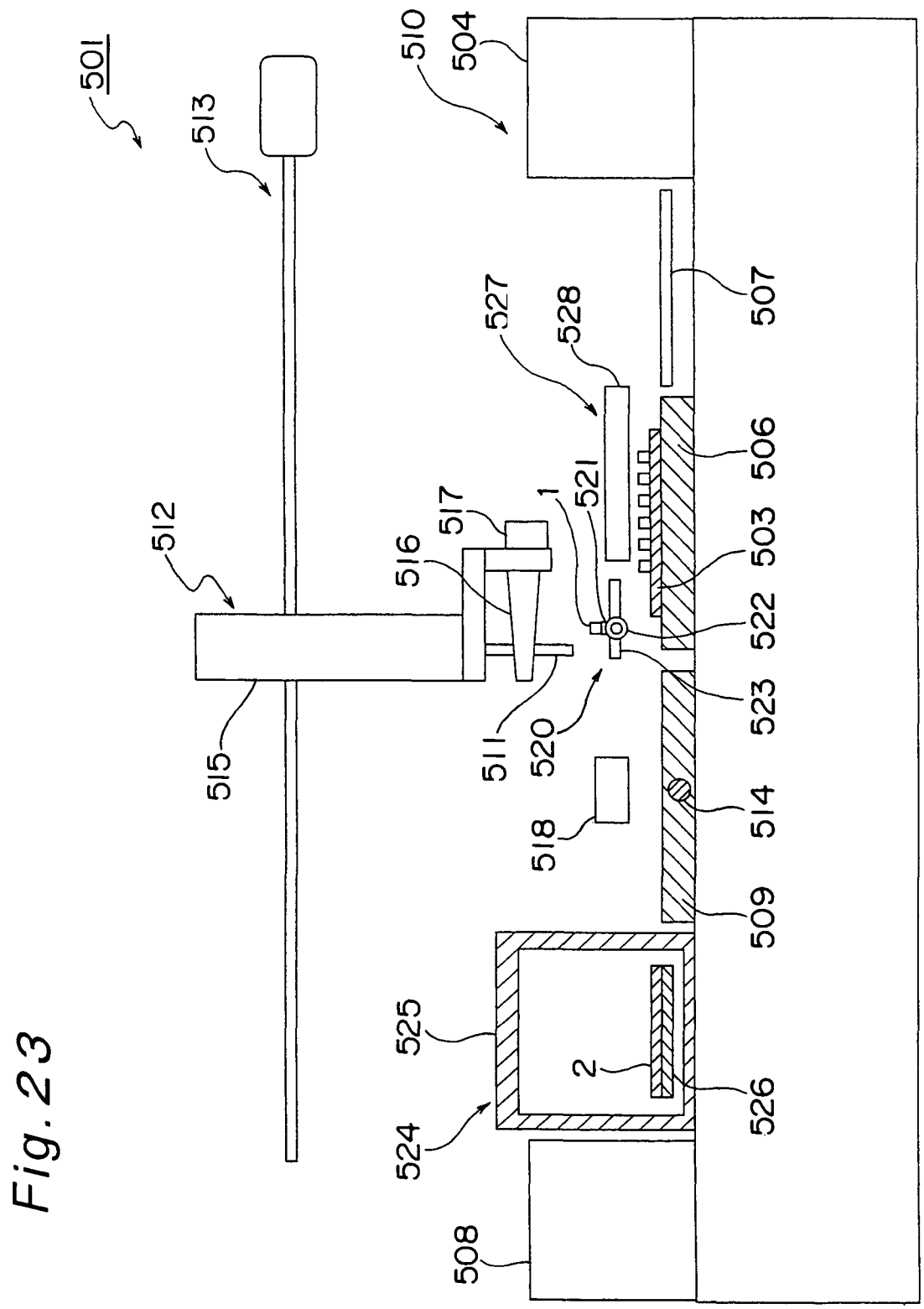
FIG. 23 is a schematic explanatory view showing a state in which the electronic component has been inverted by the inverting device in the joining apparatus of FIG. 20.

First, at step S11 of the flowchart of FIG. 21, in the joining apparatus 501, a specified component tray 503 is extracted from the component magazine 504, and conveyed by the tray conveyance unit 507 so as to be placed above the component feed stage 506. In addition to this, during the process of the conveyance, when the electronic components 1 housed and placed on the component tray 503 pass through below the excimer ultraviolet lamp 528 of the ultraviolet irradiation unit 527, ultraviolet rays of an about 172 nm wavelength emitted from the excimer ultraviolet lamp 528 are applied to the joining surfaces of the individual electronic components 1, i.e., to the surfaces of the individual Au bumps 1b.

As a result of this ultraviolet irradiation, undesired substances such as organic substances deposited on the surfaces of the Au bumps 1b (metallic portions) of the electronic components 1 are removed by ultraviolet energy, and moreover reforming such as excitation of the metallic portion surfaces and removal of adsorbent substances in vicinities of surface electrodes is performed, thus the Au bumps 1b of the electronic components 1 being subjected to the ultraviolet cleaning process. The adsorbent substances of the surfaces of the metallic portions are, for example, such joining inhibitors (undesired substances that inhibit metal joining) as carbon (C) adsorbed to thicknesses of about 7 to 10 nm from the surfaces. The interatomic binding is disconnected by the energy of ultraviolet ray, or the adsorbent substances are oxidized into carbon monoxide, carbon dioxide or the like by oxygen radicals generated by the energy of ultraviolet ray, thus the adsorbent substances being gasified and removed.

In addition, from the standpoint of suppressing attenuation of ultraviolet rays for quality improvement of the cleaning process, the distance between the excimer ultraviolet lamp 528 and the metallic portion surfaces in the ultraviolet cleaning process is preferably not more than 1 mm. With a distance as much as about 50 mm as an example, ultraviolet energy applied to the metallic portion surfaces would be nearly completely attenuated, making it impossible to perform the ultraviolet cleaning process. Also, since the ultraviolet cleaning process is executed by irradiation of ultraviolet rays of a specified intensity for a specified time duration, i.e., by impartment of a specified quantity of energy to the metallic portion surfaces, the speed of conveyance by the tray conveyance unit 507 is preferably determined by taking into consideration the length of the excimer ultraviolet lamp 528, the intensity of applied ultraviolet ray, and the like. In addition, the state that the component tray 503, on which the electronic components 1 subjected to ultraviolet cleaning process are housed and placed, is placed on the component feed stage 506 as shown above is the state of the joining apparatus 501 shown in FIG. 20.

Next, at step S12, the feed collet 521 sucking and holding the electronic component 1 is inverted 180° by the rotation unit 522, moved to above the component tray 503, and further moved down by the collet up/down unit 523, where the joining surface of the electronic component 1 is sucked and held by the feed collet 521. Such a state in the joining apparatus 501 is the one shown in FIG. 22.

Thereafter, the feed collet 521, which is sucking and holding the electronic component 1, is moved up by the collet up/down unit 523, and inverted by the rotation unit 522 (step S13). As a result, the joining surface of the electronic component 1 sucked and held by the feed collet 521 is inverted up down so as to be positioned on the lower face side in the figure. Such a state in the joining apparatus 501 is the one shown in FIG. 23.

Next, alignment between the inverted feed collet 521 and the suction nozzle 511 in the joining head 512 is performed by the move of the joining head 512 performed by the head moving unit 513. Upon completion of the alignment, the suction nozzle 511 is moved down slightly by the up/down unit 515 of the joining head 512, where the electronic component 1 sucked and held by the feed collet 521 is sucked and held also by the suction nozzle 511. Then, the sucking and holding by the feed collet 521 is released, by which the electronic component 1 is delivered to the suction nozzle 511 (step S14). Thereafter, the suction nozzle 511 sucking and holding the electronic component 1 is slightly moved up by the up/down unit 515. This state in the joining apparatus 501 is the one shown in FIG. 24.

Figure 24:
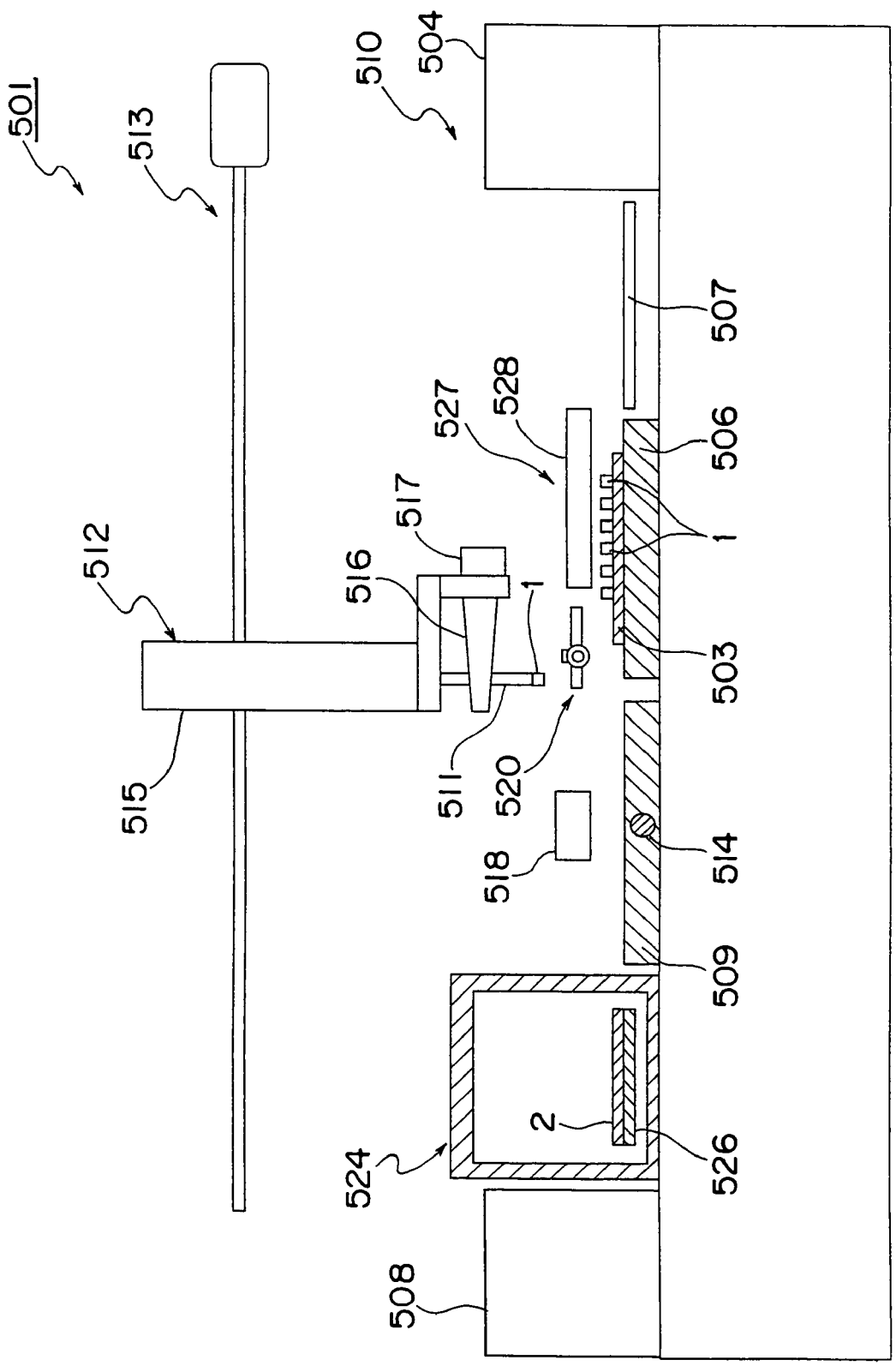
FIG. 24 is a schematic explanatory view showing a state in which the electronic component is delivered from the inverting device to the suction nozzle in the joining apparatus of FIG. 20 and moreover plasma cleaning process is being performed on the circuit board by the plasma processing apparatus.
Figure 25:
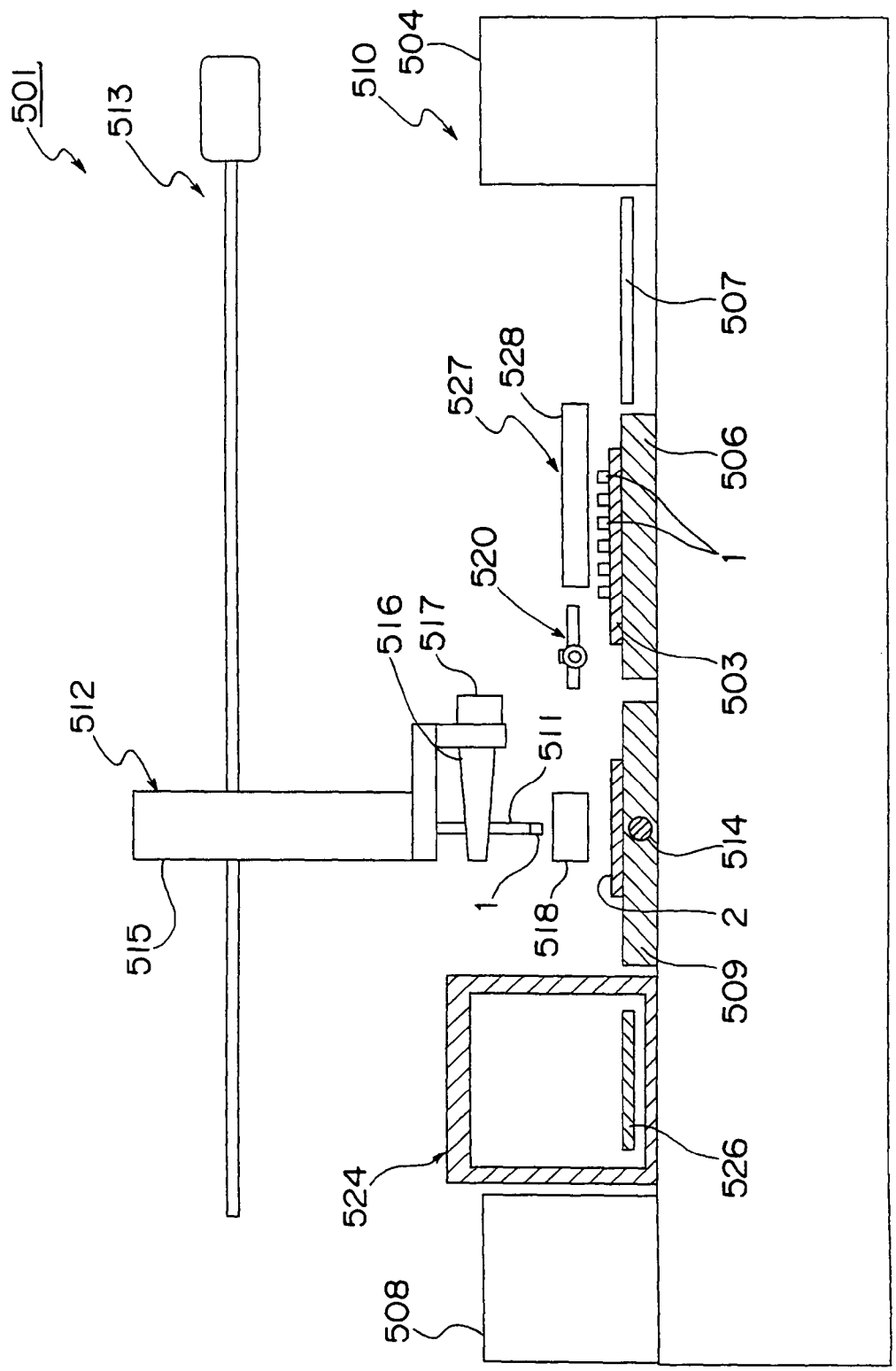
FIG. 25 is a schematic explanatory view showing a state in which positioning of the electronic component and the circuit board is being performed in the joining apparatus of FIG. 20.

Meanwhile, as shown in FIG. 24, in the plasma processing apparatus 524, one circuit board 2 is extracted from the board magazine 508 by the board carry-in/out guide unit 526, and placed within the plasma processing chamber 525 through the unshown opening portion (step S21). Then, the opening portion is closed so that the plasma processing chamber 525 is hermetically closed, while the internal space of the plasma processing chamber 525 is started to be reduced in pressure. Such pressure reduction can be fulfilled by, for example, an unshown vacuum pump or the like. A position where the circuit board 2 is to be located for plasma processing within the plasma processing chamber 525 is referred to as plasma processing position. Such a state is shown in the schematic explanatory view of FIG. 24.

Thereafter, in the plasma processing apparatus 524, plasma cleaning process of the circuit board 2 is started (step S22). More specifically, in the plasma processing chamber 525, the pressure is reduced to about 1 Pa, and processing gas such as argon (Ar) gas is supplied so that the processing space is put into a specified reduced-pressure atmosphere. In this case, the pressure of the processing space is set to about 10 Pa. Subsequently, with a radio-frequency voltage applied to the processing gas within the processing space, plasma is generated, so that the circuit board 2 housed in the processing space is exposed to the plasma. As a result of this plasma exposure, joining inhibitors such as water and organic substances deposited on the surfaces of the individual board electrodes 2a of the circuit board 2 are removed, and moreover reforming such as excitation of the board electrode surfaces and removal of adsorbent substances in vicinities of surface electrodes (e.g., joining inhibitors such as carbon (C) or oxygen (O) adsorbed to thicknesses of about 10 nm from the surfaces) is performed with energy stronger than that of ultraviolet cleaning, thus the board electrodes 2a of the circuit board 2 being subjected to the so-called plasma cleaning process.

Thereafter, upon completion of the plasma cleaning process, the processing space of the plasma processing chamber 525 is opened to the atmospheric pressure, the unshown opening portion being opened, and the circuit board 2 is carried out through the opening portion by the board carry-in/out guide unit 526 so as to be placed on the board stage 509. The circuit board 2 placed in this way is held by the board stage 509 (step S23).

Meanwhile, after the electronic component 1 is delivered to the suction nozzle 511, the joining head 512 is moved to above the board stage 509 by the head moving unit 513 (step S15). Above the board stage 509, an image of the electronic component 1 is captured by the preparatorily standing-by recognition camera 518, by which the sucking and holding posture of the electronic component 1 is recognized. Based on a result of this recognition, the sucking and holding posture of the electronic component by the suction nozzle 511 is corrected.

Along with, or subsequent to, this, the joining head 512 is moved in the Y-axis direction in the figure by the head moving unit 513, and the board stage is moved in the X-axis direction by the board moving unit 514, by which alignment between the electronic component 1 and the joining position (or mounting/placement position) in the circuit board 2 is performed. This state in the joining apparatus 501 is the one shown in FIG. 25.

Figure 26:
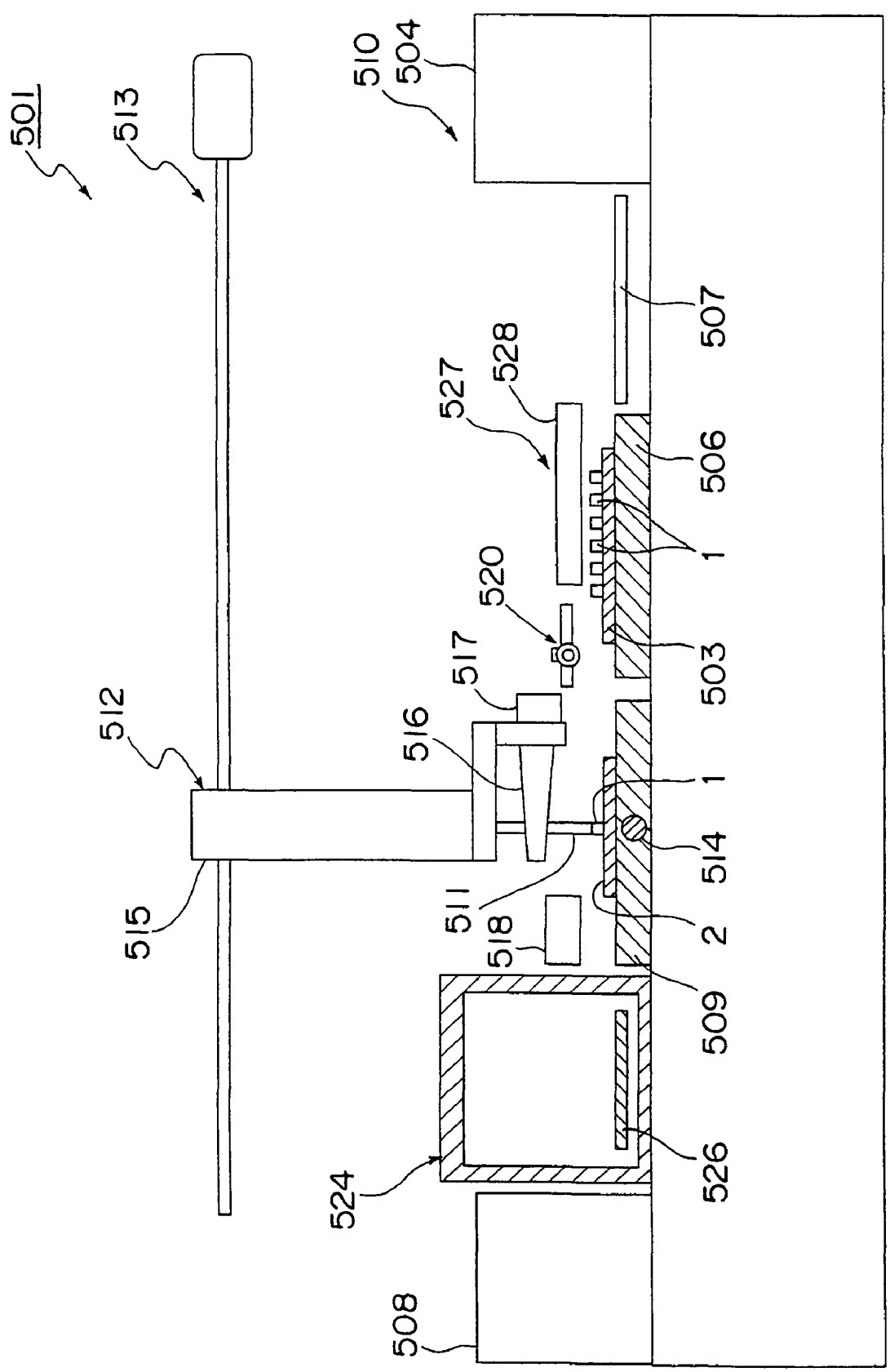
FIG. 26 is a schematic explanatory view showing a state in which metal joining of the electronic component to the circuit board is being performed in the joining apparatus of FIG. 20.

Thereafter, as shown in FIG. 26, the recognition camera 518 is moved to a position withdrawn from above the circuit board 2, the suction nozzle 511 is moved down by the up/down unit 515 of the joining head 512, and the electronic component 1 is pressed against the circuit board in the joining position of the circuit board 2. Subsequently, ultrasonic vibrations are imparted via the horn 516 and the suction nozzle 511 to the electronic component 1 and its Au bumps $1b$, by which the Au bumps $1b$ of the electronic component 1 and the board electrodes $2a$ of the circuit board 2 are metal joined to each other in the air atmosphere. As a result of this, the electronic component 1 is electrically connected (i.e., mounted) to the circuit board 2.

In this joining apparatus 501, since the Au bumps $1b$ (metallic portions) of the electronic component 1 are subjected to an ultraviolet cleaning process and the board electrodes $2a$ (metallic portions) of the circuit board 2 are subjected to plasma cleaning process, the joining between the two metallic portion surfaces is performed by joining between clean surfaces exposed through the removal of joining inhibitors on the metallic portion surfaces. Accordingly, there occurs a strong binding due to interatomic force of metal atoms between the two metallic portions, so that the electronic component 1 is strongly joined to the circuit board 2.

Figure 27:
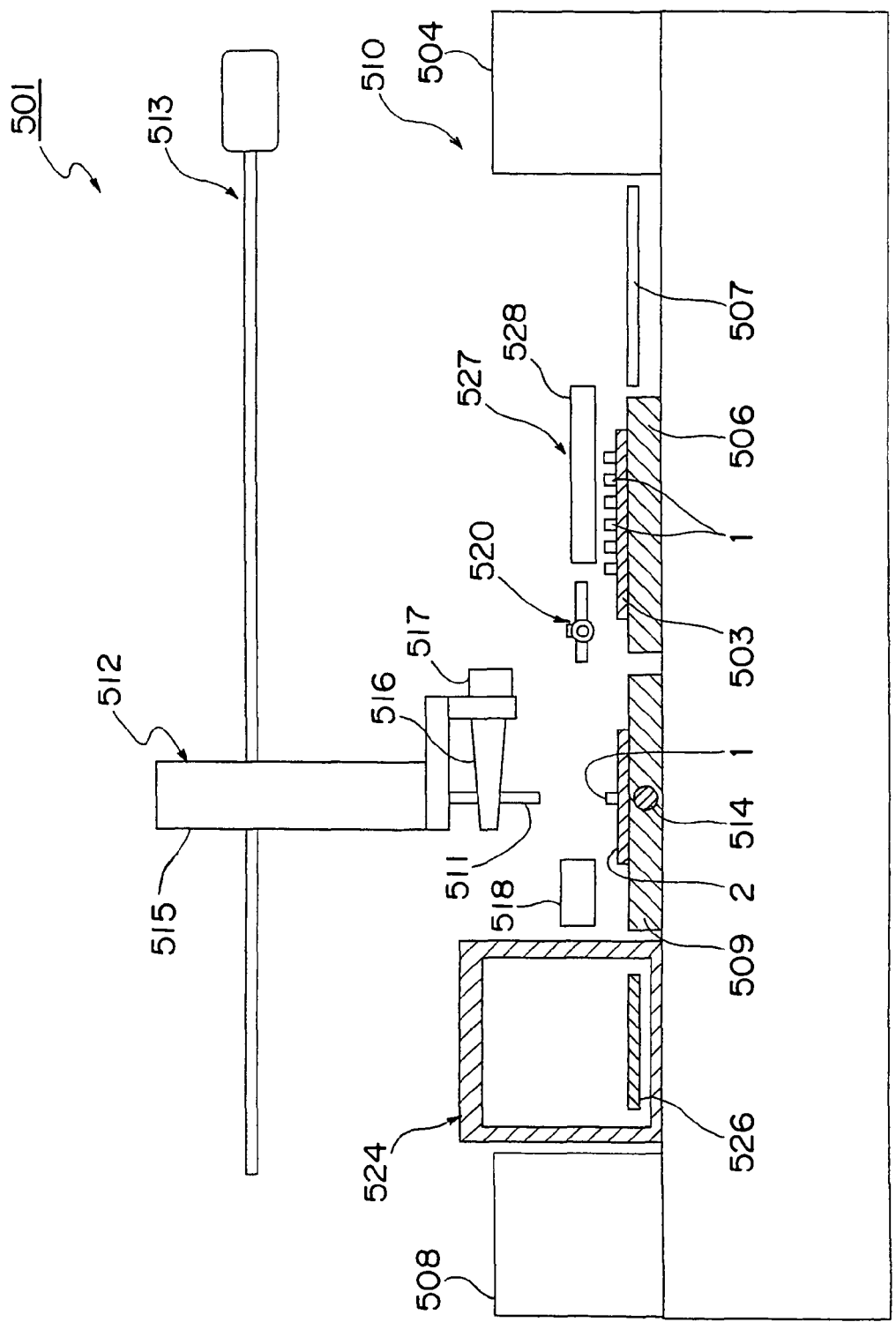
FIG. 27 is a schematic explanatory view showing a state in which the joining of the electronic component to the circuit board has been completed in the joining apparatus of FIG. 20.

Thereafter, as shown in FIG. 27, sucking and holding of the electronic component 1 by the suction nozzle 511 is released, and the suction nozzle 511 is moved up by the up/down unit 515 of the joining head 512, being separated from the electronic component 1 joined to the circuit board 2. In addition, in a case where another electronic component 1 is joined to the circuit board 2, the individual operations of the foregoing steps S12 to S16 are performed in succession, by which the electronic component 1 is joined to another joining position in the circuit board 2. Thereafter, upon completion of the joining of all the electronic components 1 to the circuit board 2, the holding of the circuit board 2 by the board stage 9 is released, and the circuit board 2 with the electronic components 1 joined thereto is carried out from on the board stage 509 by an unshown conveyance unit or the like. It is noted that, in this fifth embodiment, the ultrasonic vibrator 517, the horn 516 and the up/down unit 515 constitute a metal joining unit which performs the metal joining of the two metallic portions.

The joining method in the joining apparatus 501 of this fifth embodiment has been described on a structure where with the up/down unit 515 included in the joining head 512, the suction nozzle 511 is moved up or down by the up/down unit 515 so that the suction nozzle 511 becomes relatively closer to or farther from the board stage 509. However, the fifth embodiment is not limited only to such a structure. Instead of such a case, the case may be that, for example, the board stage 509 is moved up or down.

Also, it has been described above that the ultrasonic vibrator 517 is provided on the joining head 512. However, without being limited to such a structure, it is allowed to adopt a structure, for example, that with the ultrasonic vibrator provided on the board stage 509, ultrasonic vibrations are imparted via the board stage 509 to the board electrodes $2a$ of the circuit board 2.

Figure 28:
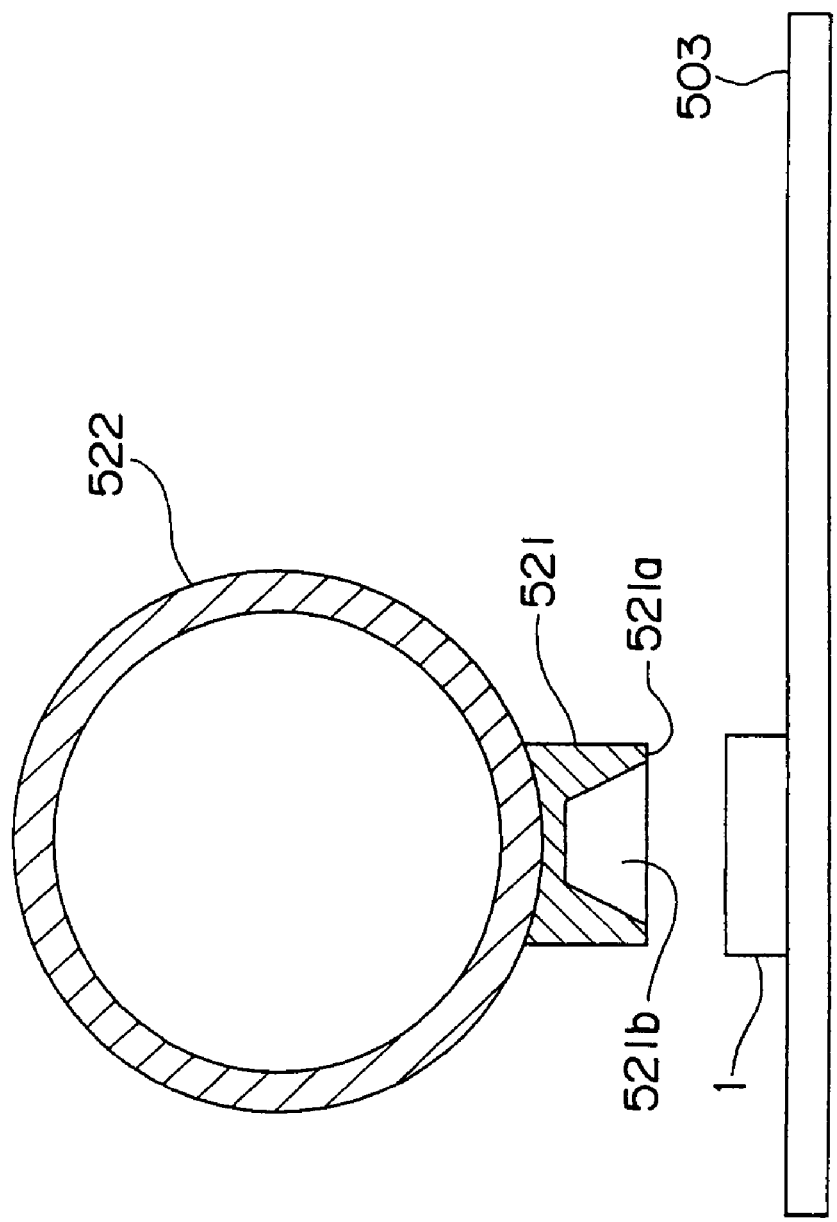
FIG. 28 is a partly enlarged schematic view of the inverting device in the joining apparatus of FIG. 20.

Also, it has been described above, as to the extraction operation of the electronic components 1, that are subjected to ultraviolet cleaning process after joining surfaces of the electronic components 1 housed and placed on the component tray 503, the joining surface is sucked and held by the feed collet 521 of the inversion unit 520. However, the feed collet 521 may also be structured as shown in the schematic structural view of FIG. 28 for the purpose of preventing the cleaned joining surfaces from being contaminated during the suction and holding of the electronic component 1 by the feed collet 521. More specifically, it is possible to adopt a structure that, as shown in FIG. 28, a recessed portion $521b$ is formed at a suction end portion $521a$ of the feed collet 521 for the electronic component 1 so that the contact area between the suction end portion $521a$ and the joining surface of the electronic component 1 is reduced to a necessary minimum.

As described above, in the joining apparatus 501, after the cleaning process for the Au bumps $1b$ of the electronic component 1 is performed by ultraviolet irradiation, ultrasonic waves are imparted to the Au bumps $1b$ of the electronic component 1 which are in contact with the board electrodes $2a$ of the circuit board 2, by which the electronic component 1 is mounted to the circuit board 2. Therefore, even if the electronic component 1 is of a type unsuitable for irradiation of high energy such as plasma cleaning process (i.e., a type that may be damaged by the irradiation of high energy), it is made possible to perform the cleaning of the surfaces of the Au bumps $1b$, so that the electronic component 1 can be mounted strongly by metal joining. In particular, the joining apparatus 501 is suitable for the mounting by metal joining of semiconductor light-emitting devices such as bare chips of light-emitting diodes (so-called LED optical-axis chips) which are so low in withstand voltage that they may be damaged by plasma exposure or the like.

Further, since the ultraviolet cleaning process for the Au bumps $1b$ of the electronic component 1 is carried out in an air atmosphere, the structure of the joining apparatus 501 can be further simplified by omitting the chamber or other structural components for performing the cleaning process of the electronic component 1.

Also, since the excimer ultraviolet lamp 528 is used as the ultraviolet-ray generating source in the joining apparatus 501, ultraviolet rays having wavelengths much shorter than those of the lamp 528 (i.e., ultraviolet rays of higher energy) can be emitted. Thus, generation of ozone ($O_3$) that causes the removal efficiency of adsorbents (joining inhibitors) to lower can be suppressed, and moreover oxygen radicals can efficiently be generated, so that the ultraviolet cleaning process for the metallic portion surfaces can efficiently be fulfilled. Further, since the excimer ultraviolet lamp 528 has an elongated rod-like shape extending along the conveyance direction of the component tray 503 and is positioned so as to be close to the under-conveyance electronic component 1, the electronic component 1 can be irradiated with ultraviolet rays efficiently while being conveyed. As a result, the electronic component 1 immediately after the completion of the ultraviolet cleaning process (preferably, within 10 seconds after cleaning process) can be joined one after another, so that re-adsorption of joining inhibitors to the metallic portion surfaces can be prevented in the mounting by metal joining in the air atmosphere, make it possible to mount the electronic component 1 securely and to reduce the cycle time by the mounting of the electronic components 1 with high efficiency. In particular, since the ultraviolet irradiation is performed in the conveyance process of the electronic components 1, it becomes practicable to perform both ultraviolet cleaning process and the conveyance of electronic components in parallel, largely contributing to the fulfillment of efficient joining operation.

Further, in the joining apparatus 501, for circuit boards 2 which are, in their characteristics, unlikely to be damaged by impartment of relatively high energy as compared with the electronic components 1, secure cleaning can be fulfilled by performing the plasma cleaning process by the plasma processing apparatus 524.

Furthermore, in the joining apparatus 501, since the joinability of the metallic portions of the electronic components 1 and the circuit boards 2 is improved as compared with ordinary ultrasonic joining in which a cleaning process by ultraviolet rays or plasma is not performed, ultrasonic vibrations (ultrasonic energy) to be imparted to the suction nozzle 511 can be reduced. As a result, the frequency of maintenance of the suction nozzle 511 can be reduced.

Sixth Embodiment

Figure 29:
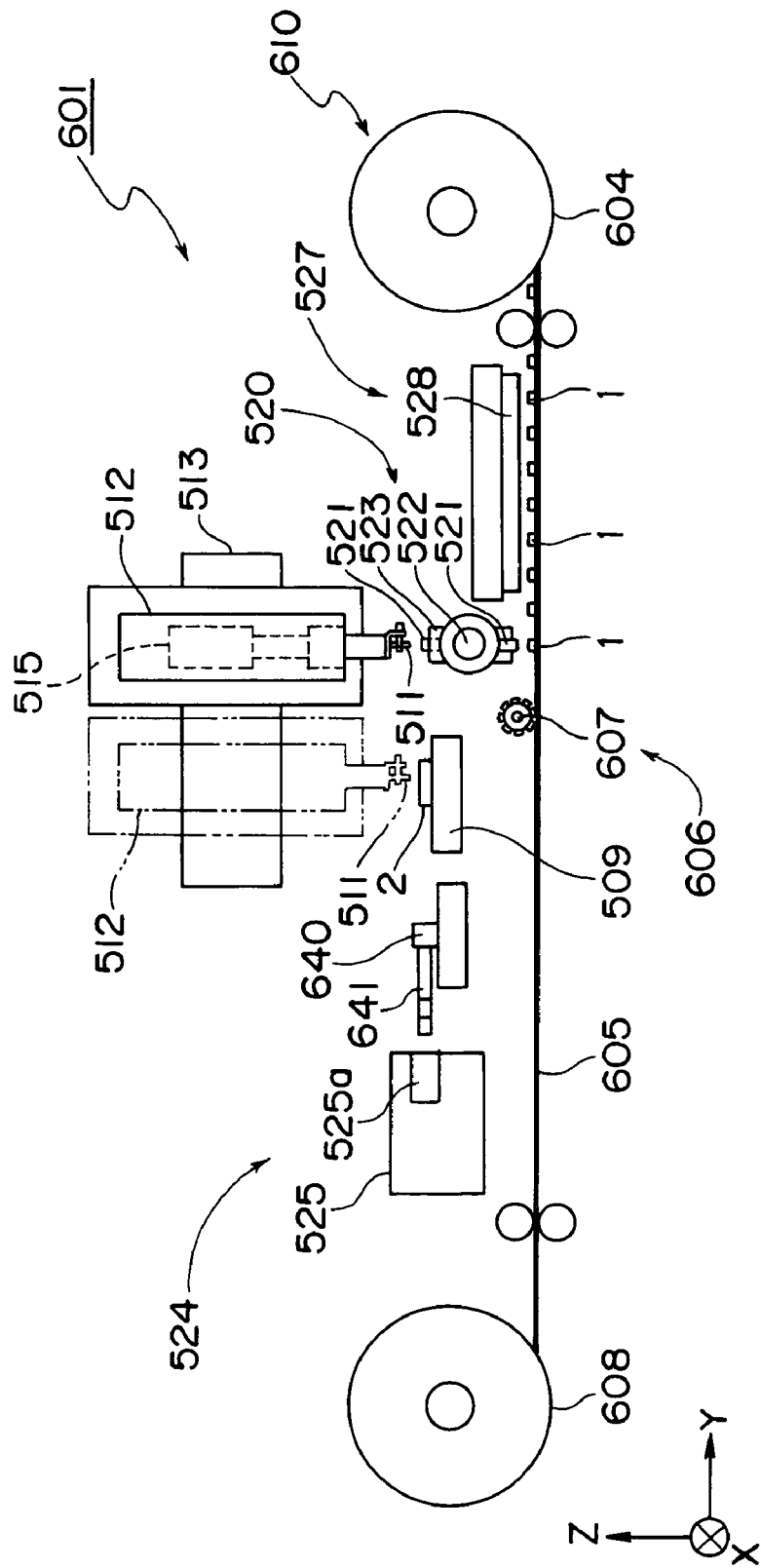
FIG. 29 is a schematic structural view showing the structure of a joining apparatus according to a sixth embodiment of the invention.

The present invention is not limited to the foregoing embodiments, but may be carried out in other various modes. For example, FIG. 29 is a schematic structural view showing the structure of a joining apparatus (component mounting device) 601 which is an example of a joining apparatus according to a sixth embodiment of the invention. As shown in FIG. 29, the joining apparatus 601 is a device for mounting individual fed electronic components 1 successively to joining positions of the circuit board 2, differing from the joining apparatus 501 of the fifth embodiment in the fashion of the feed of the electronic components 1. However, the other constituent members are substantially the same as in the joining apparatus 501 of the fifth embodiment, and therefore like parts having the substantially the same structures are designated by like reference numerals and their description is omitted.

As shown in FIG. 29, the joining apparatus 601 includes a plasma processing apparatus 524 for applying plasma, which is a kind of energy waves, to the circuit board 2 to perform cleaning process, a board conveyance unit 640 for performing carriage of the circuit board 2 into and out of the plasma processing apparatus 524, a board stage 509 for holding the circuit board 2, a joining head 512 for performing electrical connecting of the electronic component 1 to the circuit board 2 held by the board stage 509, a component feed unit 610 for, while holding a plurality of electronic components 1 arrayed in the Y-axis direction in the figure, conveying the electronic components 1 in the (−Y)-axis direction to feed the electronic components 1 to an inversion unit 520 and the joining head 512, and an ultraviolet irradiation unit 527 for applying ultraviolet rays to the plurality of electronic components 1 held by the component feed unit 610.

The plasma processing apparatus 524 includes a plasma processing chamber 525, by which a processing space for generating plasma is defined, where an opening 525a through which the circuit board 2 is carried in and out is provided on the (+Y)-axis side of the plasma processing chamber 525. The board conveyance unit 640 has an arm 641 which moves horizontally while holding the circuit board 2.

Figure 30:
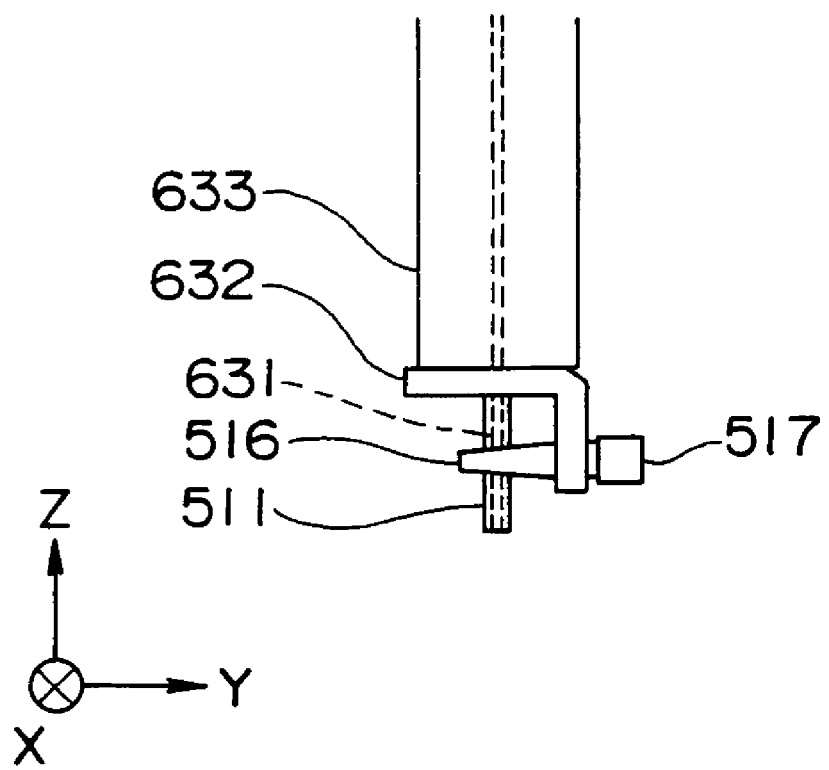
FIG. 30 is a schematic enlarged view of a suction nozzle in the joining apparatus of FIG. 29.

FIG. 30 is a view showing a suction nozzle 511 as it is partly enlarged. The suction nozzle 511, having at its central portion a suction path 631 for use of vacuum suction, performs vacuum suction from a suction port formed at its tip end to suck and hold the electronic components 1. The suction nozzle 511 is fitted with an ultrasonic vibrator 517 which is an oscillation unit for imparting ultrasonic vibrations to the suction nozzle 511 via a horn 516. The suction nozzle 511, the horn 516 and the ultrasonic vibrator 517 are fitted to a shaft 633 via a block 632, and the suction nozzle 511 can be moved up and down by the shaft 633 being moved in the Z direction by the up/down unit 515 (see FIG. 29).

The component feed unit 610 includes a tape member 605 (an example of the taped component feed member) which holds a plurality of electronic components 1 and which is fed with its longitudinal direction aligned with the Y-axis direction, a feed reel 604 and a recovery reel 608 for holding end portions of the tape member 605 on the (+Y)-axis and (−Y)-axis sides of the joining head 512 and the ultraviolet irradiation unit 527, respectively, and a tape conveyance unit 606 for feeding the tape member 605 from the feed reel 604 along the excimer ultraviolet lamp 528.

The tape member 605 holds a plurality of electronic components 1 on one face of the side confronting the joining head 512 and the ultraviolet irradiation unit 527 (i.e., on the (+Z)-axis side) below the joining head 512 and the ultraviolet irradiation unit 527 (on the (−Z)-axis side), where a (+Y)-axis side portion of the tape member 605 (i.e., a portion at which the electronic components 1 are held) is wrapped around the feed reel 604. Also, a (−Y)-axis side portion of the tape member 605 extending from the feed reel 604 in the (−Y)-axis direction, i.e., a used portion of the tape member 605 after the feed of the electronic components 1 to the joining head 512 and the inversion unit 520, is wrapped around the recovery reel 608.

The tape conveyance unit 606 includes a sprocket 607, and is iteratively rotated by a certain angle clockwise as viewed in FIG. 29 by a ratchet mechanism of the sprocket 607, by which the tape member 605 is fed out successively in the (−Y)-axis direction, so that the plurality of electronic components 1 held on the tape member 605 are conveyed as they are in proximity to the excimer ultraviolet lamp 528. Then, the (−Y)-axis side portion of the tape member 605 is wound up and recovered by the recovery reel 608.

In the joining apparatus 601 having the structure described above, a joining operation for the electronic components 1 is carried out by substantially the same procedure as in the joining operation by the joining apparatus 501 of the fifth embodiment shown in FIG. 21.

First of all, in the mounting of the electronic components 1 by the joining apparatus 601, first, the sprocket 607 of the tape conveyance unit 606 is rotated, by which a plurality of electronic components 1 are conveyed from the feed reel 604 by a certain distance in the (−Y)-axis direction. While ultraviolet rays having a wavelength of 172 nm are emitted from the excimer ultraviolet lamp 528, the electronic components 1 are conveyed below the excimer ultraviolet lamp 528 in proximity thereto by the component feed unit 610, so that ultraviolet irradiation (i.e., ultraviolet cleaning process) to the Au bumps 1b of the electronic components 1 is carried out in an air atmosphere (step S11).

In the joining apparatus 601, the electronic components 1, while subjected to ultraviolet irradiation, pass through below the excimer ultraviolet lamp 528 from the (+Y)-axis side to the (−Y)-axis side (actually, a targeted electronic component 1 passes through below the lamp 528 by iteration of operation of the tape conveyance unit 606 and joining operations for other electronic components 1). Thus, the ultraviolet cleaning process for the electronic components 1 is completed.

Upon completion of the ultraviolet cleaning process for an electronic component 1 on the tape member 605, this electronic component 1 is positioned below the inversion unit 520 (feed position). Subsequently, the feed collet 521 is moved down by the up/down unit 523, and the joining surface of the electronic component 1 is sucked and held by the feed collet 521, and thereafter the feed collet 521 is moved up, where the electronic component 1 is extracted from the tape member 605 (step S12). Thereafter, the feed collet 521 is inverted by the rotation unit 522, and the joining surface of the electronic component 1 is positioned on the lower face side in the figure (step S13). Also, the inverted electronic component 1 is delivered to the suction nozzle 511 (S14).

Along with this, the circuit board 2 held by the arm 641 of the board conveyance unit 640 is carried in from an unshown magazine to the inside of the plasma processing chamber 525 through the opening 525a (step S21). Subsequently, the arm 641 is withdrawn from the plasma processing chamber 525, the opening 525a is closed, by which a processing space having the circuit board 2 housed inside is formed.

In the plasma processing apparatus 524, while air inside the processing space is discharged so that internal pressure is reduced, processing gas is supplied so that the processing space is set to a specified reduced-pressure atmosphere. Subsequently, with a radio-frequency voltage applied to the processing gas within the processing space, plasma is generated, so that the circuit board 2 housed in the processing space is exposed to the plasma. Thus, the surfaces of the individual board electrodes 2a of the circuit board 2 are subjected to the plasma cleaning process (step S22).

Upon completion of the plasma cleaning process, the processing space inside the plasma processing chamber 525 is supplied with air so as to be turned back to the atmospheric pressure, the opening 525a being opened, and the circuit board 2 is carried out from the plasma processing chamber 525 by the arm 641 of the board conveyance unit 640. The circuit board 2, which has been subjected to the plasma cleaning process, is conveyed to the board stage 509 by the arm 641 and held by the board stage 509 (step S23).

Upon completion of the ultraviolet cleaning process for the Au bumps 1b of the electronic components 1 and the plasma cleaning process for the board electrodes 2a of the circuit board 2, the suction nozzle 511 is moved down from the joining head 512 located above the circuit board 2 held by the board stage 509, so that the Au bumps 1b formed on the joining surfaces of the electronic components 1 and the board electrodes 2a on the circuit board 2 are brought into contact with each other, and the electronic components 1 are pressed against the circuit board 2. Subsequently, ultrasonic vibrations are imparted to the electronic components 1 via the suction nozzle 511 by the ultrasonic vibrator 517, by which the two metallic portions of the electronic components 1 and the circuit board 2 are metal joined to each other in the air, where electrical connecting (i.e., mounting) is completed (step B16).

Thus, in the component feed unit 610, the electronic components 1 arrayed in a line, while being continuously fed by using the tape member 605, are subjected to the ultraviolet cleaning process during their conveyance process, so that more efficient joining operation can be achieved.

Also, in the joining apparatus 601, the continuous feed of the electronic components 1 is fulfilled by using the tape member 605. However, in a case where, for example, resin material or the like is used as the tape member 605, a radiation plate for effectively radiating heat that is imparted to the conveyance lower face of the tape member 605 may be provided in order to suppress any effects of heat due to ultraviolet irradiation. Besides, instead of such a case where the heat sink is provided, it is also possible that the tape member 605 itself is formed of a metal material excellent in heat sinkability.

Figure 31:
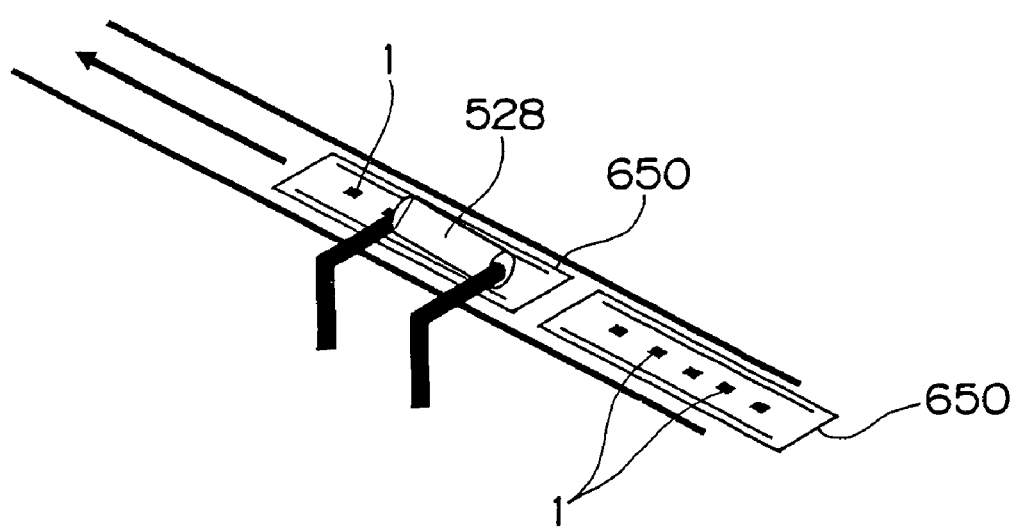
FIG. 31 is a schematic explanatory view showing a modification example of the electronic-component feeding state in the joining apparatuses of the fifth and sixth embodiments.

The joining apparatus 501 of the foregoing fifth embodiment has been described on a case where the individual electronic components 1 are fed by the component tray 503, and the joining apparatus 601 of present sixth embodiment has been described on a case where the electronic components 1 are fed by the tape member 605. However, the form of feed of the electronic components 1 is not limited to these cases. Instead of these cases, the case may be that, for example as shown in the schematic explanatory view of FIG. 31, that electronic components 1 such as LEDs are fed by a lead frame 650 successively, where ultraviolet rays are applied from the excimer ultraviolet lamp 528 during the conveyance process for the feeding, by which the ultraviolet cleaning process is performed. It is noted that the lead frame 650 has individual electronic components 1 separably fitted thereto via, for example, adhesive sheet or the like, and is conveyed by an unshown lead frame conveyance unit.

Seventh Embodiment

Figure 32:
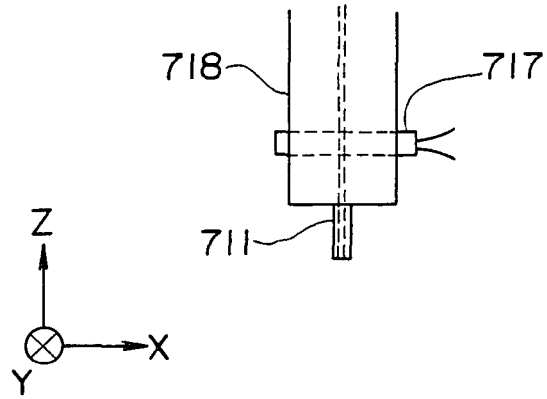
FIG. 32 is a schematic enlarged view of a suction nozzle included in a joining apparatus according to a seventh embodiment of the present invention.

FIG. 32 is a schematic view showing a vicinity of a suction nozzle 711 of a joining apparatus according to a seventh embodiment of the invention, as it is enlarged. In the joining apparatus of the seventh embodiment, a heater 717 for heating the suction nozzle 711 is provided on a shaft 718 instead of the ultrasonic vibrator 517, the horn 516 and the block 632 shown in FIG. 30. The other constituent members are the same as in FIG. 29, and designated by the same reference numerals in the following description. Also, a joining operation for the electronic components 1 by the joining apparatus of the seventh embodiment is almost similar to that of the joining apparatus 601 of the sixth embodiment.

In the joining apparatus of the seventh embodiment, an ultraviolet cleaning process for the metallic portions is carried out with ultraviolet rays applied from the excimer ultraviolet lamp 528 in an air atmosphere to electronic components 1 which are conveyed in the (−Y)-axis direction while being held on the tape member 605 and close to the excimer ultraviolet lamp 528, as in the joining apparatus 601 of the sixth embodiment. The electronic component 1 subjected to the ultraviolet cleaning process is sucked and held by the feed collet 521, then made to face the suction nozzle 711 by inversion of the feed collet 521, and sucked and held by the suction nozzle 711. The suction nozzle 711 is moved to above the board stage 509 by the head moving unit 513, and the electronic component 1 held by the suction nozzle 711 has previously been, and is continuously heated, by the heater 717 during the move.

Along with this, the circuit board 2 is carried into the plasma processing chamber 525, carried out after execution of the plasma cleaning process, and held by the board stage 509.

Upon completion of the ultraviolet cleaning process for the metallic portions of the electronic component 1 and the plasma cleaning process for the metallic portions of the circuit board 2, the suction nozzle 711 is moved down toward the circuit board 2, and the electronic component 1 is pressed against the circuit board 2 while the Au bumps 1*b* of the electronic component 1, to which heat has previously been imparted by the heater 717, are kept in contact with the board electrodes 2*a* on the circuit board 2. As a result of this, the two metallic portions of the electronic component 1 and the circuit board 2 are metal joined in the air, where the mounting of the electronic component 1 to the circuit board 2 is completed. In addition, in the mounting of the electronic components 1, heat may also be imparted to the circuit board 2 held on the board stage 509.

As described above, in the joining apparatus of the seventh embodiment, after execution of the ultraviolet cleaning process for metallic portions of the electronic components 1, the metallic portions of the electronic component 1, to which heat has been imparted by the heater 717, and the metallic portions of the circuit board 2 are metal joined to each other, by which the mounting of the electronic component 1 is achieved. Therefore, the electronic components 1, even if low in withstand voltage and unsuitable for irradiation of high energy such as plasma cleaning process, can be mounted by metal joining strongly onto the circuit board 2. Also, since the ultraviolet cleaning process for the electronic components 1 is performed in the air atmosphere, the joining apparatus can be simplified in structure.

Eighth Embodiment

Figure 33:
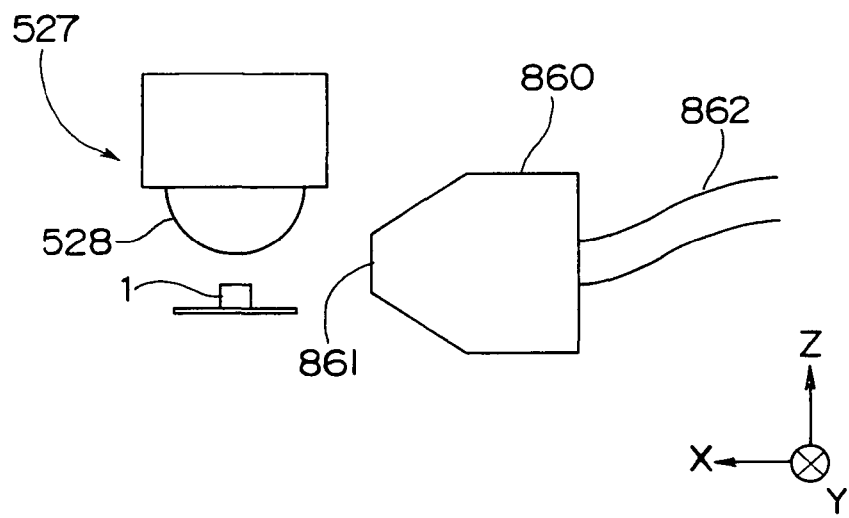
FIG. 33 is a schematic enlarged view of a vicinity of an ultraviolet irradiation unit included in a joining apparatus according to an eighth embodiment of the present invention.

FIG. 33 is an enlarged view of a vicinity of an ultraviolet irradiation unit 527 included in a joining apparatus according to an eighth embodiment of the present invention, as viewed from the (−Y)-axis side toward the (+Y)-axis direction. As shown in FIG. 33, in the joining apparatus of the eighth embodiment, a gas supply unit 860 for supplying nitrogen ($N_2$) gas to the electronic component located below the excimer ultraviolet lamp 528 is provided on the (−X)-axis side of the excimer ultraviolet lamp 528. The other constituent members are the same as in FIG. 29, and designated by the same reference numerals in the following description.

The gas supply unit 860 is connected to an unshown gas supply source via a gas supply pipe 862, and a supply port 861 elongated in the Y-axis direction is formed on the (+X)-axis side of the gas supply unit 860. The length of the supply port 861 in the Y-axis direction is nearly equal to the length of the excimer ultraviolet lamp 528. The gas supply unit 860 is so positioned that the nearly entire supply port 861 confronts excimer ultraviolet lamp 528 and a plurality of electronic components 1 located below the excimer ultraviolet lamp 528.

The mounting operation of the electronic components 1 by the joining apparatus of the eighth embodiment is almost similar to that of the joining apparatus 601 of the sixth embodiment, differing therefrom only in that during the ultraviolet irradiation to the electronic component 1 by the excimer ultraviolet lamp 528, nitrogen gas is supplied to a vicinity of the electronic component 1 from the supply port 861 of the gas supply unit 860 so that the oxygen concentration in the vicinity of the electronic component 1 is lowered.

In the joining apparatus of the eighth embodiment, ultraviolet irradiation to the Au bumps 1*b* of the electronic component 1, i.e. ultraviolet cleaning process, by the excimer ultraviolet lamp 528 is carried out in a state that the vicinity of the electronic component 1 located below the excimer ultraviolet lamp 528 is set to a low oxygen atmosphere having an oxygen concentration of 10% or lower (preferably 1% or lower, more preferably 100 ppm or lower) by nitrogen gas supplied from the gas supply unit 860. Therefore, in vicinities of the electronic component 1, generation of ozone is suppressed so that oxygen radicals are efficiently generated, and thus the quality of cleaning process for the metallic portions of the electronic component 1 by ultraviolet irradiation can be improved with a simple structure. As a result, electronic components which are low in withstand voltage and unsuitable for irradiation of high energy such as plasma cleaning process can be mounted onto the circuit board 2 by metal joining with strength and high quality.

In addition, the gas to be supplied by the gas supply unit 860 is not limited to nitrogen gas, and inert gas such as argon may be used. Further, the Au bumps 1*b* of the electronic components 1 may be heated by a heater for acceleration of the metal joining, as in the case of the seventh embodiment.

Ninth Embodiment

Figure 34:
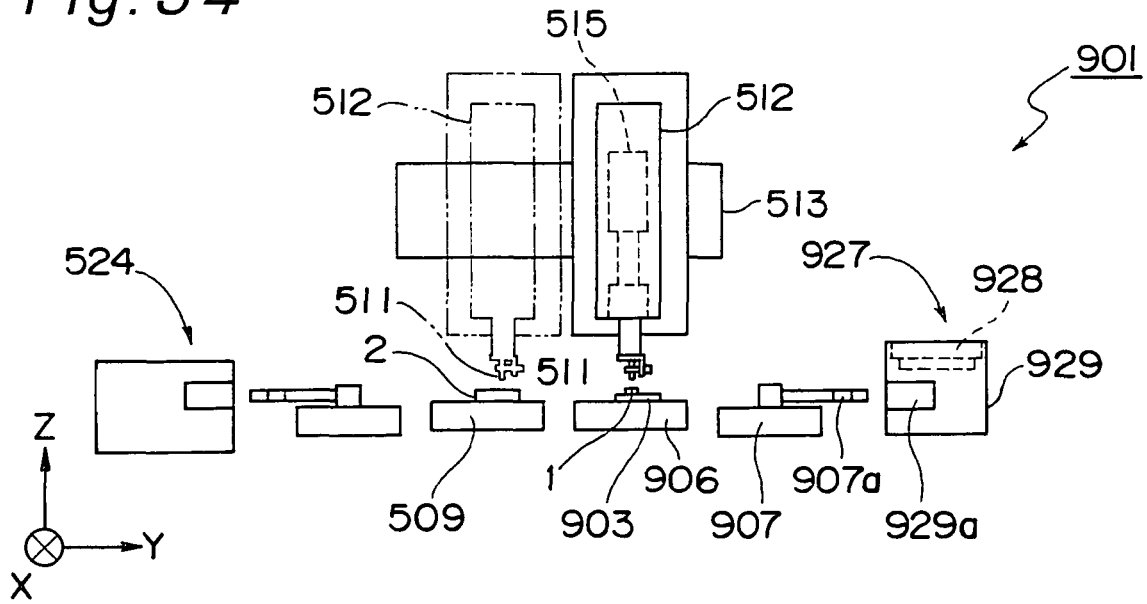
FIG. 34 is a schematic structural view showing the structure of a joining apparatus according to a ninth embodiment of the present invention.

FIG. 34 is a schematic structural view showing the structure of a joining apparatus 901 according to a ninth embodiment of the present invention. As shown in FIG. 34, in the joining apparatus 901, a chamber 929 for housing therein an excimer ultraviolet lamp 928 is included in an ultraviolet irradiation unit 927, and an opening 929*a* for carrying in and out a pallet (component tray) 903 having an electronic component 1 held thereon is provided on the (−Y)-axis side of the chamber 929. Also, a pallet conveyance unit 907 for performing carriage of the pallet 903 into and out of the chamber 929, and a pallet holding section 906 for holding the pallet 903 is provided below the joining head 512 located at a feed position. Also, the pallet conveyance unit 907 has an arm 907*a* which moves horizontally while holding the pallet 903. The other constituent members are the same as in FIG. 29, and designated by the same reference numerals in the following description.

FIG. 35 is a flowchart showing part of procedures of joining operation for the electronic component 1 by the joining apparatus 901. In the joining apparatus 901, operations shown in steps S31-S35 of FIG. 35 are performed instead of the operations shown in steps S11-S15 of FIG. 21. In the joining apparatus 901, first, the pallet 903 holding the electronic component 1 with its joining surface directed toward the (+Z) side is held by the arm 907*a* of the pallet conveyance unit 907, and carried through the opening 929*a* into the chamber 929 (step S31). Subsequently, the arm 907*a* is withdrawn from within the chamber 929, and the opening 929*a* is closed, thus forming a processing space for housing therein the pallet 903 with the electronic component 1 placed thereon. Next, air inside the processing space of the chamber 929 is discharged, and ultraviolet rays are applied from the excimer ultraviolet lamp 928 to the electronic component 1 (as well as its Au bumps 1*b*) under a reduced-pressure environment, by which ultraviolet cleaning process is performed (step S32).

Upon completion of the ultraviolet cleaning process, air is supplied to the processing space of the chamber 929 to recover the atmospheric pressure, and then the opening 929*a* is opened, so that the pallet 903 having the electronic component 1 placed thereon is carried out from the chamber 929 by the arm 907*a* of the pallet conveyance unit 907. The pallet 903 is conveyed to the pallet holding section 906 by the arm 907*a*, and the pallet 903 on which the electronic component 1 subjected to the ultraviolet cleaning process is placed thereon is held by the pallet holding section 906 (step S33).

Subsequently, the electronic component 1 on the pallet 903 is sucked and held by the unshown inversion unit, and then inverted, and the electronic component 1 is delivered to and sucked and held by the suction nozzle 511 of the joining head 512 (step S34). The suction nozzle 511, after making correction on the sucking-and-holding posture of the electronic component 1, is moved to above the board stage 509 by the head moving unit 513 (step S35).

In the joining apparatus 901, as in the joining apparatus 501 of the fifth embodiment, plasma cleaning process for the board electrodes 2a of the circuit board 2 is performed by the plasma processing apparatus 524, and thereafter the circuit board 2 is held on the board stage 509. Further thereafter, the suction nozzle 511 is moved down toward the circuit board 2, where ultrasonic vibrations are imparted to the Au bumps 1b of the electronic component 1 in the state that the Au bumps 1b of the electronic component 1 and the board electrodes 2a of the circuit board 2 are kept in contact with each other. Thus, the two metallic portions of the electronic component 1 and the circuit board 2 are metal joined to each other in the air, by which the mounting of the electronic component 1 onto the circuit board 2 is completed.

As described above, in the joining apparatus 901, since the ultraviolet cleaning process for the metallic portions of the electronic component 1 is performed under a reduced-pressure environment inside the chamber 929, generation of ozone in vicinities of the electronic component 1 can be prevented, and moreover attenuation of the ultraviolet rays derived from the excimer ultraviolet lamp 928 due to their absorbance into the air (about 90% being absorbed during an 8 mm propagation in the air) can be prevented. As a result of this, the quality of the cleaning process for the metallic portions of the electronic component 1 by the ultraviolet irradiation can be further improved.

Also, as in the joining apparatus 501 of the fifth embodiment, electronic components, even if low in withstand voltage and unsuitable for irradiation of high energy such as plasma cleaning process, can be mounted by metal joining strongly onto the circuit board 2. Moreover, the ultraviolet cleaning process for the metallic portions of the electronic components 1 can be achieved more efficiently by irradiation of ultraviolet rays by the excimer ultraviolet lamp 928, and the plasma cleaning process for the board electrodes 2a of the circuit board 2 can be achieved efficiently by the plasma processing apparatus 524. In addition, heating by a heater may be used instead of ultrasonic vibrations as in the seventh embodiment.

Although embodiments of the present invention have been described hereinabove, yet the present invention is not limited to the above shown embodiments, and various changes and modifications may be made.

For instance, the excimer ultraviolet lamp 528 is formed, preferably, into a rod-like shape elongated in the direction of conveyance of the electronic component 1 from the viewpoint that the electronic component 1, while being conveyed, is efficiently irradiated with ultraviolet ray.

However, other various shapes are allowable depending on device structure such as the structure of the feed unit for the electronic components 1.

Further, the ultraviolet cleaning process for the metallic portions of the electronic components 1 is performed, preferably, by the excimer ultraviolet lamp 528 that emits ultraviolet rays of short wavelengths from the viewpoint of efficiency improvement of processing. However, the process may also be performed by other ultraviolet lamps or ultraviolet irradiation devices. In addition, the ultraviolet cleaning process for the electronic components 1 is performed preferably in an air atmosphere from the viewpoint of device simplification when the level of the demand for the processing quality is relatively low. When high-quality ultraviolet cleaning process is demanded, the ultraviolet cleaning process is performed preferably in a low oxygen atmosphere or reduced-pressure environment.

For the plasma processing apparatus 524, the processing gas to be used for the plasma cleaning process for the board electrodes 2a of the circuit board 2 may be other gases such as nitrogen, oxygen ($O_2$), hydrogen ($H_2$), helium (He) or krypton (Kr). Also, the cleaning process for the board electrodes 2a of the circuit board 2 do not necessary need to be done by plasma exposure, but may be done by exposure to other energy waves such as a fast atomic beam of argon or the like or ultraviolet ray.

Furthermore, the joining apparatuses according to the individual embodiments may be used for metal joining between various objects in addition to the mounting electronic components onto circuit boards. For example, the joining apparatus may be used as an apparatus for forming an electronic component package in which electronic components are internally housed and sealed by metal joining between a metallic portion provided around an opening of a cavity board, which has an electronic component mounted on the bottom surface of a cavity (recessed portion), and a metallic portion of a lid member which closes the opening of the cavity. In this case, by performing the ultraviolet cleaning process on the metallic portion of the cavity board, the electronic component package, even if low in withstand voltage and unsuitable for irradiation of high energy such as plasma cleaning process, can be formed by strongly joining the cavity board and the lid member to each other by metal joining. It is noted that the impartment of ultrasonic vibrations or heat in the joining between the cavity board and the lid member may be performed to either the cavity board or the lid member.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-159133 filed on May 28, 2004 including specification, drawing and claims, and the disclosure of Japanese Patent Application No. 2004-159134 filed on May 28, 2004 including specification, drawing and claims are incorporated herein by reference in their entirety.

What is claimed is:

1. A joining apparatus comprising:
    means for joining a first metallic portion of a first object with a second metallic portion of a second object; and
    means for directly irradiating the first metallic portion of the first object with ultraviolet rays in a position in which the first metallic portion and the second metallic portion are spaced apart from each other so as to remove joining inhibitors from a surface of the first metallic portion,
    wherein the means for joining the first metallic portion with the second metallic portion comprises means for imparting ultrasonic vibrations or heat to the first metallic portion from which the joining inhibitors have been removed, or to the second metallic portion, while keeping the first metallic portion and the second metallic portion in contact with each other.

* * * * *